United States Patent
Kang et al.

(10) Patent No.: US 12,412,844 B2
(45) Date of Patent: Sep. 9, 2025

(54) DISPLAY DEVICE AND TILED DISPLAY DEVICE INCLUDING THE SAME

(71) Applicant: SAMSUNG DISPLAY CO., LTD., Yongin-si (KR)

(72) Inventors: Seung Jae Kang, Asan-si (KR); Sung Jun Kim, Hwaseong-si (KR); Ha Sook Kim, Hwaseong-si (KR); Dong Jin Park, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 882 days.

(21) Appl. No.: 17/472,765

(22) Filed: Sep. 13, 2021

(65) Prior Publication Data

US 2022/0208949 A1    Jun. 30, 2022

(30) Foreign Application Priority Data

Dec. 29, 2020    (KR) .................. 10-2020-0185797

(51) Int. Cl.

| | |
|---|---|
| *H01L 23/544* | (2006.01) |
| *G09F 9/302* | (2006.01) |
| *H10K 50/86* | (2023.01) |
| *H10K 59/121* | (2023.01) |
| *H10K 59/18* | (2023.01) |

(Continued)

(52) U.S. Cl.
CPC ......... *H01L 23/544* (2013.01); *H10K 50/865* (2023.02); *H10K 59/121* (2023.02); *H10K 59/18* (2023.02); *G09F 9/3026* (2013.01); *H01L 2223/54426* (2013.01); *H10K 59/12* (2023.02); *H10K 59/8792* (2023.02)

(58) Field of Classification Search
CPC ............ H01L 23/544; H01L 2223/544; H01L 2223/5442; H01L 2223/54426; H01L 2223/54473–54486; H10K 59/18; H10K 59/95; G09F 9/3026; G02F 1/13336; G02F 1/133354
See application file for complete search history.

(56) References Cited

U.S. PATENT DOCUMENTS

| | | | |
|---|---|---|---|
| 4,981,529 A | * | 1/1991 | Tsujita .................. H01L 23/544 257/E23.179 |
| 8,953,025 B2 | | 2/2015 | Choi et al. |
| 9,978,687 B1 | * | 5/2018 | Xuan .................... H01L 23/544 |

(Continued)

FOREIGN PATENT DOCUMENTS

| | | |
|---|---|---|
| JP | 3839872 | 11/2006 |
| JP | 3839872 B2 * | 11/2006 |

(Continued)

*Primary Examiner* — Steven B Gauthier
*Assistant Examiner* — E. Rhett Cheek
(74) *Attorney, Agent, or Firm* — F. CHAU & ASSOCIATES, LLC

(57) ABSTRACT

A display device and a tiled display device are provided. The display device includes a substrate having a first side, which extends in a first direction, and a second side, which extends in a second direction that intersects the first direction, a first alignment vernier mark disposed on the substrate, the first alignment vernier mark adjoining the first side and extending in the second direction, and a second alignment vernier mark disposed on the substrate, the second alignment vernier mark adjoining the second side and extending in the first direction.

17 Claims, 40 Drawing Sheets

(51) Int. Cl.
    *H10K 59/80*     (2023.01)
    *H10K 59/12*     (2023.01)

(56) References Cited

U.S. PATENT DOCUMENTS

| | | | | |
|---|---|---|---|---|
| 2003/0201440 | A1* | 10/2003 | Satou | H10D 30/6723 257/E21.414 |
| 2004/0235279 | A1* | 11/2004 | Kim | H01L 27/1296 257/E23.179 |
| 2006/0290874 | A1* | 12/2006 | Yoon | G02F 1/1333 349/158 |
| 2007/0059991 | A1* | 3/2007 | Chikazawa | H05K 1/0266 439/751 |
| 2007/0210460 | A1* | 9/2007 | Thallner | B82Y 10/00 257/E23.179 |
| 2012/0162211 | A1* | 6/2012 | Choi | G02B 30/25 345/419 |
| 2012/0287026 | A1* | 11/2012 | Masuda | H10K 50/8426 156/275.7 |
| 2017/0263564 | A1* | 9/2017 | Kim | H10K 71/191 |
| 2018/0219123 | A1* | 8/2018 | Wang | H01L 27/15 |
| 2019/0131359 | A1* | 5/2019 | Kong | H01L 27/1259 |
| 2019/0165307 | A1* | 5/2019 | Zhao | H10K 59/8721 |
| 2020/0035762 | A1* | 1/2020 | Kim | H10K 59/124 |
| 2020/0083315 | A1* | 3/2020 | Yueh | H10K 50/87 |
| 2021/0184165 | A1* | 6/2021 | Pan | H10K 50/844 |
| 2021/0202685 | A1* | 7/2021 | Ban | H10K 50/844 |
| 2022/0093692 | A1* | 3/2022 | Li | H10K 59/8792 |
| 2022/0093724 | A1* | 3/2022 | Bower | H10K 59/18 |

FOREIGN PATENT DOCUMENTS

| | | | | |
|---|---|---|---|---|
| KR | 10-1094772 | | 12/2011 | |
| KR | 10-1183374 | | 9/2012 | |
| KR | 10-1895522 | | 10/2018 | |
| KR | 10-2020-0024930 | | 3/2020 | |
| WO | WO-2019099985 A1 | * | 5/2019 | G02F 1/1333 |

* cited by examiner

DISPLAY DEVICE AND TILED DISPLAY DEVICE INCLUDING THE SAME

CROSS-REFERENCE TO RELATED APPLICATION

This application claims priority to Korean Patent Application No. 10-2020-0185797, filed on Dec. 29, 2020, and all the benefits accruing therefrom under 35 U.S.C. § 119, the disclosure of which is herein incorporated by reference in its entirety.

BACKGROUND

1. Field

The present disclosure relates to a display device and a tiled display device including the same.

2. Description of the Related Art

As the information society has developed, the demand for display devices for displaying images has been diversified. For example, display devices have been applied to various electronic devices such as smart phones, digital cameras, notebook computers, navigation systems, and smart televisions. Examples of display devices include flat panel display devices such as a liquid crystal display (LCD) device, a field emission display (FED) device, or an organic light-emitting diode (OLED) display device. A light-emitting display device, which is a type of flat panel display device, includes light-emitting elements capable of emitting light to display an image without using a backlight unit for providing light to a display panel.

When a large-size display device is fabricated, the defect rate of light-emitting elements may increase due to an increase in the number of pixels, and the productivity or reliability of the display device may decrease. To address these problems, a tiled display device with a large screen may be implemented by connecting multiple display devices having a relatively small size. The tiled display device may include seams (or boundary portions) between the multiple display devices due to the presence of the non-display areas or bezels of the multiple display devices. However, when an image is being displayed on the entire screen of the tiled display device, the seams cause a sense of discontinuity, adversely affecting the sense of immersion of the image.

SUMMARY

Embodiments of the present disclosure provide a display device including a plurality of vernier marks and thereby having an improved alignment efficiency and a tiled display device including the display device.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, a display device includes: a substrate having a first side, which extends in a first direction, and a second side, which extends in a second direction that intersects the first direction; a first alignment vernier mark disposed on the substrate, the first alignment vernier mark adjoining the first side and extending in the second direction; and a second alignment vernier mark disposed on the substrate, the second alignment vernier mark adjoining the second side and extending in the first direction.

According to an embodiment of the present disclosure, a tiled display device includes: a first display device including a first substrate, which has a first side extending in a first direction and a second side extending in a second direction that intersects the first direction, a first alignment vernier mark, which is disposed on the first substrate, adjoins the first side, and extends in the second direction, and a second alignment vernier mark, which is disposed on the first substrate, adjoins the second side, and extends in the first direction; a second display device spaced apart from the first display device in the second direction and including a second substrate, which has a third side facing the first side of the first display device and extending in the second direction, and a third alignment vernier mark, which is disposed on the second substrate, adjoins the third side, and extends in the second direction; and a third display device spaced apart from the first display device in the first direction and including a third substrate, which has a fourth side facing the second side of the first display device and extending in the second direction, and a fourth alignment vernier mark, which is disposed on the third substrate, adjoins the fourth side, and extends in the first direction.

According to the aforementioned and other embodiments of the present disclosure, as each of a plurality of display devices includes a plurality of vernier marks that adjoin at least one side of a corresponding display device, the alignment of the plurality of display devices, which are disposed adjacent to one another, during the assembly of a tiled display device may be simplified, and the manufacturing efficiency of the tiled display device may be improved.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

Embodiments of the present disclosure will hereinafter be described with reference to the accompanying drawings.

DETAILED DESCRIPTION

The present invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it may be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, embodiments of the present disclosure will be described with reference to the accompanying drawings.

Figure 1:
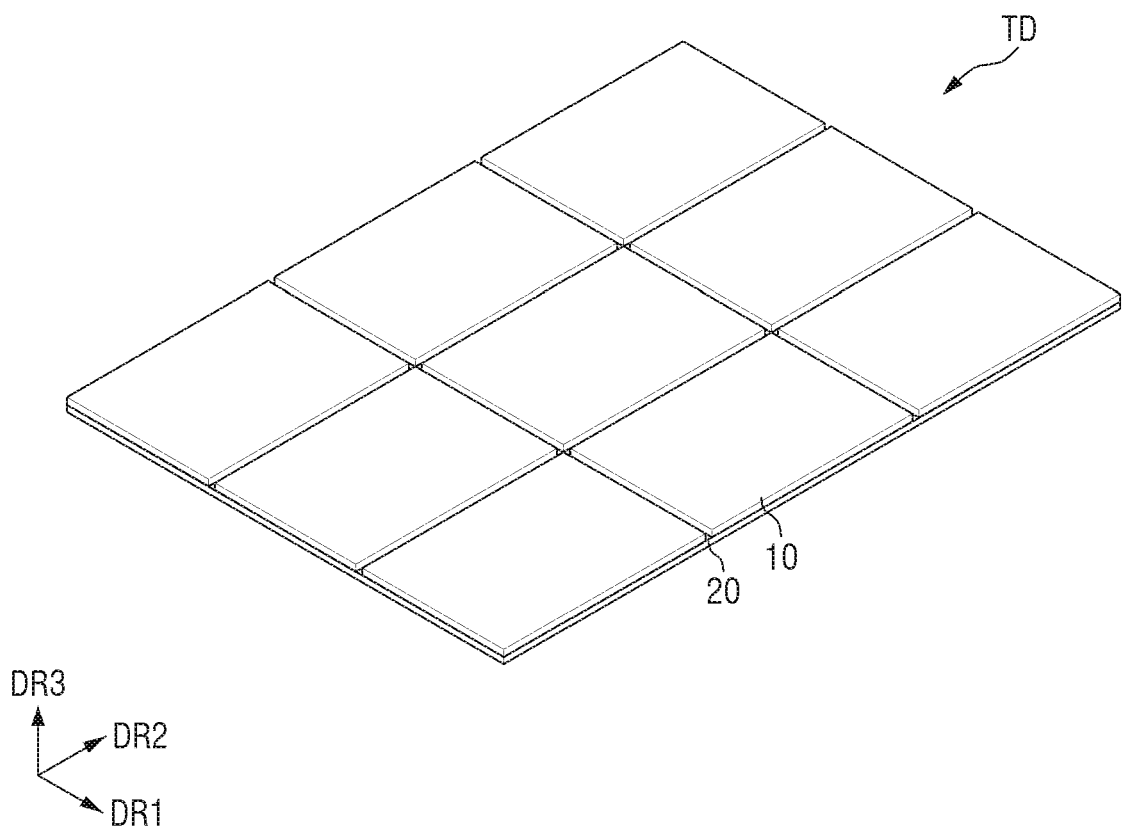
FIG. 1 is a perspective view of a tiled display device according to an embodiment of the present disclosure.
Figure 2:
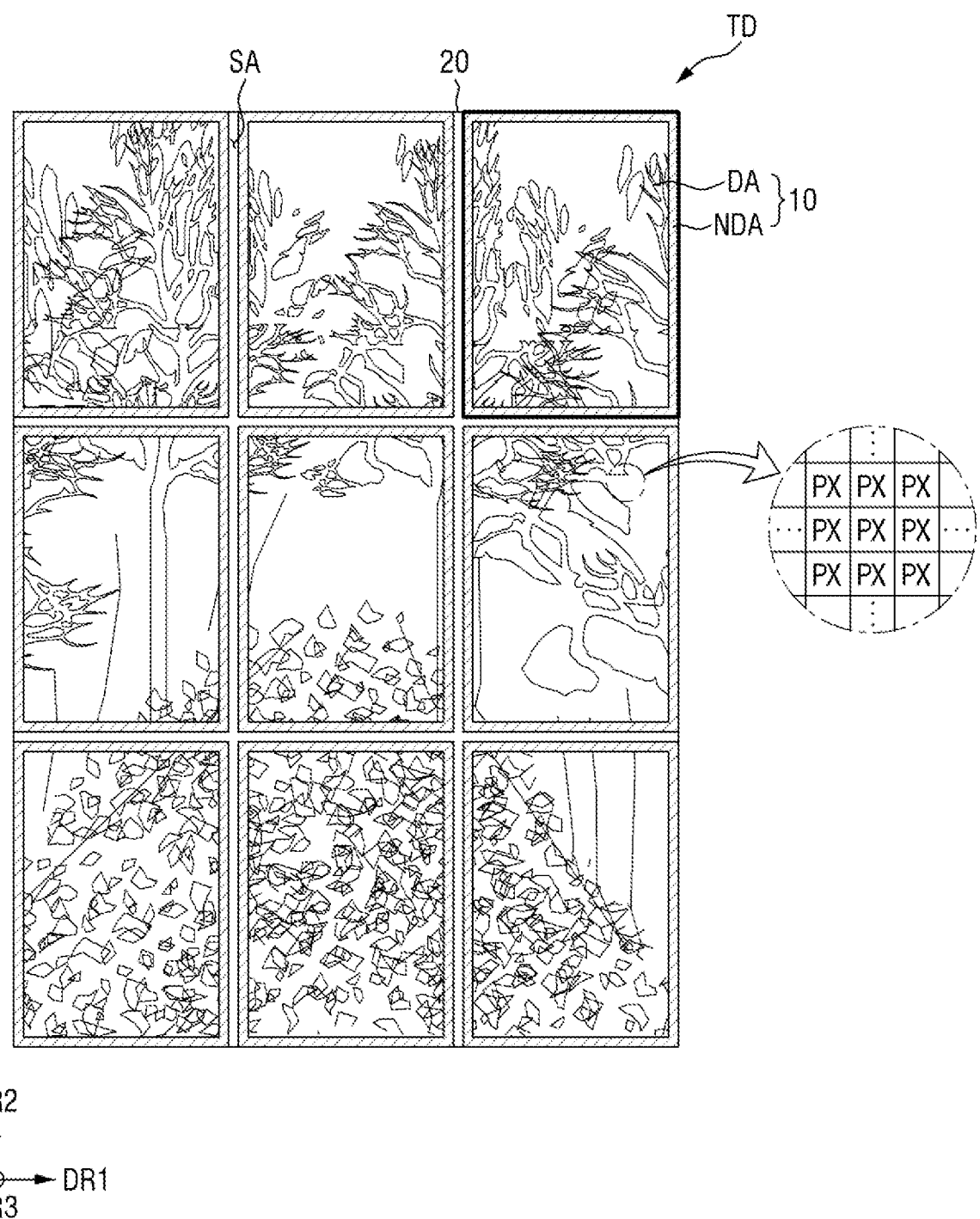
FIG. 2 is a plan view of the tiled display device of FIG. 1.
Figure 3:
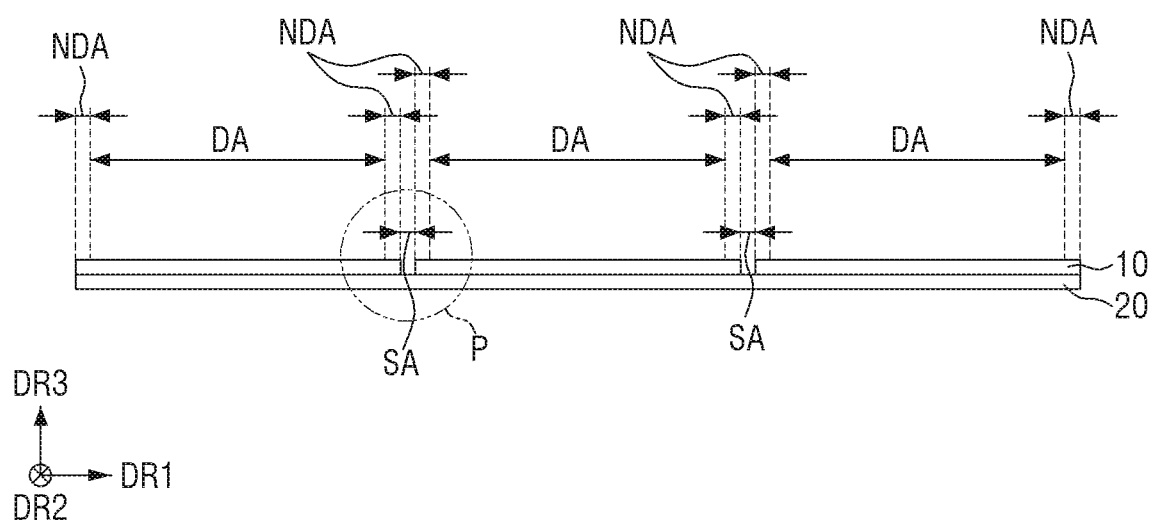
FIG. 3 is a cross-sectional view of the tiled display device of FIG. 1.

FIG. 1 is a perspective view of a tiled display device according to an embodiment of the present disclosure. FIG. 2 is a plan view of the tiled display device of FIG. 1. FIG. 3 is a cross-sectional view of the tiled display device of FIG. 1.

Referring to FIGS. 1 and 2, a tiled display device TD displays as moving image or a still image. The tiled display device TD may refer to electronic devices that provide a display screen. In one example, the tiled display device TD may encompass a television (TV), a notebook computer, a monitor, a billboard, an Internet of Things (IoT) device, a mobile phone, a smartphone, a tablet personal computer (PC), an electronic watch, a smart watch, a watch phone, a head-mounted display, a mobile communication terminal, an electronic notepad, an electronic book, a portable multimedia player (PMP), a navigation device, a game console, a digital camera, and a camcorder that provide a display screen.

In each of the drawings that illustrate the tiled display device TD, first, second, and third directions DR1, DR2, and DR3 may be defined. The first and second directions DR1 and DR2 may be directions that are perpendicular to each other on the same plane. The third direction DR3 may be a direction that is perpendicular to both the first and second directions DR1 and DR2. The third direction DR3 may refer to a thickness direction (or display direction) of the tiled display device TD.

The tiled display device TD may include a plurality of display devices 10 and a lower plate 20.

The tiled display device TD may have a rectangular shape including short sides in the first direction DR1 and long sides in the second direction DR2 in a plan view. The tiled display device TD may have a flat shape, but the present disclosure is not limited thereto. The tiled display device TD may have a stereoscopic shape and may thus provide a sense of depth to a user. In one example, in a case where the tiled display device TD has a stereoscopic shape, at least some of the display devices 10 may have a curved shape. In an example, the display devices 10 may all have a flat shape and may be connected to one another to have a predetermined angle so that the tiled display device TD may have a stereoscopic shape. As the tiled display device TD includes multiple display devices 10, the display area of the tiled display device TD may be widened.

The lower plate 20 may provide an area in which the display devices 10 are disposed and may support the display devices 10. The planar shape of the lower plate 20 may conform to the planar shape of the tiled display device TD. In an embodiment where the tiled display device TD has a rectangular shape including short sides in the first direction DR1 and long sides in the second direction DR2 in a plan view, the lower plate 20 may also have a rectangular shape including short sides in the first direction DR1 and long sides in the second direction DR2 in a plan view. Although not specifically illustrated, various wires and cables may be disposed on the lower plate 20 to electrically connect the display devices 10 to each other, and coupling means for fixing the display devices 10 and moving means for moving each of the display devices 10 in the first direction DR1 and/or in the second direction DR2 to align the display devices 10 on the lower plate 20 may be further disposed on the lower plate 20.

The display devices 10 may be disposed on the lower plate 20. The display devices 10 may be fixed on a surface of the lower plate 20 by the coupling means.

The display devices 10 may be arranged in a matrix on the lower plate 20. The display devices 10 may be spaced apart from one another at a predetermined distance in the first and second directions DR1 and DR2 in a plan view. As the display devices 10 are disposed on the lower plate and are spaced apart from one another at a predetermined distance in the first and second directions DR1 and DR2, the display devices 10 may be prevented from being damaged by their respective neighboring display devices 10 even when the display devices 10 expand due to heat generated by the display devices 10. The display devices 10 are illustrated as being arranged in a 3×3 matrix, but the number and the layout of display devices 10 are not particularly limited.

The directions in which the display devices 10 are arranged are illustrated as coinciding with the first and second directions DR1 and DR2, which are, respectively, the direction in which the long sides of the tiled display device TD extend and the direction in which the short sides of the tiled display device TD extend, but the present disclosure is not limited thereto. Alternatively, the directions in which the display devices 10 are arranged may be inclined with respect to the directions in which the long sides and the short sides of the tiled display device TD extend.

If the display devices 10 are not in alignment with one another in the first direction DR1 and/or the second direction DR2 when aligning and fixing the display devices 10 on the lower plate 20, seams (or gaps) between the display devices 10 where images are not displayed may become visible to a user. In this case, the sense of immersion of an image displayed by the tiled display device TD may deteriorate. Thus, the display devices 10 need to be aligned with uniform, but minimal gaps therebetween. For example, the display devices 10 may be desirable to be aligned and fixed on the lower plate 20 with precision, thereby minimizing the boundary portions (or the gaps) between the display devices 10. The layout of, and the distance between, the display devices 10 will be described later.

Each of the display devices 10 may have a rectangular shape including short sides in the first direction DR1 and long sides in the second direction DR2 in a plan view, but the present disclosure is not limited thereto. Alternatively, each of the display devices 10 may have a rectangular shape including long sides in the first direction DR1 and short sides in the second direction DR2 in a plan view. The display devices 10 may have the same planar shape and the same size as each other, but the present disclosure is not limited thereto. Alternatively, at least one of the display devices 10 may have different planar shapes and different sizes from the others.

The display devices 10 may be disposed adjacent to, but spaced apart from, one another so that the long sides or the short sides of each pair of adjacent display devices 10 may face each other. Some of the display devices 10 included in the tiled display device TD may be disposed along the edges of the tiled display device TD, adjacent to the sides of the tiled display device TD. Some of the display devices 10 may be disposed adjacent to the corners of the tiled display device TD. Some of the display devices 10 may be disposed on the inside of the tiled display device TD and may be surrounded by other display devices 10.

Each of the display devices 10 may include a display panel that provides a display screen. Examples of the display panel may include an inorganic light-emitting diode display panel, an organic light-emitting diode display panel, a quantum-dot light-emitting display panel, a plasma display panel, and a field emission display panel. The display panel will hereinafter be described as being, for example, an inorganic light-emitting diode display panel, but the present disclosure is not limited thereto. Various other types of display panels may also be applicable to the display devices 10.

Referring to FIGS. 2 and 3, each of the display devices 10 may include a display area DA and a non-display area NDA. The display area DA may be a region in which an image is displayed, and the non-display area NDA may be a region in which no image is displayed.

The shape of the display area DA may conform to the shape of the display devices 10. In one example, the planar shape of the display area DA may be similar to the general planar shape of the display devices 10, i.e., a rectangular shape. The display area DA may account for the middle part of each of the display devices 10.

The display area DA may include a plurality of pixels PX. The pixels PX may be arranged in row and column directions. The pixels PX may have a rectangular or square shape in a plan view. In one example, each of the pixels PX may include a plurality of light-emitting elements that are formed of inorganic particles, but the present disclosure is not limited thereto.

The non-display area NDA may be disposed around the display area DA. The non-display area NDA may surround the entire display area DA or part of the display area DA.

The tiled display device TD may further include a boundary area SA between the display devices 10.

The boundary area SA may include gaps between the display devices 10. The boundary area SA may be referred to as a seam area. The boundary area SA may be surrounded by the non-display areas NDA of the display devices 10. The boundary area SA may be a region between the non-display areas NDA of the display devices 10 and may be narrow such that the boundary area SA is not or is barely recognizable to the user. The reflectance of the display areas DA of the display devices 10 for external light may be substantially the same the reflectance of the non-display areas NDA of the display devices 10 for external light. Thus, as the non-display areas NDA of the display devices 10 or the boundary portions between the display devices 10 may be prevented from becoming recognizable, the sense of discontinuity between the display devices 10 may be eliminated, and the sense of an image may be improved.

Figure 4:
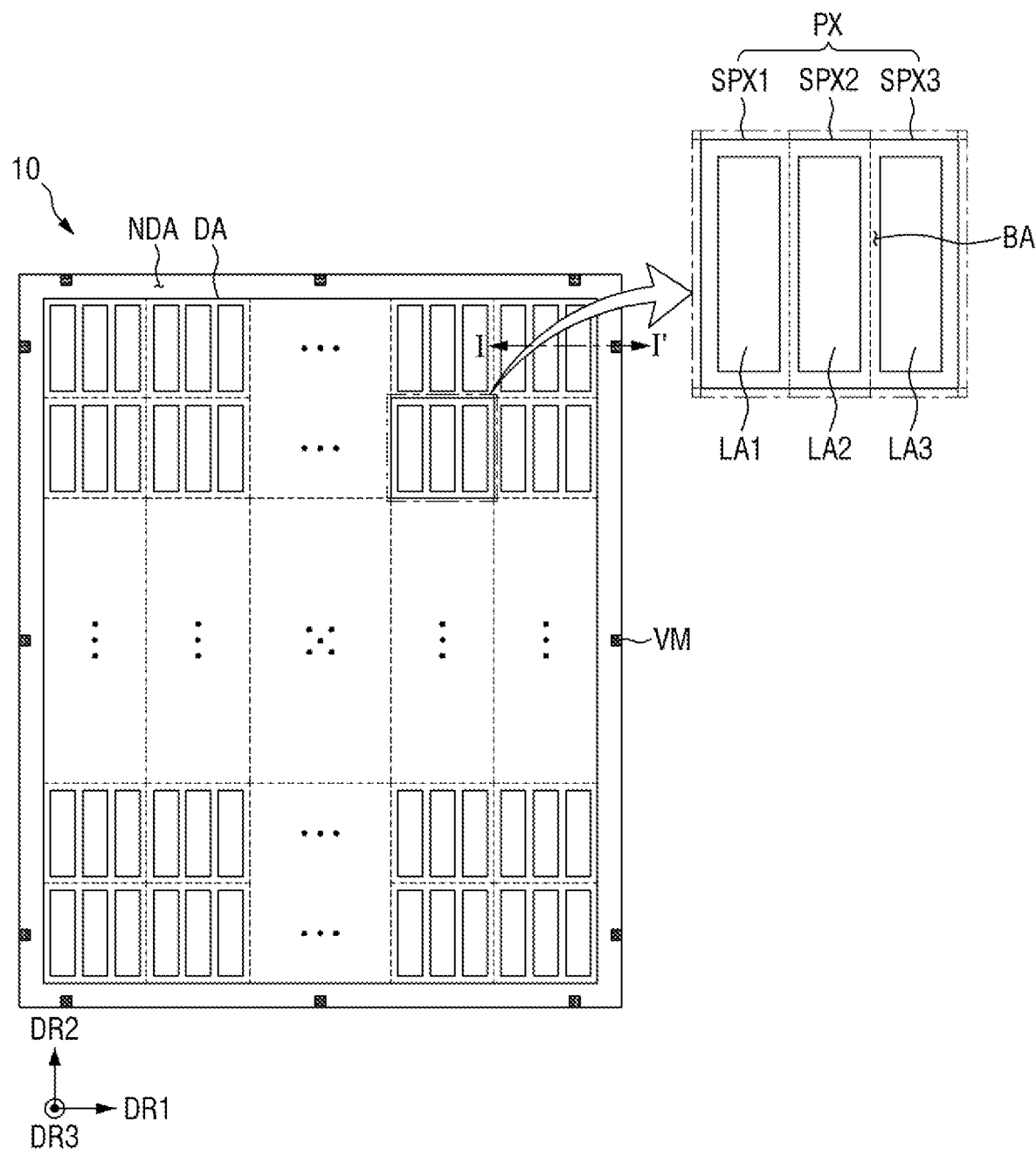
FIG. 4 is a plan view of a display device according to an embodiment of the present disclosure.

FIG. 4 is a plan view of a display device according to an embodiment of the present disclosure.

Referring to FIG. 4, a display area DA of a display device 10 may include a plurality of pixels PX that are arranged in multiple rows and columns. The pixels PX may be minimal units that repeat one after another for displaying an image. To display a full color, each of the pixels PX may include a plurality of subpixels SPX that emit different colors. The subpixels SPX may include first, second, and third subpixels SPX1, SPX2, and SPX3, which are sequentially arranged repeatedly in a first direction DR1. In one example, each of the pixels PX may include first, second, and third subpixels SPX1, SPX2, and SPX3, which emit light of first, second, and third colors, respectively. In one example, the first, second, and third colors may be red, green, and blue, respectively.

Each of the subpixels SPX may include a light output area LA and a light blocking area BA around the light output area LA.

The light output area LA may be a region that provides light emitted from a light-emitting element layer of the display device 10 to the outside of the display device 10, and the light blocking area BA may be a region that blocks the transmission of the light emitted from the light-emitting element layer.

Light output areas LA of the subpixels SPX may include first, second, and third light output areas LA1, LA2, and LA3. In one example, the first, second, and third light output areas LA1, LA2, and LA3 may be the light output areas LA of the first, second, and third subpixels SPX1, SPX2, and SPX3, respectively.

The first, second, and third light output areas LA1, LA2, and LA3 may be regions that emit light having a predetermined peak wavelength to the outside of the display device 10. The first light output area LA1 may emit light of the first color, the second light output area LA2 may emit light of the second color, and the third light output area LA3 may emit light of the third color. In one example, first-color light may be red light having a peak wavelength of from 610 nm to 650 nm, second-color light may be green light having a peak wavelength of from 510 nm to 550 nm, and third-color light may be blue light having a peak wavelength of from 440 nm to 480 nm. However, the present disclosure is not limited to this example.

The first, second, and third light output areas LA1, LA2, and LA3 may be sequentially arranged repeatedly along the first direction DR1, in the display area DA of the display device 10. The first, second, and third light output areas LA1, LA2, and LA3 may have a rectangular shape that extends longer in a second direction DR2 than in the first direction DR1 in a plan view, but the present disclosure is not limited thereto.

In one example, the first, second, and third light output areas LA1, LA2, and LA3 may have the same width in the first direction DR1, but the present disclosure is not limited thereto. In one example, the first, second, and third light output areas LA1, LA2, and LA3 may have different widths in the first direction DR1.

Light blocking areas BA may be disposed to surround the light output areas LA. Light blocking areas BA of each pair of adjacent subpixels SPX may adjoin each other. The light blocking areas BA of each pair of adjacent subpixels SPX may be connected to each other, and the light blocking areas BA of all the subpixels SPX may all be connected to one another. However, the present disclosure is not limited to this. The light output areas LA may be defined by the light-blocking areas BA.

The display device 10 may include a plurality of alignment vernier marks VM, which are disposed in the non-display area NDA. The alignment vernier marks VM may be used to determine whether the display device 10 and other neighboring display devices 10 are aligned with each other in a plan view or the degree of alignment therebetween. The alignment vernier marks VM may be disposed in the non-display area NDA to be spaced apart from one another. The alignment vernier marks VM may be disposed to adjoin the sides (or edges) of the display device 10 in a plan view. For example, the alignment vernier marks VM may extend from the sides of the display device 10 toward the display area DA thereof. The present disclosure is not limited thereto. In an embodiment, the alignment vernier marks VM may be adjacent to the sides of the display device 10 in a plan view, extending toward the display area DA thereof. The planar shape and the layout of the alignment vernier marks VM will be described later.

Figure 5A:
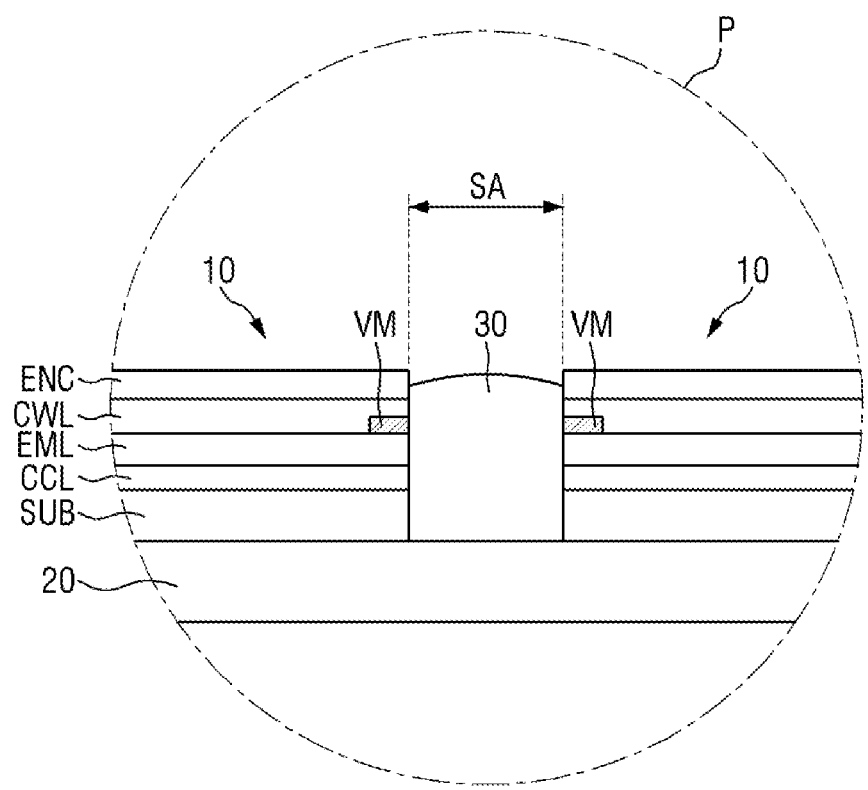
FIG. 5A is an enlarged cross-sectional view of an area P of FIG. 3.

FIG. 5A is an enlarged cross-sectional view of an area P of FIG. 3.

Referring to FIGS. 3 and 5A, each of the display devices 10 may include a substrate SUB, a circuit layer CCL, a light-emitting element layer EML, a color control layer CWL, and a first encapsulation layer ENC.

The substrate SUB may be disposed on a lower plate 20. The substrate SUB may be a base substrate or a base member and may include or may be formed of an insulating material such as a polymer resin. In one example, the substrate SUB may be a rigid substrate. In this example, the substrate SUB may include a glass material or a metallic material, but the present disclosure is not limited thereto. In an example, the substrate SUB may be a flexible substrate that is bendable, foldable, or rollable. In this example, the substrate SUB may include or may be formed of polyimide (PI), but the present disclosure is not limited thereto.

The circuit layer CCL may be disposed on the substrate SUB. The circuit layer CCL may be disposed on a surface of the substrate SUB and may drive the pixels PX. The circuit layer CCL may include at least one transistor and may drive the light-emitting element layer EML.

The light-emitting element layer EML may be disposed on a surface of the circuit layer CCL. The light-emitting element layer EML may include a plurality of light-emitting elements, and each of the light-emitting elements may include a first electrode, an emission layer, and a second electrode. In one example, the light-emitting element layer EML may include inorganic light-emitting diodes, but the present disclosure is not limited thereto. In an example, the light-emitting element layer EML may include organic light-emitting diodes. The light-emitting element layer EML will be described later.

The color control layer CWL may be disposed on the light-emitting element layer EML. The color control layer CWL may pass therethrough light incident thereupon from the light-emitting element layer EML after converting or maintaining the wavelength of the incident light. The color control layer CWL may selectively transmit light of a particular wavelength range therethrough and block or absorb light of other wavelength ranges, depending on the wavelength range of the incident light. As will be described later, the color control layer CWL may include a light blocking member that defines the light output areas LA and the light blocking areas BA.

The color control layer CWL may include the alignment vernier marks VM, which are disposed in the non-display area NDA. The alignment vernier marks VM may include or may be formed of the same material as the light blocking member of the color control layer CWL. The alignment vernier marks VM may be disposed adjacent to the boundary area SA and may be used to quantify the degree of alignment of the display devices 10. In an example, the sides of the display devices 10 may be defined by the boundary area SA, and the alignment vernier marks VM each may adjoin or be connected to a side of a corresponding display device. In an example, the alignment marks VM each may be spaced apart from a side of a corresponding display device.

The first encapsulation layer ENC may be disposed on the color control layer CWL. The first encapsulation layer ENC may prevent oxygen or moisture from infiltrating into the color control layer CWL and the light-emitting element layer EML. To this end, the first encapsulation layer ENC may include or may be formed of at least one inorganic film. The first encapsulation layer ENC may be disposed to cover the color control layer CWL, the light-emitting element layer EML, and the circuit layer CCL.

An optical member 30 may be disposed between the display devices 10. The optical member 30 may be disposed in the boundary area SA. The optical member 30 may be disposed on sides of the display devices 10, which are arranged in a lattice form, and may prevent the boundary area SA from becoming recognizable to the user. In one example, the optical member 30 may include or may be formed of a base resin and a light diffuser scattered in the base resin.

The base resin of the optical member 30 may include or may be formed of a material with a relatively high light transmittance. In one example, the base resin may be formed of a transparent material. In one example, the base resin may include or may be formed of a silicon-based inorganic material and at least one of the following organic materials: an epoxy resin, an acrylic resin, a cardo resin, and an imide resin.

The light diffuser may be scattered in the base resin. The light diffuser may scatter incident light in random directions, regardless of the incidence angle of the incident light, substantially without changing the peak wavelength of the incident light. The light diffuser may scatter light, incident upon the boundary area SA from each of the display devices 10 when the display devices 10 are turned on, in random directions and may thus prevent the boundary area SA from becoming recognizable to the user.

Figure 5B:
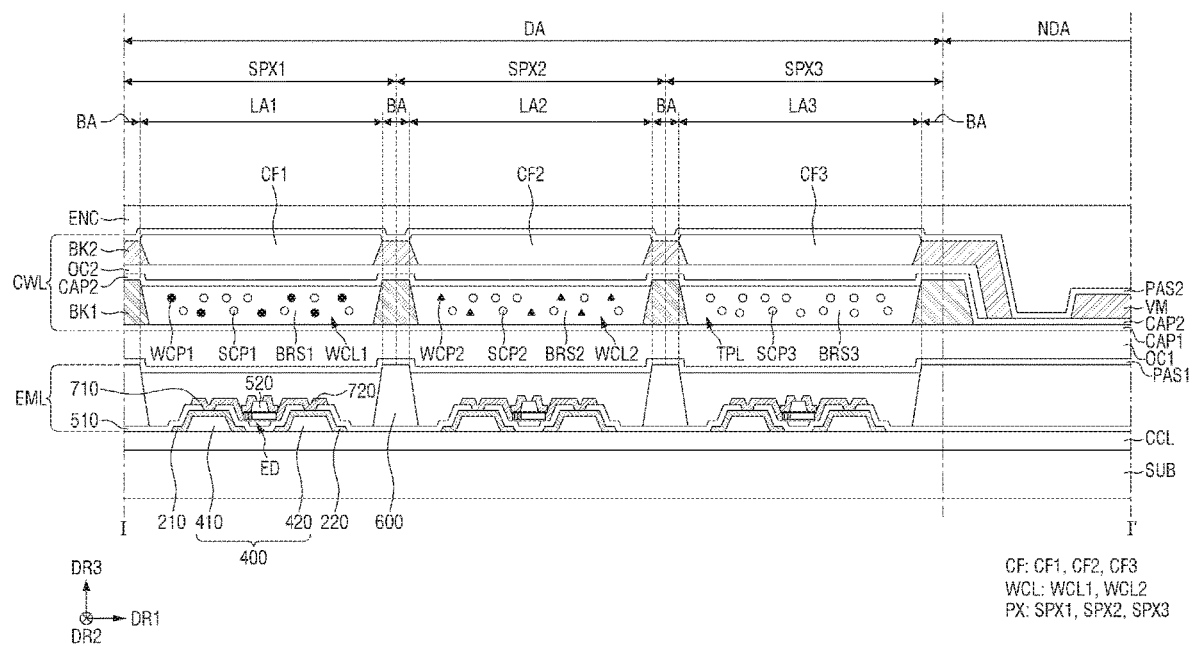
FIG. 5B is a cross-sectional view taken along line I-I' of FIG. 4.

FIG. 5B is a cross-sectional view taken along line I-I' of FIG. 4.

Referring to FIGS. 5A and 5B, a display device 10 may include a substrate SUB, a circuit layer CCL, which is disposed on the substrate SUB, a light-emitting element layer EML, which is disposed on the circuit layer CCL, and a color control layer CWL, which is disposed on the light-emitting element layer EML. The color control layer CWL may include a wavelength control layer (WCL and TPL), a color filter layer CF, a first light blocking member BK1, a second light blocking member BK2, and alignment vernier marks VM.

The substrate SUB may include or may be an insulating substrate. In an example, the substrate SUB may be formed of an insulating material such as glass, quartz, or a polymer resin. The substrate SUB may be a rigid substrate or a flexible substrate that is bendable, foldable, or rollable.

The circuit layer CCL, which drives pixels PX (or subpixels SPX), may be disposed on a surface of the substrate SUB. The circuit layer CCL may include at least one transistor and may thus drive the light-emitting element layer EML.

The light-emitting element layer EML may be disposed on a surface of the circuit layer CCL. The light-emitting element layer EML may include first banks 400, a second bank 600, first electrodes 210, second electrodes 220, first contact electrodes 710, second contact electrodes 720, light-emitting elements ED, and insulating layers (510 and 520).

The first banks 400 may be disposed on the circuit layer CCL. The first banks 400 may be disposed in first, second, and third light output areas LA1, LA2, and LA3 of first, second, and third subpixels SPX1, SPX2, and SPX3, respectively. Multiple first banks 400 may be disposed in each of the first, second, and third light output areas LA1, LA2, and LA3 to be spaced apart from one another in a first direction DR1. In one example, the first banks 400 included in each of the first, second, and third light output areas LA1, LA2, and LA3 may include first and second sub-banks 410 and 420.

A first electrode 210 may be disposed on the first sub-bank 410. In an example, the first electrode 210 may cover the first sub-bank 410. A second electrode 220 may be disposed on the second sub-bank 420. In an example, the second electrode may cover the second sub-bank 420. The first and second electrodes 210 and 220 may be electrically insulated from each other.

A first insulating layer 510 may be disposed on the first and second electrodes 210 and 220 to expose at least parts of the first and second electrodes 210 and 220. The first insulating layer 510 may protect the first and second electrodes 210 and 220 and may insulate the first and second electrodes 210 and 220 from each other. The first insulating layer 510 may prevent light-emitting elements ED disposed on the first insulating layer 510 from being in direct contact with, and damaged by, other elements.

The second bank 600 may be disposed on the first insulating layer 510 and may include openings that expose the first banks 400 and a plurality of light-emitting elements ED. The second bank 600 may be disposed along the boundaries of each subpixel SPX and may define and separate each pair of adjacent subpixels SPX. The second bank 600 may be disposed along the boundary between each pair of adjacent subpixels SPX. The second bank 600 may prevent ink from spilling over between each pair of adjacent subpixels SPX during an inkjet printing process using ink having a plurality of light-emitting elements ED dispersed therein.

Light-emitting elements ED may be disposed on the first insulating layer 510, between the first and second sub-banks 410 and 420. The light-emitting elements ED may be disposed on the first insulating layer 510, between the first and second electrodes 210 and 220, so that both end portions of each of the light-emitting elements ED may be placed on the first and second electrodes 210 and 220.

The light-emitting elements ED may include active layers of the same material and may thus be able to emit light of the same wavelength range or the same color. Light emitted from the first, second, and third light output areas LA1, LA2, and LA3 may have the same color. In one example, the light-emitting elements ED may emit third-color light having a peak wavelength of 440 nm to 480 nm or blue light. Thus, the light-emitting element layer EML may emit light third-color light or blue light.

The second insulating layer 520 may be disposed in part on the light-emitting elements ED between the first and second sub-banks 410 and 420. The second insulating layer 520 may be disposed to surround parts of the outer surfaces of the light-emitting elements ED. The second insulating layer 520 may be disposed on the light-emitting elements ED to expose both end portions (e.g., opposite end portions) of each of the light-emitting elements ED. The second insulating layer 520 may protect and fix the light-emitting elements ED during the fabrication of the display device 10.

A first contact electrode 710 may be disposed on the first electrode 210, and a second contact electrode 720 may be disposed on the second electrode 220. The first and second contact electrodes 710 and 720 may be electrically insulated from each other.

The first and second contact electrodes 710 and 720 may be in contact with the light-emitting elements ED and the first and second electrodes 210 and 220. For example, the first contact electrode 710 may be in contact with part of the first electrode 210 exposed by the first insulating layer 510 and first end portions of the light-emitting elements ED exposed by the second insulating layer 520, and the second contact electrode 720 may be in contact with part of the second electrode 220 exposed by the first insulating layer 510 and second end portions of the light-emitting elements ED exposed by the second insulating layer 520.

The first end portions of the light-emitting elements ED exposed by the second insulating layer 520 may be electrically connected to the first electrode 210 through the first contact electrode 710, and the second end portions of the light-emitting elements ED exposed by the second insulating layer 520 may be electrically connected to the second electrode 220 through the second contact electrode 720.

The display device 10 may further include a first passivation layer PAS1 and a first planarization layer OC1.

The first passivation layer PAS1 may be disposed on the light-emitting element layer EML. The first passivation layer PAS1 may protect the light-emitting element layer EML. The first passivation layer PAS1 may prevent the infiltration of moisture or the air from the outside and may thereby prevent damage to the light-emitting elements ED.

The first planarization layer OC1 may be disposed on the first passivation layer PAS1. The first planarization layer OC1 may be disposed above the light-emitting element layer EML and may planarize any height differences on the light-emitting element layer EML. The first planarization layer OC1 may include or may be formed of an organic material. In one example, the first planarization layer OC1 may include or may be formed of at least one of an acrylic resin, an epoxy resin, a phenolic resin, a polyamide resin, and a polyimide resin.

The color control layer CWL may be disposed on the first planarization layer OC1. The color control layer CWL may include a first capping layer CAP1, a wavelength control layer (WCL and TPL), the first light blocking member BK1, a second capping layer CAP2, a color filter layer CF, the second light blocking member BK2, alignment vernier marks VM, and a second passivation layer PAS2.

The first capping layer CAP1 may be disposed on the first planarization layer OC1. The first capping layer CAP1 may seal the bottom surface of the wavelength control layer (WCL and TPL). The first capping layer CAP1 may include or may be formed of an inorganic material. In one example, the first capping layer CAP1 may include or may be formed of at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The first light blocking member BK1 may be disposed on the first capping layer CAP1. The first light blocking member BK1 may be disposed in light blocking areas BA of the display area DA. The first light blocking member BK1 may be disposed in part in the non-display area NDA. The first light blocking member BK1 may overlap the second bank 600 in the thickness direction of the display device 10 (e.g., a third direction DR3). The first light blocking member BK1 may block the transmission of light. The first light blocking member BK1 may improve color reproducibility by preventing color mixing that may be caused by the infiltration of light between the first, second, and third light output areas LA1, LA2, and LA3. The first light blocking member BK1 may be formed in a lattice form to surround the first, second, and third light output areas LA1, LA2, and LA3 in a plan view. The first, second, and third light output areas LA1, LA2, and LA3 and the light blocking areas BA may be defined by the first light blocking member BK1 or the second light blocking member BK2.

The first light blocking member BK1 may include an organic light blocking material and a liquid repellent. Here, the liquid repellent may be formed of a fluorine-containing monomer or a fluorine-containing polymer, particularly, fluorine-containing aliphatic polycarbonate. In one example, the first light blocking member BK1 may be formed of a black organic material including a liquid repellent. The first light blocking member BK1 may be formed via the coating and exposure of an organic light blocking material including a liquid-repellent.

The wavelength control layer (WCL and TPL) may be disposed on parts of the first capping layer CAP1 exposed by the first light blocking member BK1. The wavelength control layer (WCL and TPL) may include a wavelength conversion layer WCL, which converts the wavelength of light incident upon the wavelength conversion layer (WCL and TPL), and a light transmitting pattern TOP, which transmits therethrough the incident light while maintaining the wavelength of the incident light.

The wavelength conversion layer WCL or the light transmitting pattern TPL may be disposed to separate the first, second, and third subpixels SPX1, SPX2, and SPX3 from each other. The wavelength conversion layer WCL or the light transmitting pattern TPL may be disposed in each of the first, second, and third light output areas LA1, LA2, and LA3 of the display area DA, and the wavelength conversion layer WCL and the light transmitting pattern TPL may be spaced apart from one another by the first light blocking member BK1 in the light blocking areas BA.

The wavelength conversion layer WCL and the light transmitting pattern TPL may be disposed on the first capping layer CPL1. In some embodiments, the wavelength conversion layer WCL and the light transmitting pattern TPL may be formed by inkjet printing, but the present disclosure is not limited thereto. The wavelength conversion layer WCL and the light transmitting pattern TPL may be formed by applying a photosensitive material and subjecting the photosensitive material to exposure and development to form patterns. The wavelength conversion layer WCL and the light transmitting pattern TPL will hereinafter be described as being formed by, for example, inkjet printing.

The wavelength conversion layer WCL may be disposed in each subpixel SPX having a different color from incident light from the light-emitting element layer EML to convert the wavelength of the incident light. The light transmitting pattern TPL may be disposed in each subpixel SPX having the same color as the incident light. In an embodiment where third-color light is incident upon the light-emitting element layer EML, the wavelength control layer WCL may be disposed in the first and second subpixels SPX1 and SPX2, and the light transmitting pattern TPL may be disposed in the third subpixel SPX3.

In one example, the wavelength conversion layer WCL may include first and second wavelength conversion patterns WCL1 and WCL2, which are disposed in the first and second subpixels SPX1 and SPX2, respectively.

The first wavelength conversion pattern WCL1 may be disposed in the first light output area LA1 defined by the first light blocking member BK1, in the first subpixel SPX1. The first wavelength conversion pattern WCL1 may convert third-color light incident from the light-emitting element layer EML into first-color light having a different color from the third-color light. In one example, the first wavelength conversion pattern WCL1 may convert blue light incident from the light-emitting element layer EML into red light.

The first wavelength conversion pattern WCL1 may include a first base resin BRS1 and a first wavelength conversion material WCP1, which is dispersed in the first base resin BRS1. The first wavelength conversion pattern WCL1 may further include a first scatterer SCP1, which is dispersed in the first base resin BRS1.

The second wavelength conversion pattern WCL2 may be disposed in the second light output area LA2 defined by the first light blocking member BK1, in the second subpixel SPX2. The second wavelength conversion pattern WCL2 may convert the third-color light incident from the light-emitting element layer EML into second-color light having a different color from the third-color light. In one example, the second wavelength conversion pattern WCL2 may convert blue light incident from the light-emitting element layer EML into green light.

The second wavelength conversion pattern WCL2 may include a second base resin BRS2 and a second wavelength conversion material WCP2, which is dispersed in the second base resin BRS2. The second wavelength conversion pattern WCL2 may further include a second scatterer SCP2, which is dispersed in the second base resin BRS2.

The light transmitting pattern TPL may be disposed in the third light output area LA3 defined by the first light blocking member BK1, in the third subpixel SPX3. The light transmitting pattern TPL may output third-color light incident from the light-emitting element layer EML while maintaining the wavelength of the incident light. In one example, the light transmitting pattern TPL may transmit therethrough blue light incident from the light-emitting element layer EML while maintaining the wavelength of the incident light.

The light transmitting pattern TPL may include a third base resin BRS3. The light transmitting pattern TPL may further include a third scatterer SCP3, which is dispersed in the third base resin BRS3.

The first, second, and third base resins BRS1, BRS2, and BRS3 may include or may be formed of a light-transmitting organic material. In one example, the first, second, and third base resins BRS1, BRS2, and BRS3 may be formed of an epoxy resin, an acrylic resin, a cardo resin, or an imide resin. The first, second, and third base resins BRS1, BRS2, and BRS3 may all be formed of the same material, but the present disclosure is not limited thereto.

The first, second, and third scatterers SCP1, SCP2, and SCP3 may have a different refractive index from the first, second, and third base resins BRS1, BRS2, and BRS3. The first, second, and third scatterers SCP1, SCP2, and SCP3 may include particles of a metal oxide or particles of an organic material. The metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), and the organic material may be an acrylic resin or a urethane resin. The first, second, and third scatterers SCP1, SCP2, and SCP3 may all be formed of the same material, but the present disclosure is not limited thereto.

The first wavelength conversion material WCP1 may be a material that converts third-color light into first-color light, and the second wavelength conversion material WCP2 may be a material that converts third-color light into second-color light. In one example, the first wavelength conversion material WCP1 may be a material that converts blue light into red light, and the second wavelength conversion material WCP2 may be a material that converts blue light into green light. The first and second wavelength conversion materials WCP1 and WCP2 may be quantum dots, quantum rods, or phosphors. The quantum dots may include group IV nanocrystals, group II-VI compound nanocrystals, group III-V compound nanocrystals, group IV-VI nanocrystals, or a combination thereof.

The second capping layer CAP2 may be disposed on the wavelength conversion layer (WCL and TPL) and the first light blocking member BK1. In one embodiment, the second capping layer CAP2 may cover the wavelength conversion layer (WCL and TPL) and the first light blocking member BK1. In one example, the second capping layer CAP2 may seal the first wavelength conversion pattern WCL1, the second wavelength conversion pattern WCL2, the light transmitting pattern TPL, and the first light blocking member BK1 and may thereby prevent the first wavelength conversion pattern WCL1, the second wavelength conversion pattern WCL2, and the light transmitting pattern TPL from being damaged or contaminated. The second capping layer CAP2 may include or may be formed of an inorganic material. In one embodiment, the second capping layer CAP2 may be formed of the same material as the first capping layer CAP1 and may include one of the aforementioned materials that are used to form the first capping layer CAP1.

A second planarization layer OC2 may be disposed on the second capping layer CAP2 and may planarize the tops of the first and second wavelength conversion patterns WCL1 and WCL2 and the light transmitting pattern TOP. The second planarization layer OC2 may include or may be formed of an organic material. In one example, the second planarization layer OC2 may include or may be formed of at least one of an acrylic resin, an epoxy resin, a phenolic resin, a polyamide resin, and a polyimide resin.

The second light blocking member BK2 may be disposed on the second planarization layer OC2. The second light blocking member BK2 may be disposed in the light blocking areas BA of the display area DA, along the boundaries of each subpixel SPX. The second light blocking member BK2 may overlap the first light blocking member BK1 and/or the second bank 600 in the thickness direction of the display device 10 (e.g., the third direction DR3).

The second light blocking member BK2 may be disposed in part in the non-display area NDA. The second light blocking member BK2 may cover side surfaces of the first light blocking member BK1 and the second planarization layer OC2 in the non-display area NDA.

The second light blocking member BK2 may not only block the emission of light, but also suppress the reflection of external light. The second light blocking member BK2 may be formed in a lattice form to surround the first, second, and third light output areas LA1, LA2, and LA3 in a plan view.

The second light blocking member BK2 may include or may be formed of an organic material. In one example, the second light blocking member BK2 may include a light absorbing material capable of absorbing visible light. As the second light blocking member BK2 includes a light absorbing material and is disposed along the boundaries of each subpixel SPX, the second light blocking member BK2 may define the light output area LA of each subpixel SPX, i.e., the first, second, and third light output areas LA1, LA2, and LA3. For example, the second light blocking member BK2 may be a sub-pixel defining film that defines the light output area LA and the light blocking area BA of each subpixel SPX.

The alignment vernier marks VM may be disposed in the non-display area NDA. The alignment vernier marks VM may be disposed on the second capping layer CAP2, in the non-display area NDA. In some embodiments, the second planarization layer OC2 may be disposed in the display area DA, but not in the non-display area NDA. In this case, the alignment vernier marks VM may be disposed on the second capping layer CAP2. However, the present disclosure is not limited to this. In some embodiments, the second planarization layer OC2 may be disposed in and across the display area DA and the non-display area NDA, in which case, the alignment vernier marks VM may be disposed on the second planarization layer OC2.

The alignment vernier marks VM may be spaced apart from the second light blocking member BK2. The alignment vernier marks VM may be spaced apart from the second light blocking member BK2 to form a plurality of patterns in a plan view.

The alignment vernier marks VM may include or may be formed of the same material as the second light blocking member BK2. In one example, the alignment vernier marks VM may include or may be formed of a light absorbing material capable of absorbing visible light. As the alignment vernier marks VM include or is formed of a light absorbing material, the alignment vernier marks VM may appear as dark parts during an alignment process for the display device 10. Accordingly, the alignment vernier marks VM may be used to measure the degree of alignment of the display device 10 with other neighboring display devices 10.

The alignment vernier marks VM may be formed by the same patterning process as the second light blocking member BK2. As the alignment vernier marks VM are formed by the same process as the second light blocking member BK2, the alignment vernier marks VM may improve the degree of alignment between the light output areas LA of the display device 10 and light output areas LA of each of the other neighboring display devices 10. For example, since the second light blocking member BK2 and the alignment vernier marks VM, which define the light output areas LA and the light blocking areas BA of the display device 10, are formed by the same patterning process, the layout of the alignment vernier marks VM and the light output areas LA may be uniformly maintained. Thus, the alignment between the light output areas LA of the display device 10 and the light output areas LA of each of the other neighboring display devices 10 may be controlled indirectly by aligning the alignment vernier marks VM.

In a case where the alignment vernier marks VM are formed as parts of the light-emitting element layer EML or the circuit layer CCL, the precision of the alignment of the display device 10 with the other neighboring display devices 10 may be lowered. For example, in a case where the alignment vernier marks VM are formed as parts of the light-emitting element layer EML or the circuit layer CCL, the layout of the alignment vernier marks VM and the light output areas LA may not be able to be uniformly maintained because the alignment vernier marks VM and the light output areas LA are formed by different processes. As a result, the precision of the alignment of the display device 10 with the other neighboring display devices 10 through the alignment vernier marks VM may be lowered because the layout of the alignment vernier marks VM and the light output areas LA may not be uniformly maintained even though the second light blocking member BK2 and the light-emitting element layer EML below the second light blocking member BK2 is only slightly misaligned during the formation of the second light blocking member BK2. As an additional process for forming the alignment vernier marks VM is not needed, the manufacturing efficiency of the display device 10 may be improved.

The color filter layer CF may be disposed on the second planarization layer OC2, in the display area DA. The color filter layer CF may be disposed on a surface of the second planarization layer OC2, in each region defined by the second light blocking member BK2.

The color filter layer CF may include first, second, and third color filters CF1, CF2, and CF3.

The first color filter CF1 may be disposed in the first light output area LA1 of the first subpixel SPX1, the second color filter CF2 may be disposed in the second light output area LA2 of the second subpixel SPX2, and the third color filter CF3 may be disposed in the third light output area LA3 of the third subpixel SPX3. The first, second, and third color filters CF1, CF2, and CF3 may be surrounded by the second light blocking member BK2.

Each of the first, second, and third color filters CF1, CF2, and CF3 may include or may be formed of a colorant such as a dye or a pigment capable of absorbing light of all wavelengths except for a particular wavelength. The first color filter CF1 may selectively transmit first-color light (e.g., red light) therethrough and may block or absorb second-color light (e.g., green light) and third-color light (e.g., blue light). The second color filter CF2 may selectively transmit second-color light (e.g., green light) therethrough and may block or absorb first-color light (e.g., red light) and third-color light (e.g., blue light). The third color filter CF3 may selectively transmit third-color light (e.g., blue light) therethrough and may block or absorb first-color light (e.g., red light) and second-color light (e.g., green light). In one example, the first color filter CF1 may be a red filter, the second color filter CF2 may be a green filter, and the third color filter CF3 may be a blue filter.

The first, second, and third color filters CF1, CF2, and CF3 may reduce reflected light from external light by absorbing some of the external light. Thus, the first, second, and third color filters CF1, CF2, and CF3 may prevent color distortion that may be caused by the reflection of external light.

As the color filter layer CF is disposed on the first and second wavelength conversion patterns WCL1 and WCL2 and the light transmitting pattern TPL through the second planarization layer OC2, the display device 10 may not need a separate substrate for the color filter layer CF. Thus, the thickness of the display device 10 may be reduced.

The second passivation layer PAS2 may be disposed on, and cover, the color filter layer CF, the second light blocking member BK2, and the alignment vernier marks VM. The second passivation layer PAS2 may protect the color filter layer CF.

The first encapsulation layer ENC may be disposed on the color control layer CWL. The first encapsulation layer ENC may be disposed on the second passivation layer PAS2. In one example, the first encapsulation layer ENC may include or may be formed of at least one inorganic film and may prevent the penetration of oxygen or moisture. The first encapsulation layer ENC may include or may be formed of at least one organic film and may protect the elements disposed below the first encapsulation layer ENC from a foreign material such as dust.

Figure 5C:
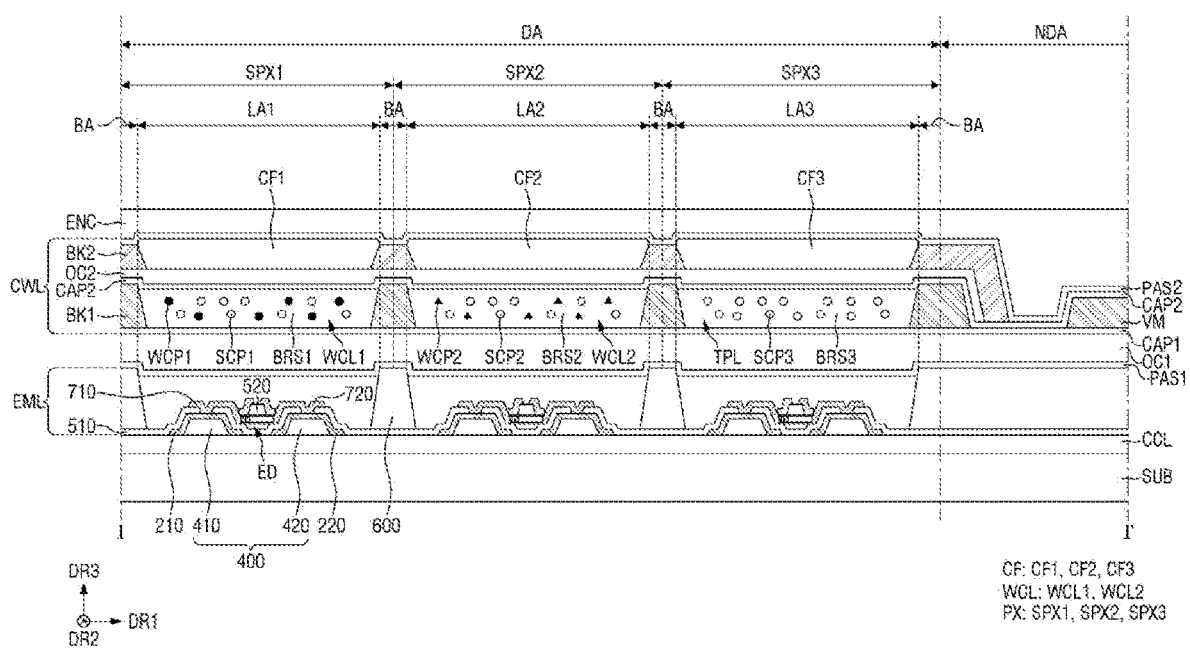
FIG. 5C is a cross-sectional view taken along line I-I' of FIG. 4.

FIG. 5C is a cross-sectional view taken along line I-I' of FIG. 4.

The embodiment of FIG. 5C differs from the embodiment of FIG. 5B in that the alignment vernier marks VM include or may be formed of the same material as the first light blocking member BK1. Descriptions of elements or features that have already been described above will be omitted or simplified, and the embodiment of FIG. 5C will hereinafter be described, focusing mainly on the differences with the embodiment of FIG. 5B.

Referring to FIG. 5C, the alignment vernier marks VM may be disposed between the first and second capping layers CAP1 and CAP2, in the non-display area NDA. In some embodiments, the second planarization layer OC2 may be disposed in the display area DA, but not in the non-display area NDA. In this case, the alignment vernier marks VM may be interposed between the first and second capping layers CAP1 and CAP2. However, the present disclosure is not limited to this. In some embodiments, the second planarization layer OC2 may be disposed in and across the display area DA and the non-display area NDA. In this case, the alignment vernier marks VM may be interposed between the second planarization layer OC2 and the first capping layer CAP1.

The alignment vernier marks VM may be spaced apart from the first light blocking member BK1. The alignment vernier marks VM may be spaced apart from the first light blocking member BK1 to form a plurality of patterns in a plan view.

The alignment vernier marks VM may include the same material as the first light blocking member BK1. In one example, the alignment vernier marks VM may include a light absorbing material capable of absorbing visible light.

The alignment vernier marks VM may be formed by the same patterning process as the first light blocking member BK1. As the alignment vernier marks VM are formed by the same process as the first light blocking member BK1, the alignment vernier marks VM may improve the degree of alignment between the light output areas LA of the display device 10 and the light output areas LA of each of the other neighboring display devices 10. For example, as the first light blocking member BK1, which defines the light output areas LA and the light blocking areas BA together with the second light blocking member BK2, and the alignment vernier marks VM are formed by the same patterning process, the layout of the alignment vernier marks VM and the light output areas LA may be uniformly maintained. Thus, the alignment between the light output areas LA of the display device 10 and the light output areas LA of each of the other neighboring display devices 10 may be controlled indirectly by aligning the alignment vernier marks VM.

The second capping layer CAP2 may be disposed on the alignment vernier marks VM, in the non-display area NDA.

Figure 6:
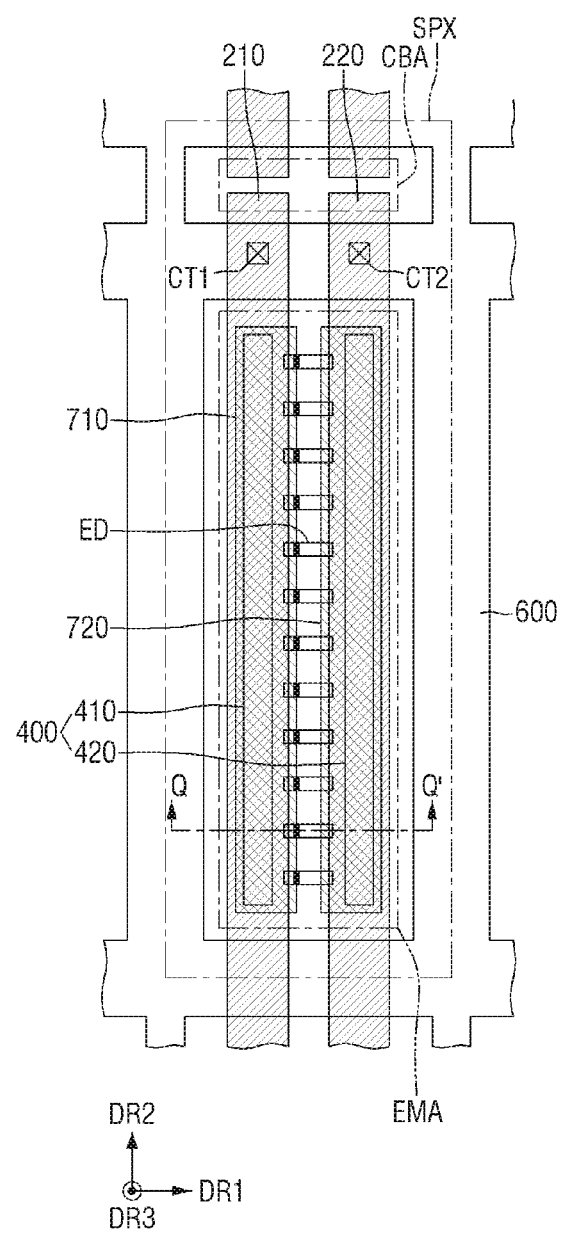
FIG. 6 is a plan view of a subpixel of a light-emitting element layer according to an embodiment of the present disclosure.
Figure 7:
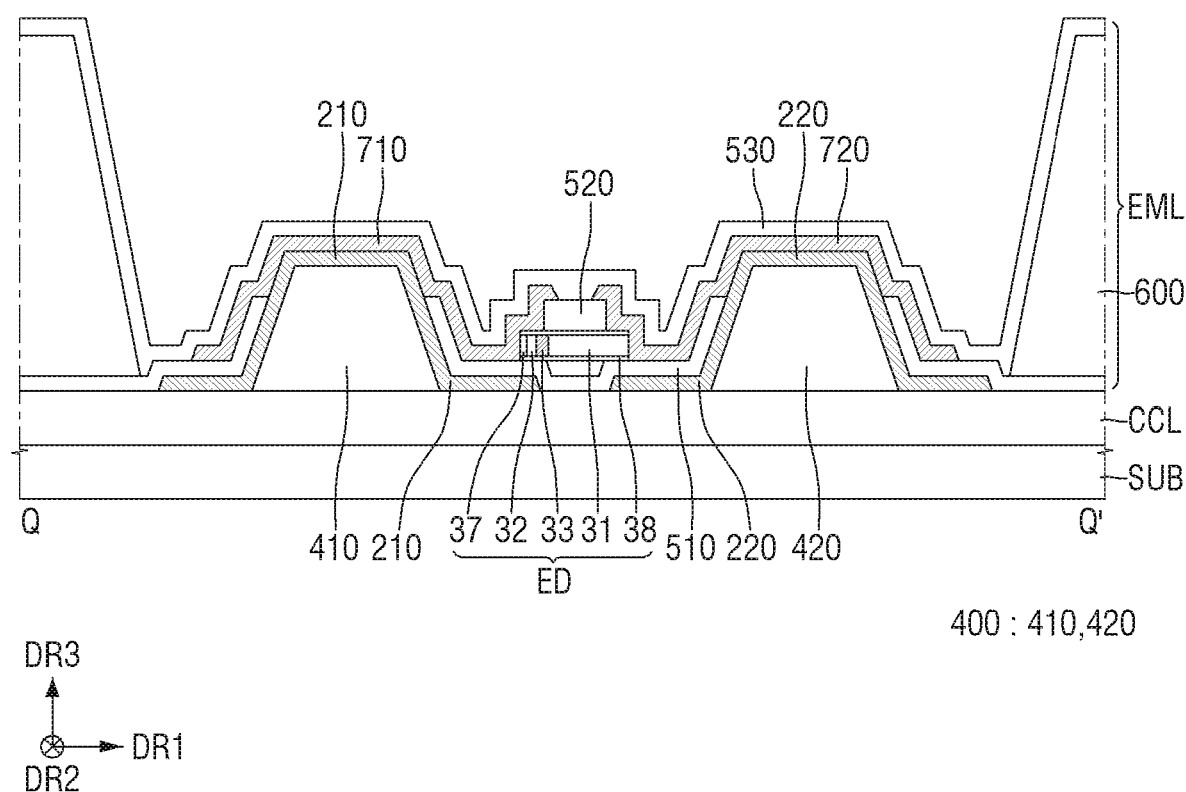
FIG. 7 is a cross-sectional view taken along line Q-Q' of FIG. 6.

FIG. 6 is a plan view of a subpixel of a light-emitting element layer according to an embodiment of the present disclosure. FIG. 7 is a cross-sectional view taken along line Q-Q' of FIG. 6.

Referring to FIG. 6, a subpixel SPX of a light-emitting element layer EML of a display device 10 may include an emission area EMA and a non-emission area. The emission area EMA may be defined as a region that outputs emitted by light-emitting elements ED, and the non-emission area may be defined as a region that is not reached by the light emitted by the light-emitting elements ED and thus does not output light.

The emission area EMA may include a region in which the light-emitting elements ED are disposed and a region around the region of the light-emitting elements ED. The emission area EMA may further include a region that outputs light emitted by the light-emitting elements ED and then reflected or refracted by other members.

The subpixel SPX may further include a cut area CBA, which is disposed in the non-emission area. The cut area CBA may be disposed on a side, in a second direction DR2, of the emission area EMA. The cut area CBA may be disposed between the emission area EMA and an emission area EMA of an upper neighboring subpixel SPX adjacent to the subpixel SPX in the second direction DR2.

The cut area CBA may be a region where electrodes 210 and 220 of the subpixel SPX are separated from electrodes 210 and 220 of the upper neighboring subpixel SPX. The electrodes 210 and 220 of the subpixel SPX may be separated from the electrodes 210 and 220 of the upper neighboring subpixel SPX in the upper neighboring subpixel SPX and may be disposed in part in the cut area CBA.

Referring to FIGS. 6 and 7, first banks 400 may extend in the second direction DR2 in the subpixel SPX in a plan view. As described above, the first banks 400 may include first and second sub-banks 410 and 420, which are spaced apart from each other, and the gap between the first and second sub-banks 410 and 420 may provide space in which a plurality of light-emitting elements ED are disposed.

The first and second sub-banks 410 and 420 may protrude at least in part from the top surface of a substrate SUB. Each of protruding parts of the first and second sub-banks 410 and 420 may have inclined side surfaces and may change the direction of light traveling toward the side surfaces of each of the first and second sub-banks 410 and 420 into an upward direction (e.g., a display direction).

First and second electrodes 210 and 220 may be disposed on the first and second sub-banks 410 and 420, respectively. The first and second electrodes 210 and 220 may be spaced apart from each other.

The first and second electrodes 210 and 220 may extend in the second direction DR2 in a plan view. The first and second electrodes 210 and 220 may be spaced apart, and face, each other in a first direction DR1.

The first electrode 210 may extend in the second direction DR2 and may overlap part of a second bank 600 that extends in a first direction DR1. The first electrode 210 may be electrically connected to a circuit layer CCL through a first contact hole CT1.

The second electrode 220 may extend in the second direction DR2 and may overlap part of the second bank 600 that extends in the first direction DR1. The second electrode 220 may be electrically connected to the circuit layer CCL through a second contact hole CT2.

The first and second electrodes 210 and 220 may be electrically connected to the light-emitting elements ED, and predetermined voltages may be applied to the first and second electrodes 210 and 220 so that the light-emitting elements ED may emit light. In one example, the electrodes 210 and 220 may be electrically connected to the light-emitting elements ED, which are disposed between the first and second electrodes 210 and 220, through contact electrodes 710 and 720 and may transmit electrical signals applied thereto to the light-emitting elements ED through the contact electrodes 710 and 720.

A first insulating layer 510 may be disposed on the first and second electrodes 21 and 22 to expose at least parts of the first and second electrodes 21 and 22.

The second bank 600 may be disposed on the first insulating layer 510. The second bank 600 may include, in a plan view, parts that extend in the first direction DR1 and parts that extend in the second direction DR2 and may be arranged in a lattice form. The second bank 600 may be formed to have a greater height than the first banks 400.

The light-emitting elements ED may be disposed on the first insulating layer 510, between the first and second sub-banks 410 and 420, so that both end portions of each of the light-emitting elements ED may be placed on the electrodes 210 and 220. The light-emitting elements ED may extend in one direction, and the direction in which the electrodes 210 and 220 extend may be substantially perpendicular to the direction in which the light-emitting elements ED extend.

A second insulating layer 520 may be disposed in part on the light-emitting elements ED, which are disposed between the first and second electrodes 210 and 220. The second insulating layer 520 may be disposed on the light-emitting elements ED and may expose both end portions of each of the light-emitting elements ED.

First and second contact electrodes 710 and 720 may be disposed on the second insulating layer 520. The first and second contact electrodes 710 and 720 may extend in one direction in a plan view. The first and second contact electrodes 710 and 720 may extend in the second direction DR2. The first and second contact electrodes 710 and 720 may be disposed on the second insulating layer 520 to be spaced apart from, and face, each other in the first direction DR1.

First end portions of the light-emitting elements ED exposed by the second insulating layer 520 may be electrically connected to the first electrode 210 through the first contact electrode 710, and second end portions of the light-emitting elements ED exposed by the second insulating layer 520 may be electrically connected to the second electrode 220 through the second contact electrode 720.

A third insulating layer 530 may be disposed on the entire surface of the substrate SUB. The third insulating layer 530 may protect the light-emitting elements ED, the first and second electrodes 210 and 220, the first and second contact electrodes 710 and 720, and the first, second, and third insulating layers 510, 520, and 530 from an external environment.

Figure 8:
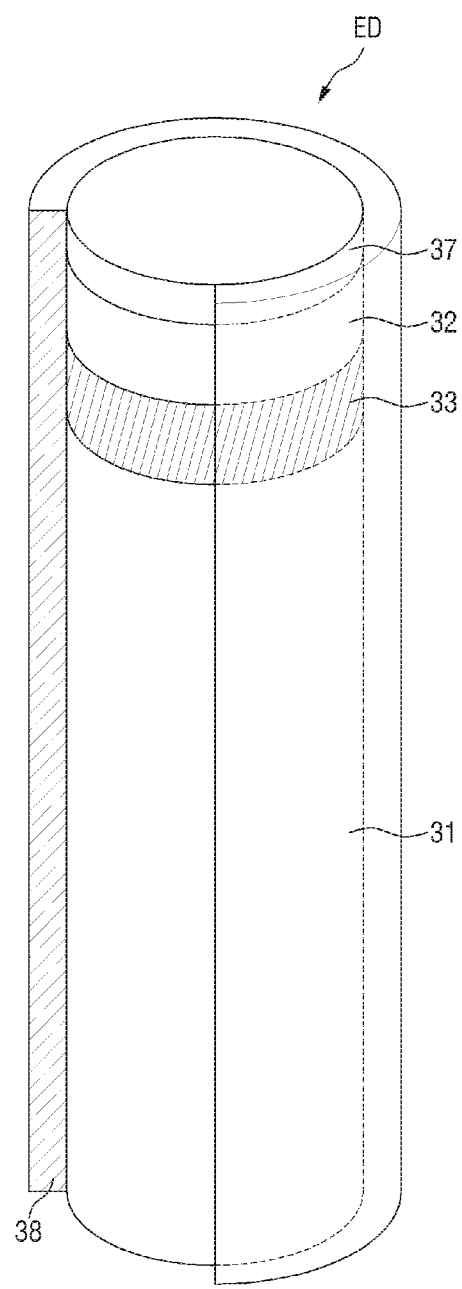
FIG. 8 is a perspective view of a light-emitting element according to an embodiment of the present disclosure.

FIG. 8 is a perspective view of a light-emitting element according to an embodiment of the present disclosure.

Referring to FIG. 8, a light-emitting element ED, which is a particulate element, may have a rod or cylindrical shape with a predetermined aspect ratio which represents a ratio of a height to a width. The length of the light-emitting element ED may be greater than the diameter of the light-emitting element ED and may have an aspect ratio of 1.2:1 to 100:1, but the present disclosure is not limited thereto.

The light-emitting element ED may have a nanometer-scale size of from 1 nm to 1 μm or a micrometer-scale size of from 1 μm to 1 mm. In one example, the diameter and the length of the light-emitting element ED may both be at a nanometer scale or at a micrometer scale. In an example, the diameter of the light-emitting element ED may be at a nanometer scale, but the length of the light-emitting element ED may be at a micrometer scale. In an example, in a case where there are a plurality of light-emitting elements ED, some of the light-emitting elements ED may have a nanometer-scale diameter and/or length, and some of the light-emitting elements ED may have a micrometer-scale diameter and/or length.

The light-emitting element ED may include an inorganic light-emitting diode. The inorganic light-emitting diode may include a plurality of semiconductor layers. In one example, the inorganic light-emitting diode may include a semiconductor layer of a first conductivity type (e.g., an n type), a semiconductor layer of a second conductivity type (e.g., a p type), and an active semiconductor layer interposed between the semiconductor layer of the first conductivity type and the semiconductor layer of the second conductivity type. The active semiconductor layer may receive holes and electrons from the semiconductor layer of the first conductivity type and the semiconductor layer of the second conductivity type, respectively, and the holes and the electrons may combine together in the active semiconductor layer. As a result, the light-emitting element ED may emit light.

In one example, the semiconductor layers of the light-emitting element ED may be sequentially stacked in the length direction of the light-emitting element ED. As illustrated in FIG. 8, the light-emitting element ED may include a first semiconductor layer 31, an active layer 33, and a second semiconductor layer 32, which are sequentially stacked in the length direction of the light-emitting element ED. The first semiconductor layer 31, the active layer 33, and the second semiconductor layer 32 may be the semiconductor layer of the first conductivity type, the active semiconductor layer, and the semiconductor layer of the second conductivity type, respectively.

The first semiconductor layer 31 may be doped with a dopant of the first conductivity type. The dopant of the first conductivity type may be Si, Ge, or Sn. In one example, the first semiconductor layer 31 may be n-GaN doped with an n-type dopant such as Si.

The second semiconductor layer 32 may be spaced apart from the first semiconductor layer 31 by the active layer 33. The second semiconductor layer 32 may be doped with a dopant of the second conductivity type. In one example, the second semiconductor layer 32 may be p-GaN doped with a p-type dopant such as Mg.

The active layer 33 may include a material having a single- or multi-quantum well structure. As described above, as electrical signals are applied through the first and second semiconductor layers 31 and 32, the active layer 33 may emit light due to the combination of electron-hole pairs.

In some embodiments, the active layer 33 may have a structure in which a semiconductor material having large bandgap energy and a semiconductor material having small bandgap energy are alternately stacked on each other, and may include different group-III, group-IV, and group-IV semiconductor materials depending on the wavelength of light to be emitted.

Light emitted by the active layer 33 may be output not only through the outer surface, in the length direction, of the light-emitting element ED, but also through both ends (e.g., opposite ends) of the light-emitting element ED. For example, the direction in which light emitted by the active layer 33 is output is not particularly limited.

The light-emitting element ED may further include an electrode layer 37, which is disposed on the second semiconductor layer 32. The electrode layer 37 may be in contact with the second semiconductor layer 32. The electrode layer 37 may be an ohmic contact electrode, but the present disclosure is not limited thereto. Alternatively, the electrode layer 37 may be a Schottky contact electrode.

When both end portions (e.g., opposite ends) of the light-emitting element ED and the contact electrodes 710 and 720 are electrically connected to apply electrical signals to the first and second semiconductor layers 31 and 32, the electrode layer 37 may be disposed between the second semiconductor layer 32 and the contact electrodes 710 and 720 and may reduce resistance. The electrode layer 37 may include or may be formed of at least one of aluminum (Al), titanium (Ti), indium (In), gold (Au), silver (Ag), indium tin oxide (ITO), indium zinc oxide (IZO), and indium tin zinc oxide (ITZO). The electrode layer 37 may include or may be formed of a semiconductor material doped with an n- or p-type dopant.

The light-emitting element ED may further include an insulating film 38, which surrounds the outer circumferential surfaces of the first semiconductor layer 31, the second semiconductor layer 32, the active layer 33, and/or the electrode layer 37. The insulating film 37 may be disposed to surround the outer surface of at least the active layer 33 and may extend in the direction in which the light-emitting element ED extends. The insulating film 37 may protect the other elements of the light-emitting element ED from moisture, for example. The insulating film 38 may be formed of a material having insulating properties and may thus prevent any short circuit that may occur when the active layer 33 is placed in direct contact with electrodes that transmit electrical signals to the light-emitting element ED. As the insulating film 38 includes the active layer 33 and protects the outer circumferential surfaces of the first and second semiconductor layers 31 and 32, the degradation of the emission efficiency of the light-emitting element ED may be prevented.

Referring to FIGS. 7 and 8, the light-emitting element ED may be disposed on a substrate SUB, and the direction in which the first semiconductor layer 31, the active layer 33, the second semiconductor layer 32, and the electrode layer 37 are sequentially stacked on each other may be parallel to a surface of the substrate SUB in a cross-sectional view taken from one end to the other end of the light-emitting element ED. As the insulating film 38 is disposed to surround the side surfaces of the first semiconductor layer 31, the active layer 33, the second semiconductor layer 32, and the electrode layer 37, part of the outer surface of the light-emitting element ED between first and second electrodes 210 and 220 may be the insulating film 38.

Figure 9:
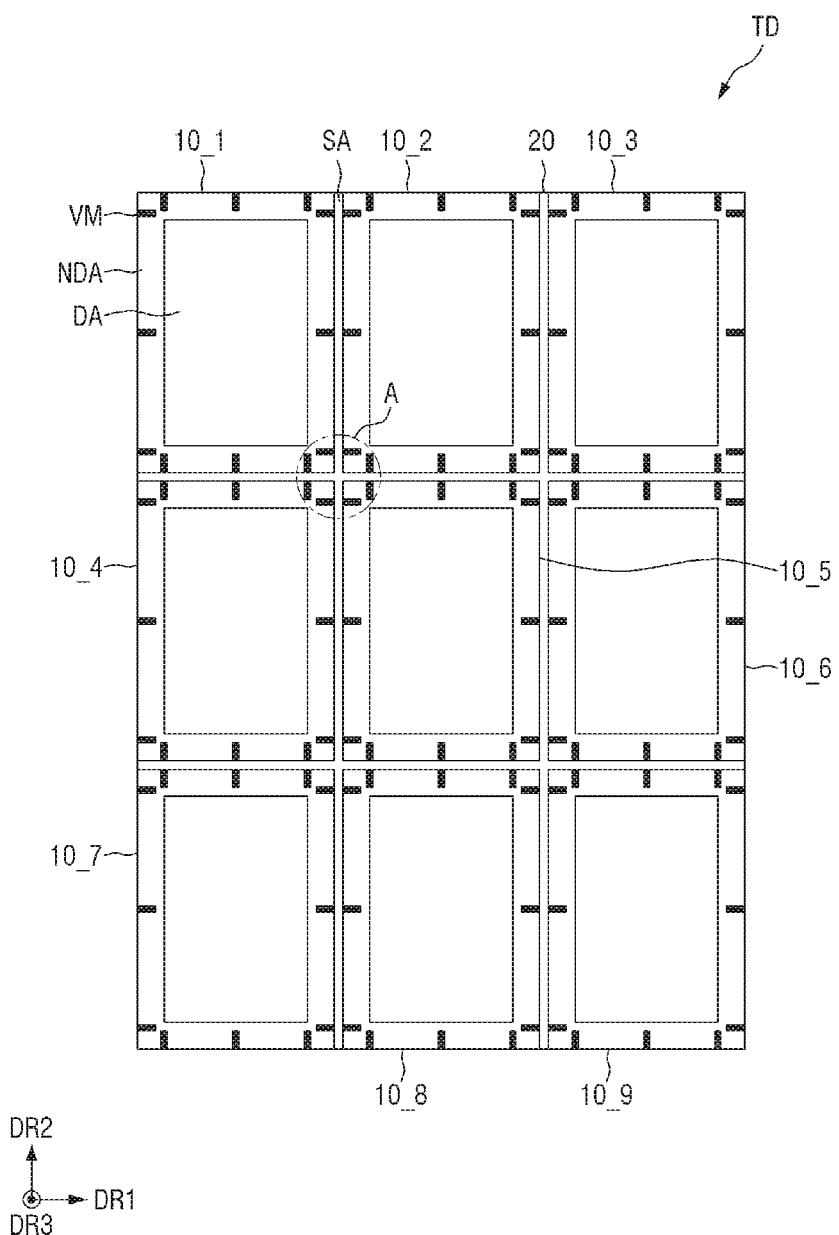
FIG. 9 is a plan view illustrating the layout of the tiled display device of FIG. 1.

FIG. 9 is a plan view illustrating the layout of the tiled display device of FIG. 1.

The terms "left", "right", "upper", and "lower", as used herein, refer to directions in a plan view of the tiled display device TD or each of the display devices 10. For example, the term "right side" may refer to one side in the first direction DR1, the term "left side" may refer to the other side (i.e., the opposite side) in the first direction DR1, the term "upper side" may refer to one side in the second direction DR2, and the term "lower side" may refer to the other side (i.e., the opposite side) in the second direction DR2.

Referring to FIG. 9, the tiled display device TD may include a lower plate 20, a plurality of display devices 10, which are disposed on the lower plate 20 to be spaced apart from one another at a predetermined distance. In one example, the display devices 10 may include first, second, third, fourth, fifth, sixth, seventh, eighth, and ninth display devices 10_1, 10_2, 10_3, 10_4, 10_5, 10_6, 10_7, 10_8, and 10_9. The first, second, third, fourth, fifth, sixth, seventh, eighth, and ninth display devices 10_1, 10_2, 10_3, 10_4, 10_5, 10_6, 10_7, 10_8, and 10_9 may be disposed to be spaced apart from one another in the first direction DR1 and/or the second direction DR2. FIG. 9 illustrates that nine display devices 10 are disposed on the lower plate 20 and are arranged in a 3×3 matrix, but the number and the layout of display devices 10 are not particularly limited. The number of display devices 10 may be determined by the size of the display devices 10 and the size of the tiled display device TD.

Figure 10:
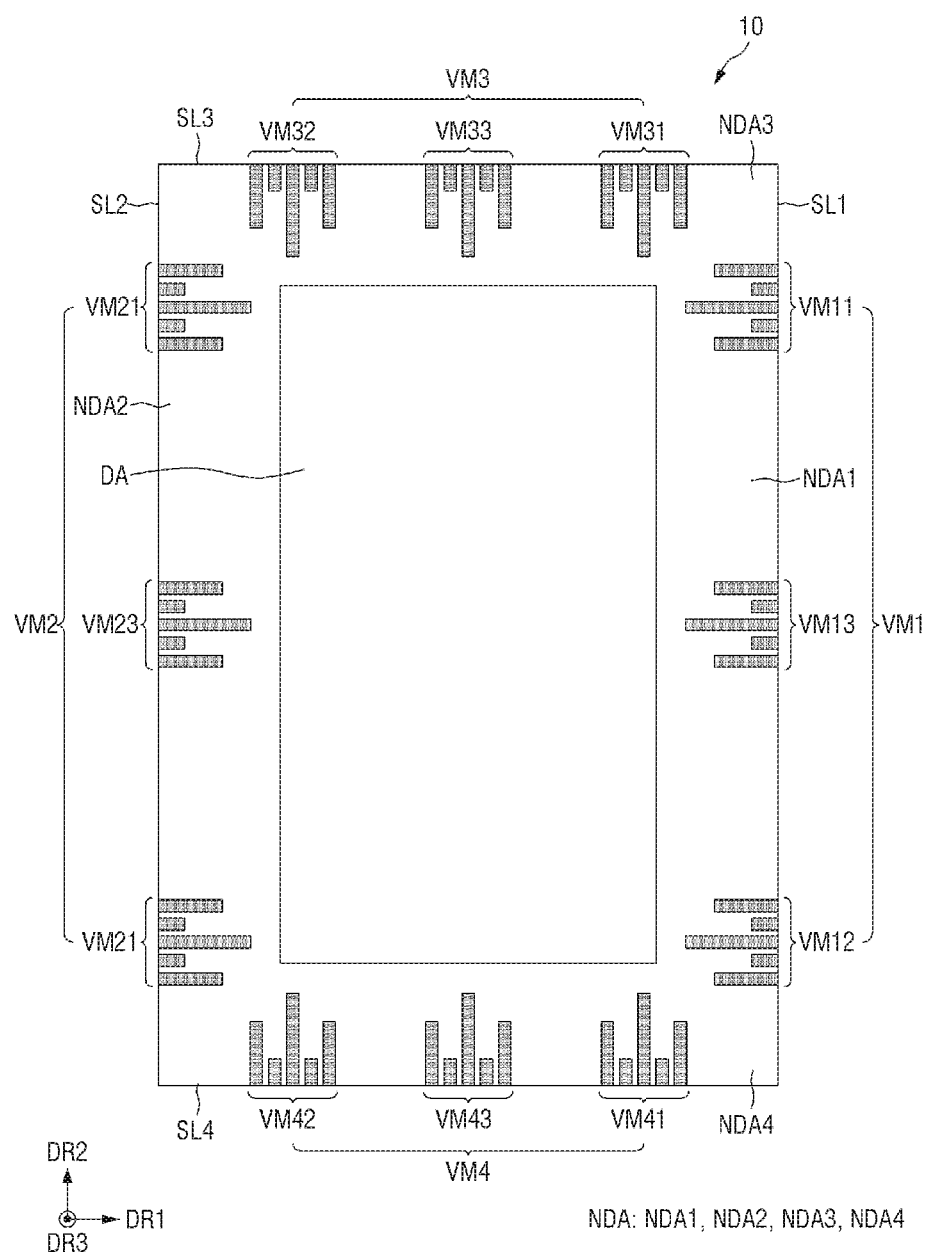
FIG. 10 is a plan view of the display device of FIG. 4.

Alignment vernier marks VM may be disposed in non-display areas NDA. A plurality of alignment vernier marks VM may be disposed in each of the non-display areas NDA to be spaced apart from one another. The alignment vernier marks VM may be disposed to adjoin the sides of each of the display devices 10 in a plan view. For example, the alignment vernier marks VM may extend from the sides of the display device 10 toward the display area DA thereof (see, FIG. 2). The present disclosure is not limited thereto. In an embodiment, the alignment vernier marks VM may be adjacent to the sides of the display device 10 in a plan view, extending toward the display area DA thereof. In one example, the alignment vernier marks VM may extend in one direction, and the direction in which the alignment vernier marks VM extend may be perpendicular to the directions in which the sides of each of the display devices 10 extend. FIGS. 9 and 10 illustrate that three alignment vernier marks VM are disposed on each of the sides of each of the display devices 10, but the number and the layout of alignment vernier marks VM are not particularly limited. In some embodiments, two alignment vernier marks VM or four alignment vernier marks VM may be disposed on each of the sides of each of the display devices 10. In some embodiments, the alignment vernier marks VM may be disposed on all the sides of each of the display devices 10, except for those forming the sides of the tiled display device TD.

During the placement of the display devices 10 on the lower plate 20, the display devices 10 may be arranged and aligned so that the alignment vernier marks VM may be aligned in parallel to one another in the first or second direction DR1 or DR2 between each pair of adjacent display devices 10 in the first or second direction DR1 or DR2. The expression "the alignment vernier marks VM are aligned in parallel", as used herein, means that the directions in which every two adjacent alignment vernier marks VM extend coincide with each other.

In one example, the first and second display devices 10_1 and 10_2, which are disposed adjacent to each other in the first direction DR1 to be spaced apart from, and face, each other in the first direction DR1, may be arranged and aligned so that the alignment vernier marks VM disposed on each of the long sides of the first display device 10_1 may be aligned in parallel to the alignment vernier marks VM disposed on each of the long sides of the second display device 10_2. In some embodiments, the alignment vernier marks VM disposed on each of the long sides of the first display device 10_1 and the alignment vernier marks VM disposed on each of the long sides of the second display device 10_2 may extend along a straight line extending in the first direction DR1. Similarly, in one example, the first and fourth display devices 10_1 and 10_4, which are disposed adjacent to each other in the second direction DR2 to be spaced apart from, and face, each other in the second direction DR2, may be arranged and aligned so that the alignment vernier marks VM disposed on each of the short sides of the first display device 10_1 may be aligned in parallel to the alignment vernier marks VM disposed on each of the short sides of the fourth display device 10_4. In some embodiment, the alignment vernier marks VM disposed on each of the short sides of the first display device 10_1 and the alignment vernier marks VM disposed on each of the short sides of the fourth display device 10_4 may extend along a straight line extending in the second direction DR2.

During the placement of the display devices 10 on the lower plate 20, the degree of alignment of each pair of adjacent display devices 10 in the first or second direction DR1 or DR2 may be measured and quantified using sets of alignment vernier marks VM included in each pair of adjacent display devices 10 in the first or second direction DR1 or DR2. The alignment of the display devices 10 in the tiled display device TD may be readjusted by moving each of the display devices 10 in the first direction DR1 and/or the second direction DR2 based on measurement data (or numerical data), which is obtained using the alignment vernier marks VM and indicates the degree of alignment between the display devices 10.

FIG. 10 is a plan view of the display device of FIG. 4.

Referring to FIG. 10, the display device 10 may include a display area and a non-display area NDA, which surrounds the display area DA.

The non-display area NDA may include first, second, third, and fourth non-display areas NDA1, NDA2, NDA3, and NDA4. The first non-display area NDA1 may be disposed adjacent to a first side SL1, in the first direction DR1, of the display device 10 (i.e., the right side or a first long side of the display device 10) in a plan view. The second non-display area NDA2 may be disposed adjacent to a second side SL2, in the first direction DR1, of the display device 10 (i.e., the left side or a second long side of the display device 10) in a plan view. The third non-display area NDA3 may be disposed adjacent to a third side SL3, in the second direction DR2, of the display device 10 (i.e., the upper side or a first short side of the display device 10) in a plan view. The fourth non-display area NDA4 may be disposed adjacent to a fourth side SL4, in the second direction DR2, of the display device 10 (i.e., the lower side or a second short side of the display device 10) in a plan view.

The alignment vernier marks VM may include first, second, third, and fourth alignment vernier marks VM1, VM2, VM3, and VM4.

The first alignment vernier mark VM1 may be disposed in the first non-display area NDA1. The first alignment vernier mark VM1 may adjoin the first side (or the right side) of the display device 10, in the first non-display area NDA1. For example, the alignment vernier marks VM may extend from the first side of the display device 10 toward the display area DA thereof (see, FIG. 2). The present disclosure is not limited thereto. In an embodiment, the alignment vernier marks VM may be adjacent to the first side of the display device 10 in a plan view, extending toward the display area DA thereof.

The first alignment vernier mark VM1 may include a plurality of first, second, and third sub-vernier marks VM11, VM12, and VM13. The first, second, and third sub-vernier marks VM11, VM12, and VM13 may be spaced apart from one another in the second direction DR2.

The first sub-vernier mark VM11 of the first alignment vernier mark VM1 may be disposed to adjoin the first side SL1 of the display device 10, near a first corner where the first and third sides SL1 and SL3 meet each other. The second sub-vernier mark VM12 of the first alignment vernier mark VM1 may be disposed to adjoin the second side SL2 of the display device 10, near a second corner where the first and fourth sides SL1 and SL4 meet each other. The third sub-vernier mark VM13 of the first alignment vernier mark VM1 may be disposed between the first and second sub-vernier marks VM11 and VM12 of the first alignment vernier mark VM1 to adjoin the first side SL1 of the display device 10.

The first and second sub-vernier marks VM11 and VM12 of the first alignment vernier mark VM1 may be vernier marks disposed to adjoin the first side SL1 of the display device 10, near the first and second corners of the display device 10, and the third sub-vernier mark VM13 of the first alignment vernier mark VM1 may be a vernier mark disposed to adjoin the first side SL1, apart from the first and second corners of the display device 10. As the alignment vernier marks VM are arranged not only at, but also between, the corners of the display device 10, the precision of the alignment of the display device 10 may be improved.

The second alignment vernier mark VM2 may be disposed in the second non-display area NDA2. The second alignment vernier mark VM2 may adjoin the second side (or the left side) of the display device 10, in the second non-display area NDA2. For example, the alignment vernier marks VM may extend from the second side of the display device 10 toward the display area DA thereof (see, FIG. 2). The present disclosure is not limited thereto. In an embodiment, the alignment vernier marks VM may be adjacent to the second side of the display device 10 in a plan view, extending toward the display area DA thereof.

The second alignment vernier mark VM2 may include a plurality of sub-vernier marks, i.e., first, second, and third sub-vernier marks VM21, VM22, and VM23. The first, second, and third sub-vernier marks VM21, VM22, and VM23 may be spaced apart from one another in the second direction DR2.

The first sub-vernier mark VM21 of the second alignment vernier mark VM2 may be disposed to adjoin the second side SL2 of the display device 10, near a third corner where the second and third sides SL2 and SL3 meet each other. The second sub-vernier mark VM22 of the second alignment vernier mark VM2 may be disposed to adjoin the second side SL2 of the display device 10, near a fourth corner where the second and fourth sides SL2 and SL4 meet each other. The third sub-vernier mark VM33 of the second alignment vernier mark VM2 may be disposed between the first and second sub-vernier marks VM21 and VM22 of the second alignment vernier mark VM2 to adjoin the second side SL2 of the display device 10.

The first, second, and third sub-vernier marks VM11, VM12, and VM13 of the first alignment vernier mark VM1 may be formed to be aligned in parallel to the first, second, and third sub-vernier marks VM21, VM22, and VM23, respectively, of the second alignment vernier mark VM2 in the first direction DR1. The first, second, and third sub-vernier marks VM11, VM12, and VM13 of the first alignment vernier mark VM1 may be horizontally symmetrical with the first, second, and third sub-vernier marks VM21, VM22, and VM23, respectively, of the second alignment vernier mark VM2 with respect to an imaginary line that passes through the center of the display device 10 along the second direction DR2.

The third alignment vernier mark VM3 may be disposed in the third non-display area NDA3. The third alignment vernier mark VM3 may adjoin the third side (or the upper side) of the display device 10, in the third non-display area NDA3. For example, the alignment vernier marks VM may extend from the third side of the display device 10 toward the display area DA thereof (see, FIG. 2). The present disclosure is not limited thereto. In an embodiment, the alignment vernier marks VM may be adjacent to the third side of the display device 10 in a plan view, extending toward the display area DA thereof.

The third alignment vernier mark VM3 may include a plurality of sub-vernier marks, i.e., first, second, and third sub-vernier marks VM31, VM32, and VM33. The first, second, and third sub-vernier marks VM31, VM32, and VM33 may be spaced apart from one another in the first direction DR1.

The first sub-vernier mark VM31 of the third alignment vernier mark VM3 may be disposed to adjoin the third side SL3 of the display device 10, near the first corner where the first and third sides SL1 and SL3 meet each other. The second sub-vernier mark VM32 of the third alignment vernier mark VM3 may be disposed to adjoin the third side SL3 of the display device 10, near the third corner where the second and third sides SL2 and SL3 meet each other. The third sub-vernier mark VM33 of the third alignment vernier mark VM3 may be disposed between the first and second sub-vernier marks VM31 and VM32 of the third alignment vernier mark VM3 to adjoin the third side SL3 of the display device 10.

The fourth alignment vernier mark VM4 may be disposed in the fourth non-display area NDA4. The fourth alignment vernier mark VM4 may adjoin the fourth side (or the lower side) of the display device 10, in the fourth non-display area NDA4. For example, the alignment vernier marks VM may extend from the fourth side of the display device 10 toward the display area DA thereof (see, FIG. 2). The present disclosure is not limited thereto. In an embodiment, the alignment vernier marks VM may be adjacent to the fourth side of the display device 10 in a plan view, extending toward the display area DA thereof.

The fourth alignment vernier mark VM4 may include a plurality of sub-vernier marks, i.e., first, second, and third sub-vernier marks VM41, VM42, and VM43. The first, second, and third sub-vernier marks VM41, VM42, and VM43 may be spaced apart from one another in the second direction DR2.

The first sub-vernier mark VM41 of the fourth alignment vernier mark VM4 may be disposed to adjoin the fourth side SL4 of the display device 10, near the second corner where the first and fourth sides SL1 and SL4 meet each other. The second sub-vernier mark VM42 of the fourth alignment vernier mark VM4 may be disposed to adjoin the fourth side SL4 of the display device 10, near the fourth corner where the second and fourth sides SL2 and SL4 meet each other. The third sub-vernier mark VM43 of the fourth alignment vernier mark VM4 may be disposed between the first and second sub-vernier marks VM41 and VM42 of the fourth alignment vernier mark VM4 to adjoin the fourth side SL4 of the display device 10.

The first, second, and third sub-vernier marks VM41, VM42, and VM43 of the fourth alignment vernier mark VM4 may be formed to be aligned in parallel to the first, second, and third sub-vernier marks VM31, VM32, and VM33, respectively, of the third alignment vernier mark VM3 in the second direction DR2. The first, second, and third sub-vernier marks VM41, VM42, and VM43 of the fourth alignment vernier mark VM4 may be vertically symmetrical with the first, second, and third sub-vernier marks VM31, VM32, and VM33, respectively, of the third alignment vernier mark VM3 with respect to an imaginary line that passes through the center of the display device 10 along the first direction DR1.

The first and second alignment vernier marks VM1 and VM2, which are disposed in the first and second non-display areas NDA1 and NDA2, respectively, of the display device 10 that adjoin the first and second sides SL1 and SL2, respectively, of the display device 10, may be vernier marks for determining whether the display device 10 is aligned with other neighboring display devices 10 in the first direction DR1 based on the measured degree of alignment therebetween. For example, a determination may be made as to whether each pair of adjacent display devices 10 in the first direction DR1 are misaligned, by using the first and second alignment vernier marks VM1 and VM2, based on the degree of alignment therebetween.

Similarly, the third and fourth alignment vernier marks VM3 and VM4, which are disposed in the third and fourth non-display areas NDA3 and NDA4, respectively, of the display device 10 that adjoin the third and fourth sides SL3 and SL4, respectively, of the display device 10, may be vernier marks for determining whether the display device 10 is aligned with other neighboring display devices 10 in the second direction DR2 based on the measured degree of alignment therebetween. For example, a determination may be made as to whether each pair of adjacent display devices 10 in the second direction DR2 are misaligned, by using the third and fourth alignment vernier marks VM3 and VM4, based on the degree of alignment therebetween.

Each of the first, second, third, and fourth alignment vernier marks VM1, VM2, VM3, and VM4 is illustrated as including three sub-vernier marks, but the present disclosure is not limited thereto. Alternatively, each of the first, second, third, and fourth alignment vernier marks VM1, VM2, VM3, and VM4 may include more than three sub-vernier marks or less than three sub-vernier marks.

Figure 11:
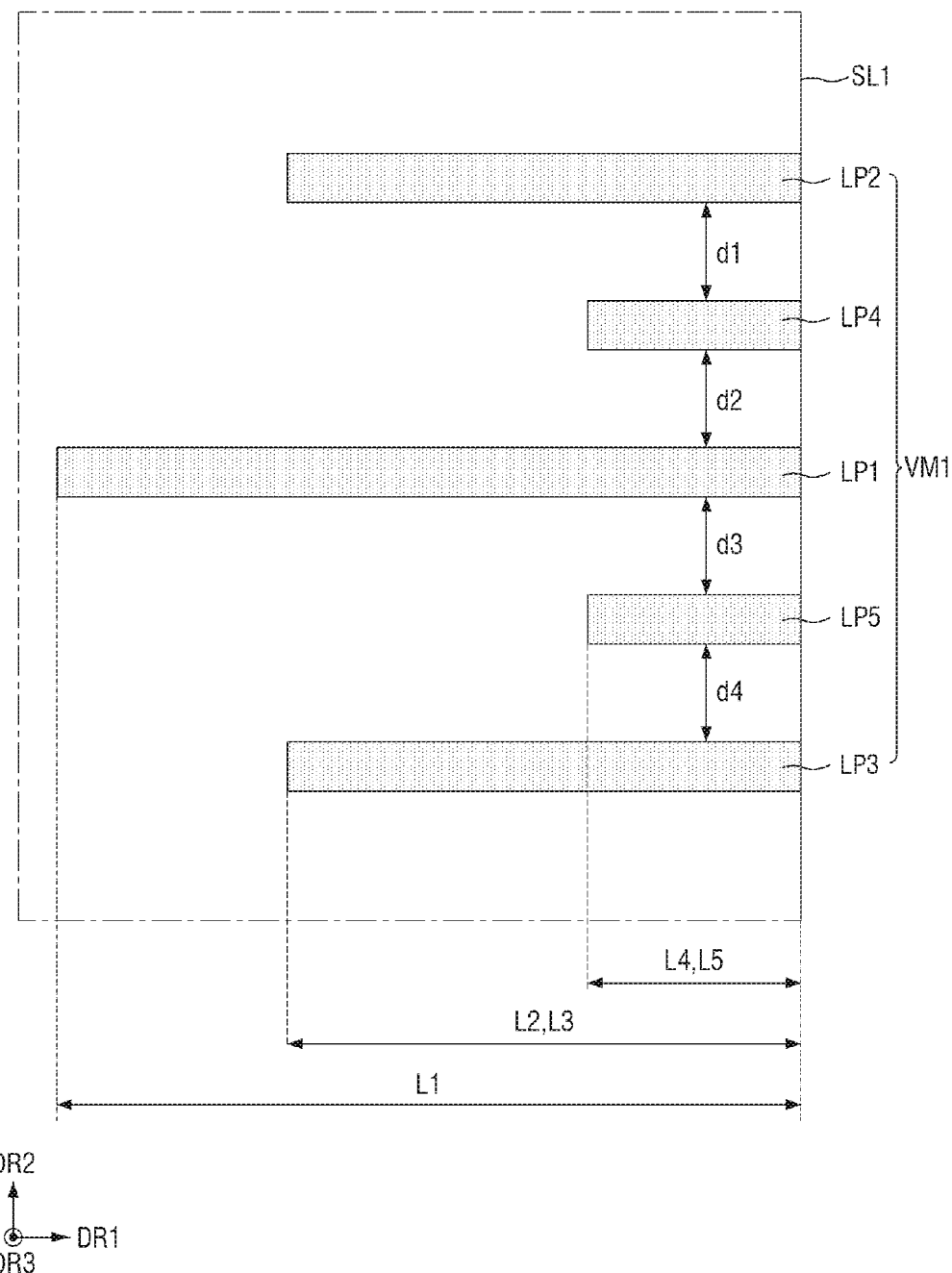
FIG. 11 is an enlarged cross-sectional view of a first vernier mark according to an embodiment of the present disclosure.

FIG. 11 is an enlarged cross-sectional view of a first vernier mark according to an embodiment of the present disclosure.

The planar shape of a first alignment vernier mark VM1 will hereinafter be described. The planar shape of the first alignment vernier mark VM1 may be applicable almost similarly to second, third, and fourth alignment vernier marks VM2, VM3, and VM4. Thus, a description of the planar shape of the third and fourth alignment vernier marks VM3 and VM4 may be replaced with the following description of the planar shape of the first alignment vernier mark VM1.

The first alignment vernier mark VM1 may include a plurality of line patterns LP. The line patterns LP may be spaced apart from one another in the second direction DR2, which is the direction in which a first side SL1 of a display device 10 extends.

In one example, the line patterns LP may include first, second, third, fourth, and fifth line patterns LP1, LP2, LP3, LP4, and LP5. The first, second, third, fourth, and fifth line patterns LP1, LP2, LP3, LP4, and LP5 may extend in one direction in a plan view. The direction in which the first, second, third, fourth, and fifth line patterns LP1, LP2, LP3, LP4, and LP5 extend may be substantially perpendicular to the direction in which the first side SL1 of the display device 10 that adjoins the first, second, third, fourth, and fifth line patterns LP1, LP2, LP3, LP4, and LP5 extends. For example, the first, second, third, fourth, and fifth line patterns LP1, LP2, LP3, LP4, and LP5 of the first alignment vernier mark VM1 that adjoin the first side SL1 extending in the second direction DR2 may extend in the first direction DR1 and may be spaced apart from one another in the second direction DR2.

The first line pattern LP1 may be a reference pattern for determining whether the display device 10 is aligned with a neighboring display device 10 in the first direction DR1. The second line pattern LP2 may be spaced apart from the first line pattern LP1, above the first line pattern LP1. The third line pattern LP3 may be spaced apart from the first line pattern LP1, below the first line pattern LP1. The fourth line pattern LP4 may be spaced apart from the first and second line patterns LP1 and LP2, between from the first and second line patterns LP1 and LP2. The fifth line pattern LP5 may be spaced apart from the first and third line patterns LP1 and LP3, between from the first and third line patterns LP1 and LP3.

The distance, in the second direction DR2, between the line patterns LP may be uniform. The distance between the line patterns LP may refer to the distance between the opposing sides of two adjacent line patterns LP. For example, a first distance d1 between the second and fourth line patterns LP2 and LP4, a second distance d2 between the first and fourth line patterns LP1 and LP4, a third distance d3 between the first and fifth line patterns LP1 and LP5, and a fourth distance d4 between the third and fifth line patterns LP3 and LP5 may all be the same as each other. As the first, second, third, and fourth distances d1, d2, d3, and d4 are all the same as each other, the degree of alignment or misalignment of the display device 10 may be determined and measured without a requirement of separate measurement equipment because the line patterns LP serve as a graduated ruler. In some embodiments, the first to fourth distances d1, d2, d3, and d4 may be smaller than a distance between two adjacent display devices (e.g., two display devices 10_1 and 10_2 or two display devices 10_1 and 10_4 in FIG. 12).

A length L1, in the first direction DR1, of the first line pattern LP1, which is a reference pattern for determining the degree of alignment of the display device 10 with the neighboring display device 10 in the first direction DR1, may be greater than lengths L2, L3, L4, and L5, in the first direction DR1, of the second, third, fourth, and fifth line patterns LP2, LP3, LP4, and LP5. The second and third lengths L2 and L3 of the second and third line patterns LP2 and LP3 may be the same as each other and smaller than the first length L1 of the first line pattern LP1. The fourth and fifth lengths L4 and L5 of the fourth and fifth line patterns LP4 and LP5 may be the same as each other and smaller than the second and third lengths L2 and L3 of the second and third line patterns LP2 and LP3. By varying the length of the line patterns LP, a reference line pattern may be identified with the naked eye.

The degree of misalignment of the display device 10 in a vertical or horizontal direction may be measured within the range of distances between the line patterns LP. In one example, in a case where the tolerance of the distance between the display device 10 and a neighboring display device 10 is 35 μm, the distance between the line patterns LP may be 35 μm or less. In an embodiment where the tolerance of the distance between the display device 10 and the neighboring display device 10 is 35 μm, the distance between the line patterns LP may be in the range of from 1 μm to 15 μm.

Figure 12:
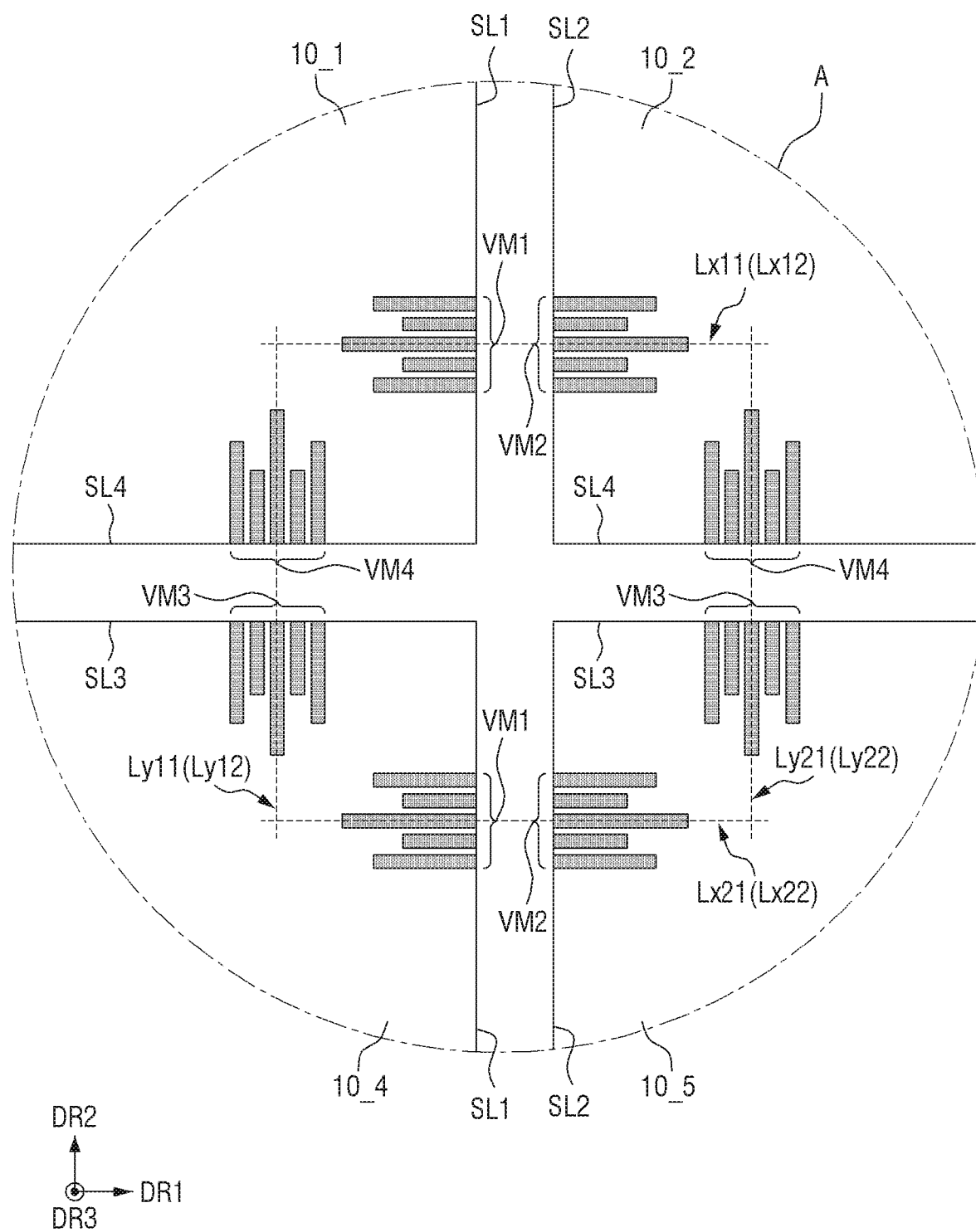
FIG. 12 is an enlarged plan view of an area A of FIG. 9.
Figure 13:
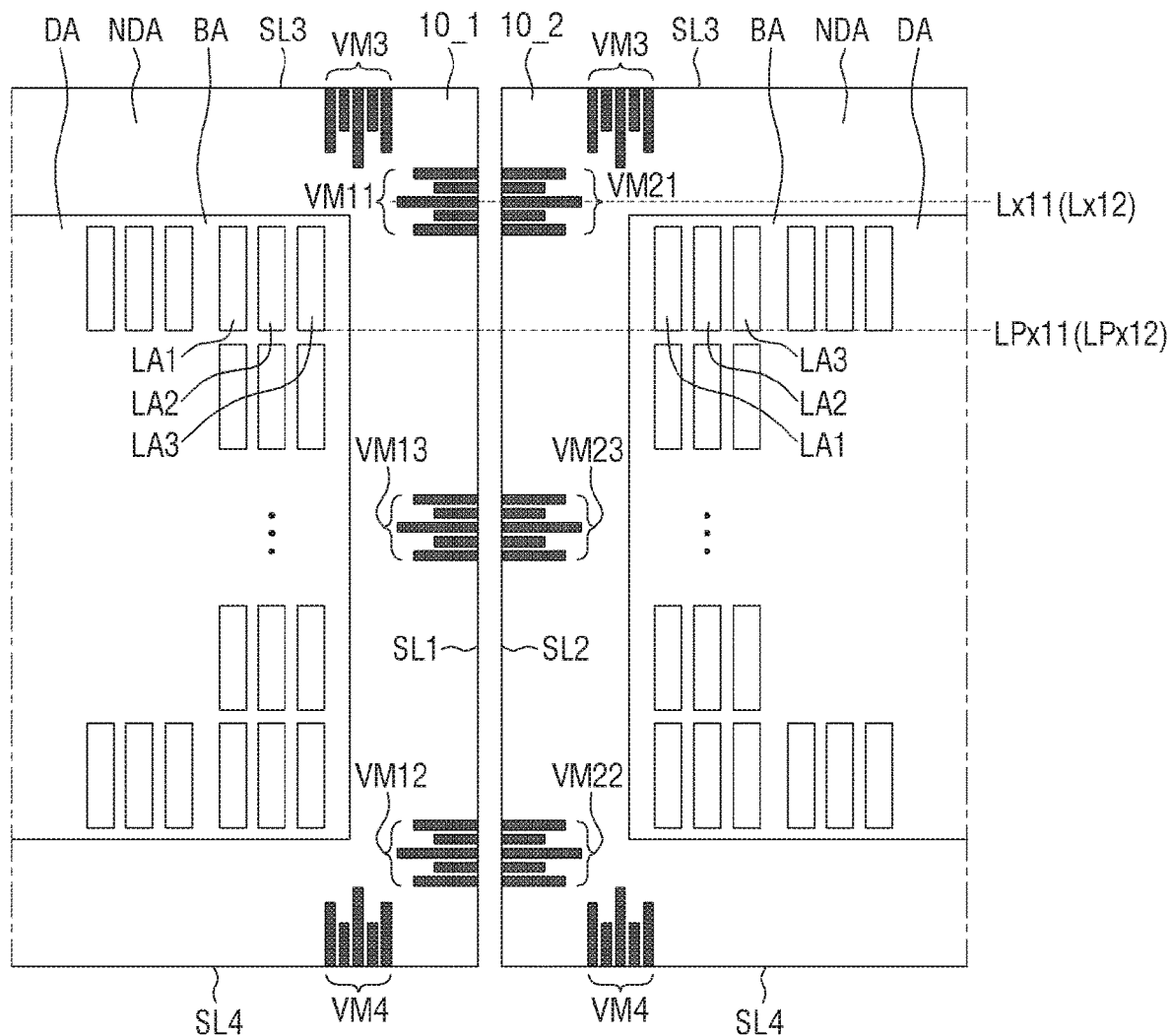
FIG. 13 is a plan view illustrating the layout of first and second display devices according to an embodiment of the present disclosure.

FIG. 12 is an enlarged plan view of an area A of FIG. 9. FIG. 13 is a plan view illustrating the layout of first and second display devices 10_1 and 10_2 according to an embodiment of the present disclosure.

The alignment of alignment vernier marks VM between a pair of adjacent display devices 10 in the first direction DR1 or between a pair of adjacent display devices 10 in the second direction DR2 will be hereinafter described.

Referring to FIGS. 9 and 12, a first side SL1 of the first display device 10_1 and a second side SL2 of the second display device 10_2 may be spaced apart from, and face, each other in the first direction DR1. A first alignment vernier mark VM1 that adjoins the first side SL1 of the first display device 10_1 and a second alignment vernier mark VM2 that adjoins the second side SL2 of the second display device 10_2 may be aligned in parallel to each other. For example, a first reference line Lx11 that passes through the center of a reference vernier mark of the first alignment vernier mark VM1 of the first display device 10_1 may coincide with a second reference line Lx12 that passes through the center of a reference vernier mark of the second alignment vernier mark VM2 of the second display device 10_2.

A fourth side SL4 of the first display device 10_1 and a third side SL3 of the fourth display device 10_4 may be spaced apart from, and face, each other in the second direction DR2. A fourth alignment vernier mark VM4 that adjoins the fourth side SL4 of the first display device 10_1 and a third alignment vernier mark VM3 that adjoins the third side SL3 of the fourth display device 10_4 may be aligned in parallel to each other. For example, a third reference line Ly11 that passes through the center of a reference vernier mark of the fourth alignment vernier mark VM4 of the first display device 10_1 may coincide with a fourth reference line Ly12 that passes through the center of a reference vernier mark of the third alignment vernier mark VM3 of the fourth display device 10_4.

A first side SL1 of the fourth display device 10_4 and a second side SL2 of the fifth display device 10_5 may be spaced apart from, and face, each other in the first direction DR1. A first alignment vernier mark VM1 that adjoins the first side SL1 of the fourth display device 10_4 and a second alignment vernier mark VM2 that adjoins the second side SL2 of the fifth display device 10_5 may be aligned in parallel to each other. For example, a fifth reference line Lx21 that passes through the center of a reference vernier mark of the first alignment vernier mark VM1 of the fourth display device 10_4 may coincide with a sixth reference line Lx22 that passes through the center of a reference vernier mark of the second alignment vernier mark VM2 of the fifth display device 10_5.

A fourth side SL4 of the second display device 10_2 and a third side SL3 of the fifth display device 10_5 may be spaced apart from, and face, each other in the second direction DR2. A fourth alignment vernier mark VM4 that adjoins the fourth side SL4 of the second display device 10_2 and a third alignment vernier mark VM3 that adjoins the third side SL3 of the fifth display device 10_5 may be aligned in parallel to each other. For example, a seventh reference line Ly21 that passes through the center of a reference vernier mark of the fourth alignment vernier mark VM4 of the second display device 10_2 may coincide with an eighth reference line Ly22 that passes through the center of a reference vernier mark of the third alignment vernier mark VM3 of the fifth display device 10_5.

Referring to FIGS. 12 and 13, the degree of alignment of a plurality of light output areas LA included in a display device DA of one display device 10 with a plurality of light output areas LA included in a display area DA of a neighboring display device 10 may be determined based on the degree of alignment of alignment vernier marks VM of the display device 10 measured with alignment vernier marks VM of the neighboring display device 10. To determine the degree of alignment of the light output areas LA of each display device 10 using alignment vernier marks VM, the alignment vernier marks VM may include the same material as members that define or separate the light output areas LA of each display device 10. The alignment vernier marks VM may be formed in the same layer as first and second light blocking members BK1 and BK2 that are disposed along the boundaries of each subpixel SPX and define a light output area LA of each subpixel SPX. As the alignment vernier marks VM are disposed along the boundaries of each subpixel SPX and are formed in the same layer as the first and second light blocking members BK1 and BK2, the degree of alignment of the light output areas LA of each display device 10 may be improved.

If the light output areas LA of one display device 10 are out of alignment with the light output areas LA of a neighboring display device 10 in the first or second direction DR1 or DR2, the misalignment between the two display devices 10 may become visible to the user. The degree of alignment of the light output areas LA of each display device 10 of the tiled display device TD may be determined based on the alignment of alignment vernier marks VM.

For example, if the first alignment vernier mark VM1 of the first display device 10_1 and the second alignment vernier mark VM2 of the second display device 10_2 are aligned in parallel to each other so that the first and second reference lines Lx11 and LX12 coincide with each other, a determination may be made indirectly that an extension LPx11 of each of the lower sides of a plurality of light output areas LA arranged in a first row of the first display device 10_1 coincides with an extension LPx12 of each of the lower sides of a plurality of light output areas LA arranged in a first row of the second display device 10_2. Thus, since the degree of alignment of the light output areas LA of each display device 10 may be determined using alignment vernier marks VM, which are formed in the same layer as a second light blocking member BK2, the display reliability of the tiled display device TD may be improved.

Figure 14:
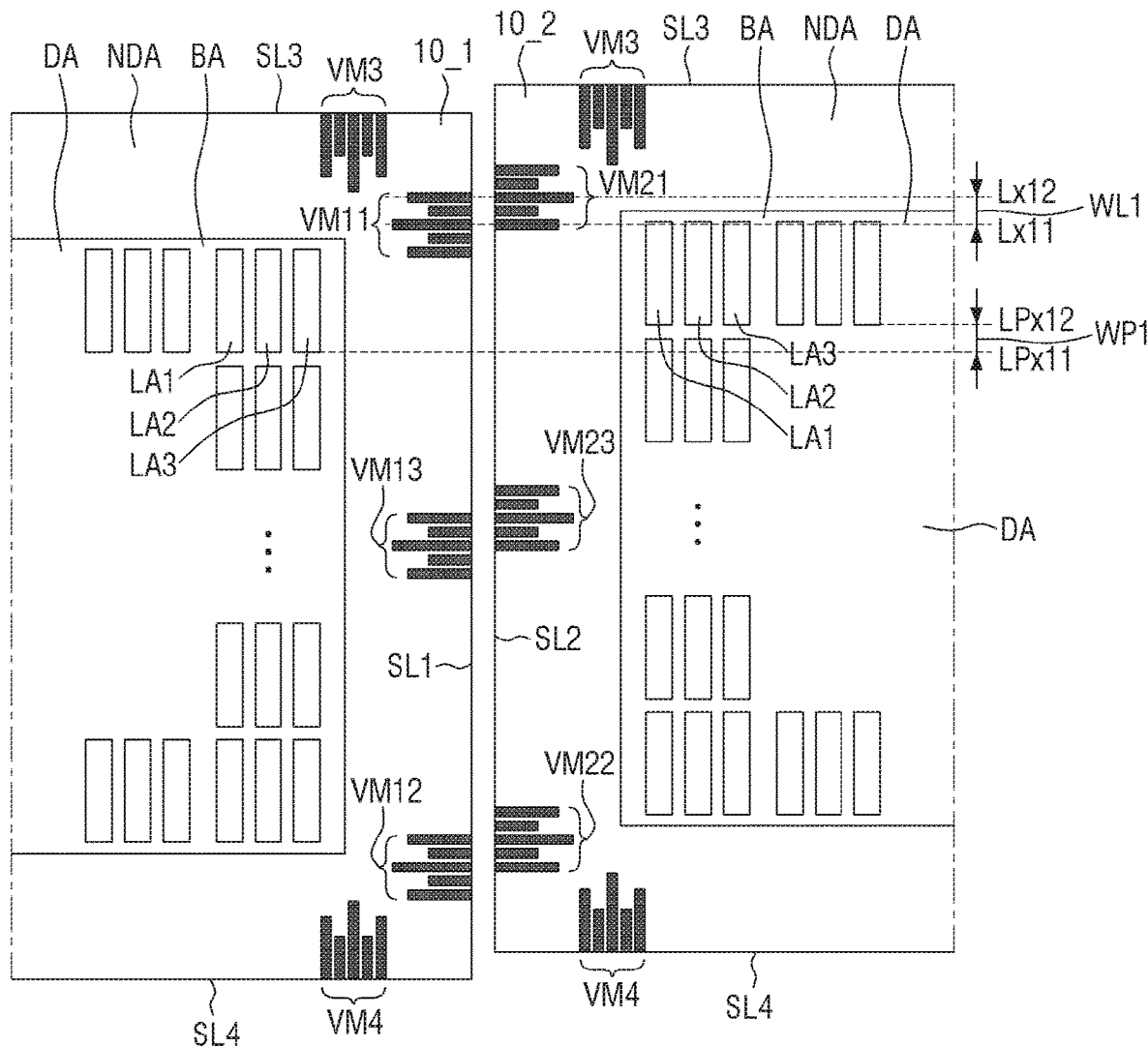
FIG. 14 is a plan view illustrating an example in which the first and second display devices are misaligned.
Figure 15:
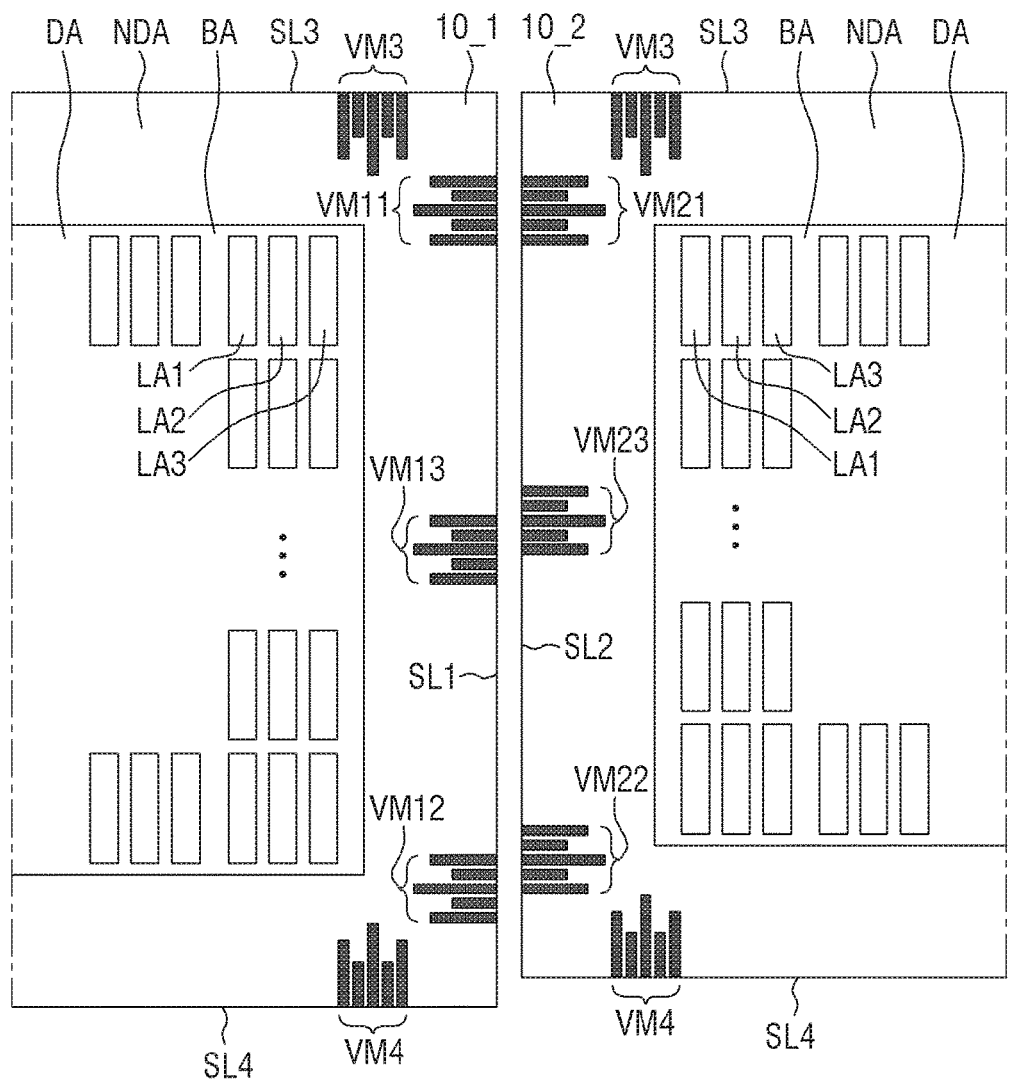
FIG. 15 is a plan view illustrating an example in which the first and second display devices are misaligned.

FIG. 14 is a plan view illustrating an example in which the first and second display devices 10_1 and 10_2 are misaligned with each other. FIG. 15 is a plan view illustrating an example in which the first and second display devices 10_1 and 10_2 are misaligned with each other.

FIGS. 14 and 15 are plan views illustrating examples in which the first and second display devices 10_1 and 10_2 are misaligned with each other.

Referring to FIG. 14, the first alignment vernier mark VM1 of the first display device 10_1 and the second alignment vernier marks VM2 of the second display device 10_2 are not aligned. As the first reference line Lx11 of the first alignment vernier mark VM1 of the first display device 10_1 is apart from the second reference line Lx12 of the second alignment vernier mark VM2 of the second display device 10_2 in the second direction DR2, a determination may be made that the first and second display devices 10_1 and 10_2 are misaligned with each other. As the first and second reference lines Lx11 and Lx12 are apart from each other by as much as two gradations on the first alignment vernier mark VM1 of the first display device 10_1 or on the second alignment vernier marks VM2 of the second display device 10_2, a distance WL1, in the second direction DR2, between the first and second reference lines Lx11 and Lx12 may be identified as being twice the distance between the line patterns LP of the first alignment vernier mark VM1 of the first display device 10_1 or between the line patterns LP of the second alignment vernier marks VM2 of the second display device 10_2. Since the first and second reference lines Lx11 and Lx12 are misaligned, a determination may be made indirectly that the extension LPx11 of each of the lower sides of the light output areas LA arranged in the first row of the first display device 10_1 is misaligned with the extension LPx12 of each of the lower sides of the light output areas LA arranged in the first row of the second display device 10_2. A degree WP1 of misalignment between the extensions LPx11 and LPx12 may be determined to be the same as a degree of misalignment as measured using the alignment vernier marks VM, i.e., the distance WL1, in the second direction DR2, between the first and second reference lines Lx11 and Lx12.

Referring to FIG. 15, the first sub-vernier mark VM11 of the first alignment vernier mark VM1 of the first display device 10_1 and the second sub-vernier mark VM21 of the second alignment vernier mark VM2 of the second display device 10_2 are aligned with each other, but the second and third sub-vernier marks VM12 and VM13 of the first alignment vernier mark VM1 of the first display device 10_1 are not aligned with the second and third sub-vernier marks VM22 and 23 of the second alignment vernier mark VM2 of the second display device 10_2. In this case, the alignment between the first and second display devices 10_1 and 10_2 may be improved by further providing a third sub-vernier mark VM13 between corners of the first display device 10_1 and a third sub-vernier mark VM23 between corners of the second display device 10_2.

FIGS. 16 through 23 are side views or plan views illustrating how to fabricate a tiled display device according to an embodiment of the present disclosure.

Figure 16:
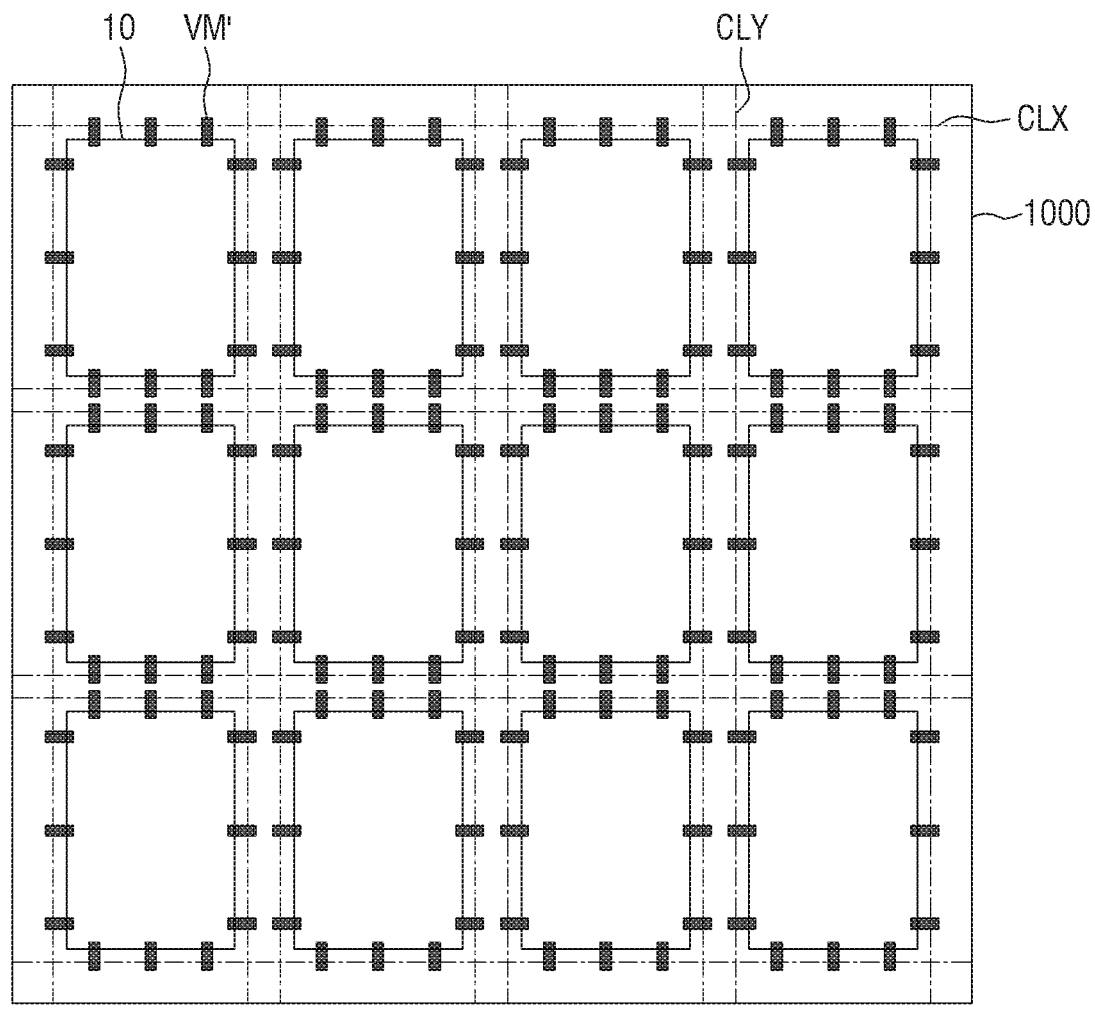
FIGS. 16 through 23 are side views or plan views illustrating how to fabricate a tiled display device according to an embodiment of the present disclosure.
Figure 17:
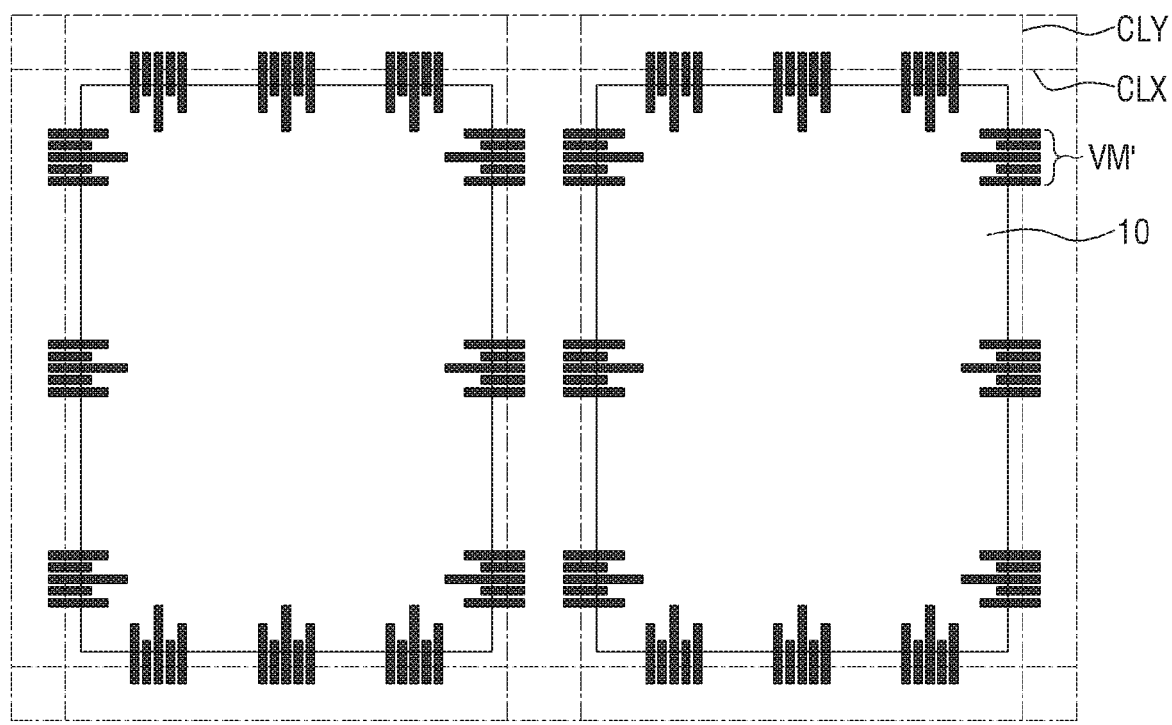

Referring to FIGS. 16 and 17, a mother substrate 1000 is prepared. Unit substrates of a plurality of display devices 10 may be formed on the mother substrate 1000, and each of the unit substrates may include a display area DA and a non-display area NDA. A light-emitting element layer may be formed in each of the unit substrates. The display devices 10 may be obtained by cutting the mother substrate 1000 into individual display devices along first cutting lines CLX, which extend in a first direction DR1, and second cutting lines CLY, which extend in a second direction DR2.

A plurality of initial alignment vernier marks VM' may be formed on each of the unit substrates. The initial alignment vernier marks VM' may extend to reach the first cutting lines CLX or the second cutting lines CLY and may be spaced apart from one another.

Figure 18:
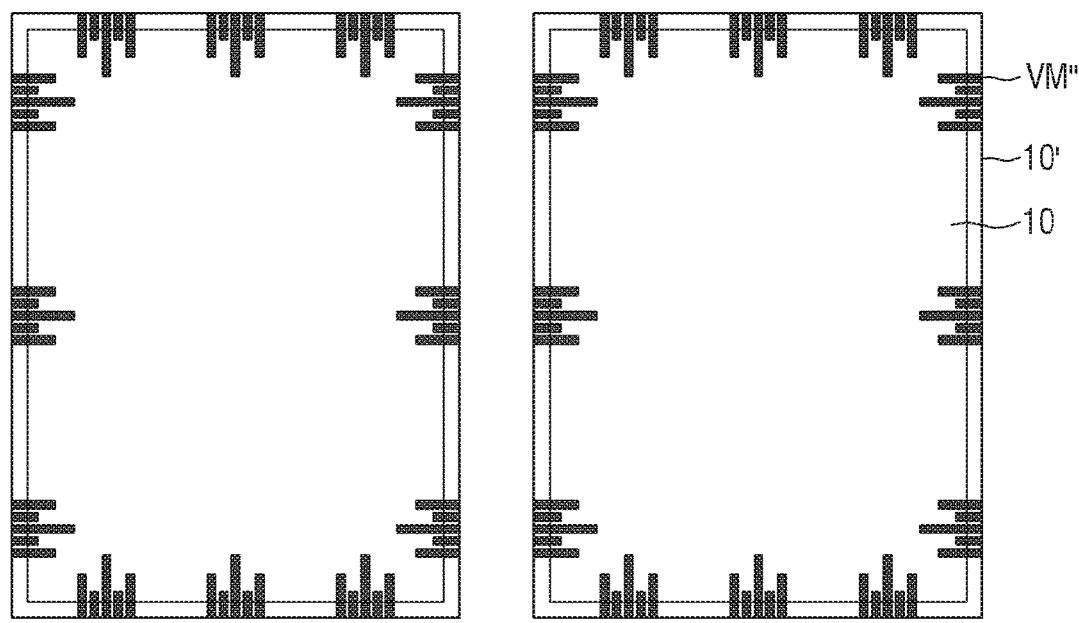

Thereafter, referring to FIG. 18, the mother substrate 1000 may be cut up along the first cutting lines CLX and the second cutting lines CLY. The first cutting lines CLX and the second cutting lines CLY may be formed to define regions that are larger than the display devices 10.

Figure 19:
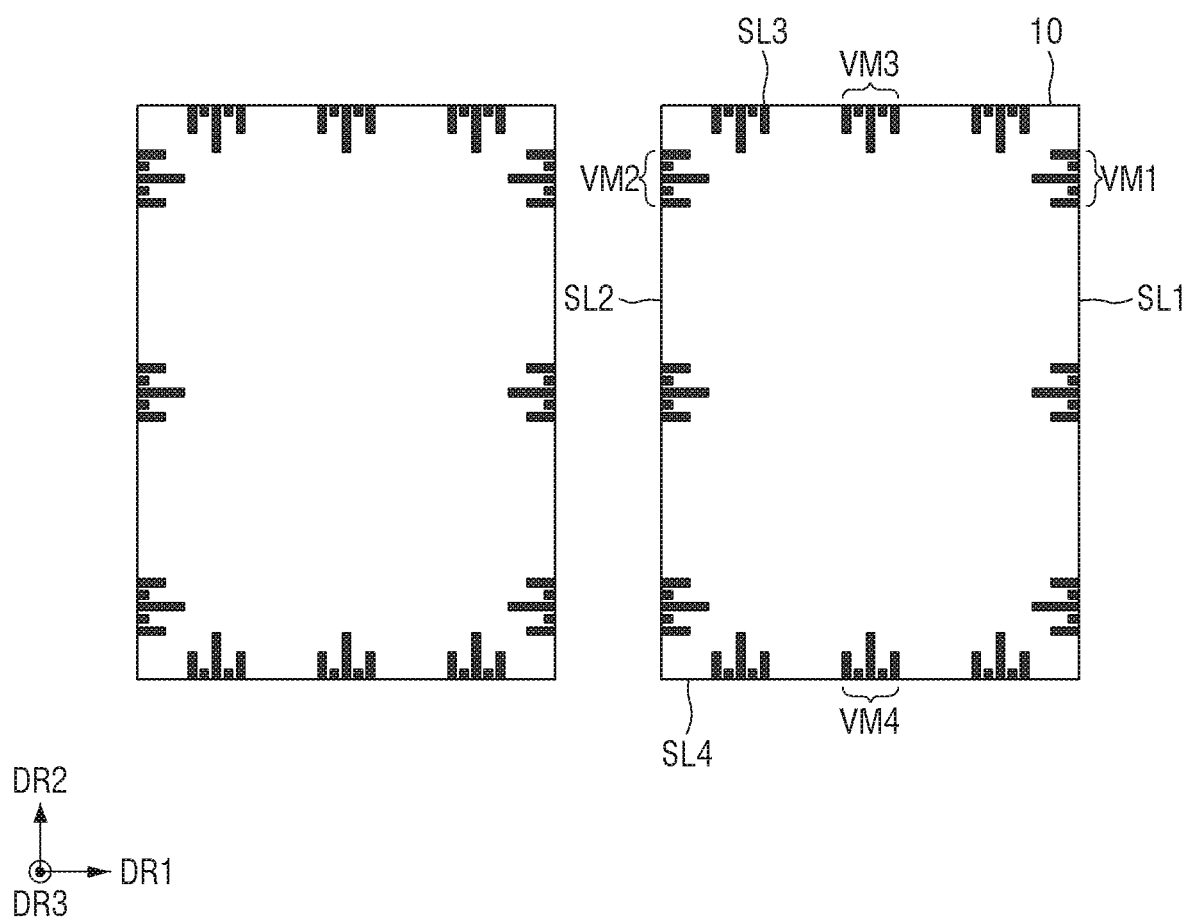

Thereafter, referring to FIG. 19, cut surfaces of the mother substrate 1000 may be polished along the first cutting lines CLX and the second cutting lines CLY and may thus form first, second, third, and fourth sides SL1, SL2, SL3, and SL4 of each of the display devices 10. As a result, display devices 10 of FIG. 19 may be obtained.

Figure 20:
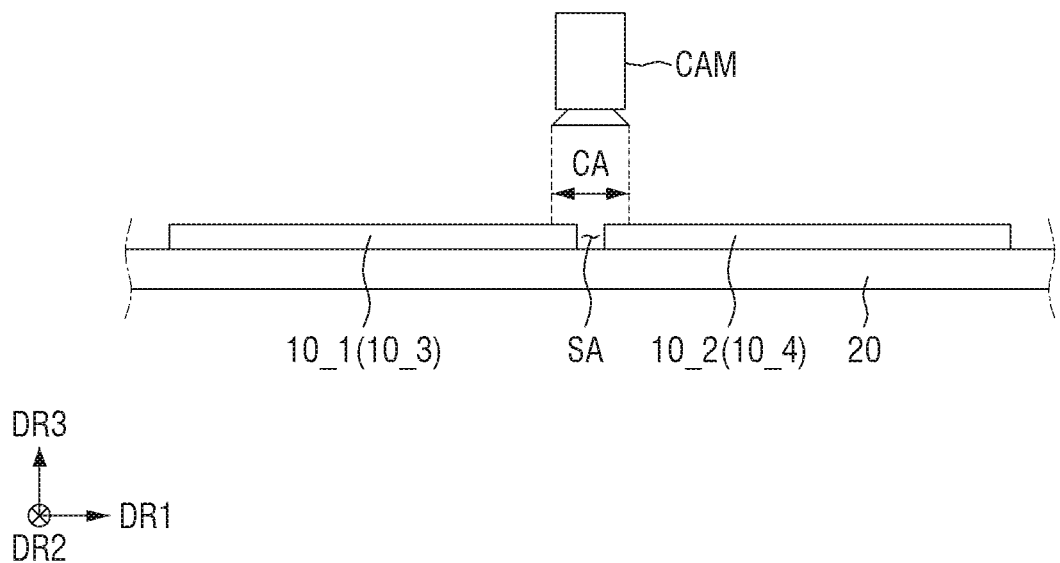
Figure 21:
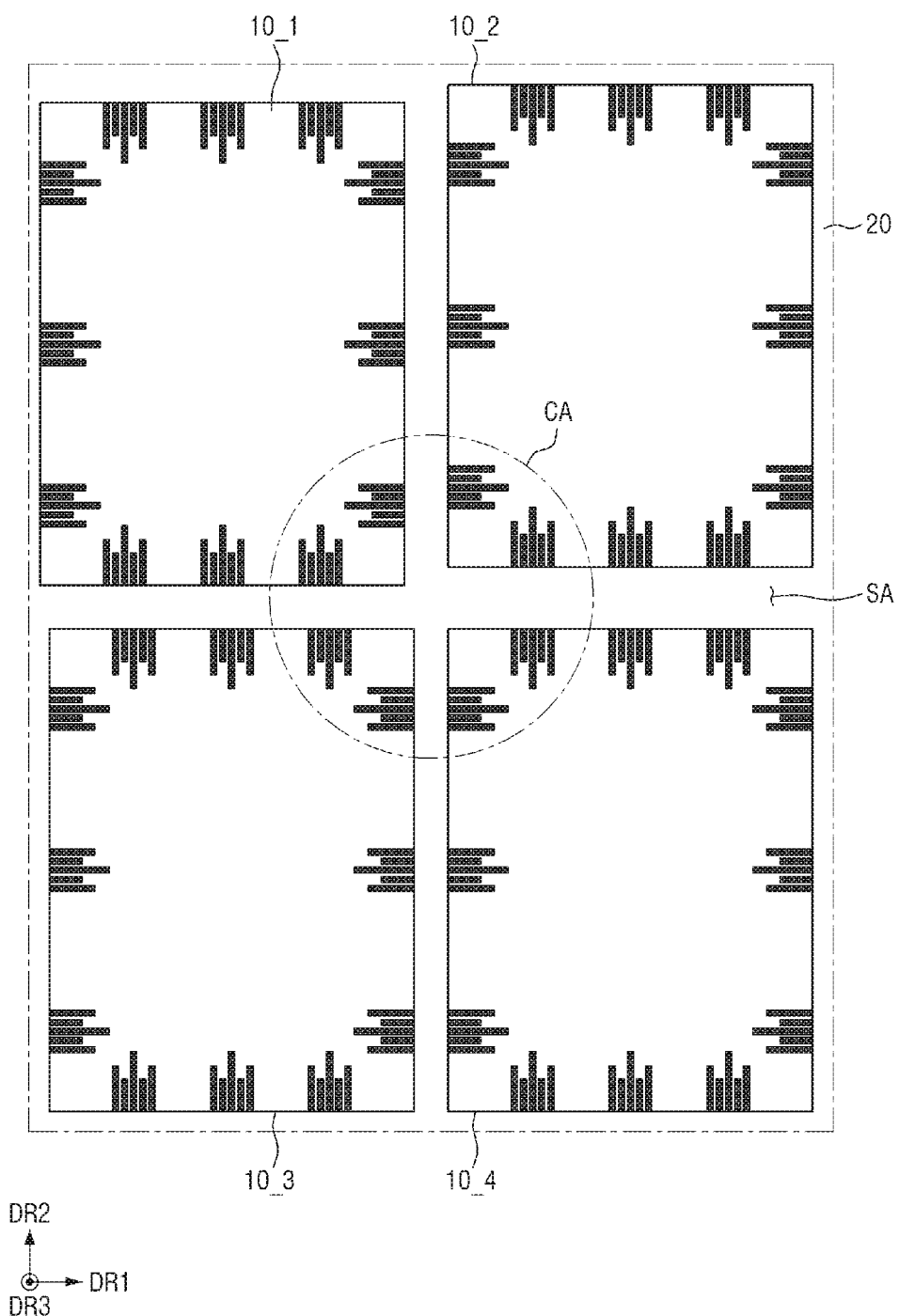

Thereafter, referring to FIGS. 20 and 21, a plurality of first, second, third, and fourth display devices 10_1, 10_2, 10_3, and 10_4 may be arranged on a lower plate 20, and an image of a region where corners of the first, second, third, and fourth display devices 10_1, 10_2, 10_3, and 10_4 adjoin may be captured using a camera CAM.

For example, the first, second, third, and fourth display devices 10_1, 10_2, 10_3, and 10_4 may be aligned primarily on the lower plate 20. The first, second, third, and fourth display devices 10_1, 10_2, 10_3, and 10_4 may be aligned primarily in regions where they are supposed to be, via coupling members disposed between the lower plate 20 and the first, second, third, and fourth display devices 10_1, 10_2, 10_3, and 10_4.

Once the first, second, third, and fourth display devices 10_1, 10_2, 10_3, and 10_4 are aligned primarily, the first, second, third, and fourth display devices 10_1, 10_2, 10_3, and 10_4 may be aligned secondarily, as illustrated in FIG. 21, while capturing images of regions where alignment vernier marks VM of each of the first, second, third, and fourth display devices 10_1, 10_2, 10_3, and 10_4 are formed, from above the first, second, third, and fourth display devices 10_1, 10_2, 10_3, and 10_4, by using the camera CAM. In one example, an image of parts of the top surfaces of the first, second, third, and fourth display devices 10_1, 10_2, 10_3, and 10_4 that correspond to an image pickup area CA where corners of the first, second, third, and fourth display devices 10_1, 10_2, 10_3, and 10_4 adjoin one another may be captured.

Figure 22:
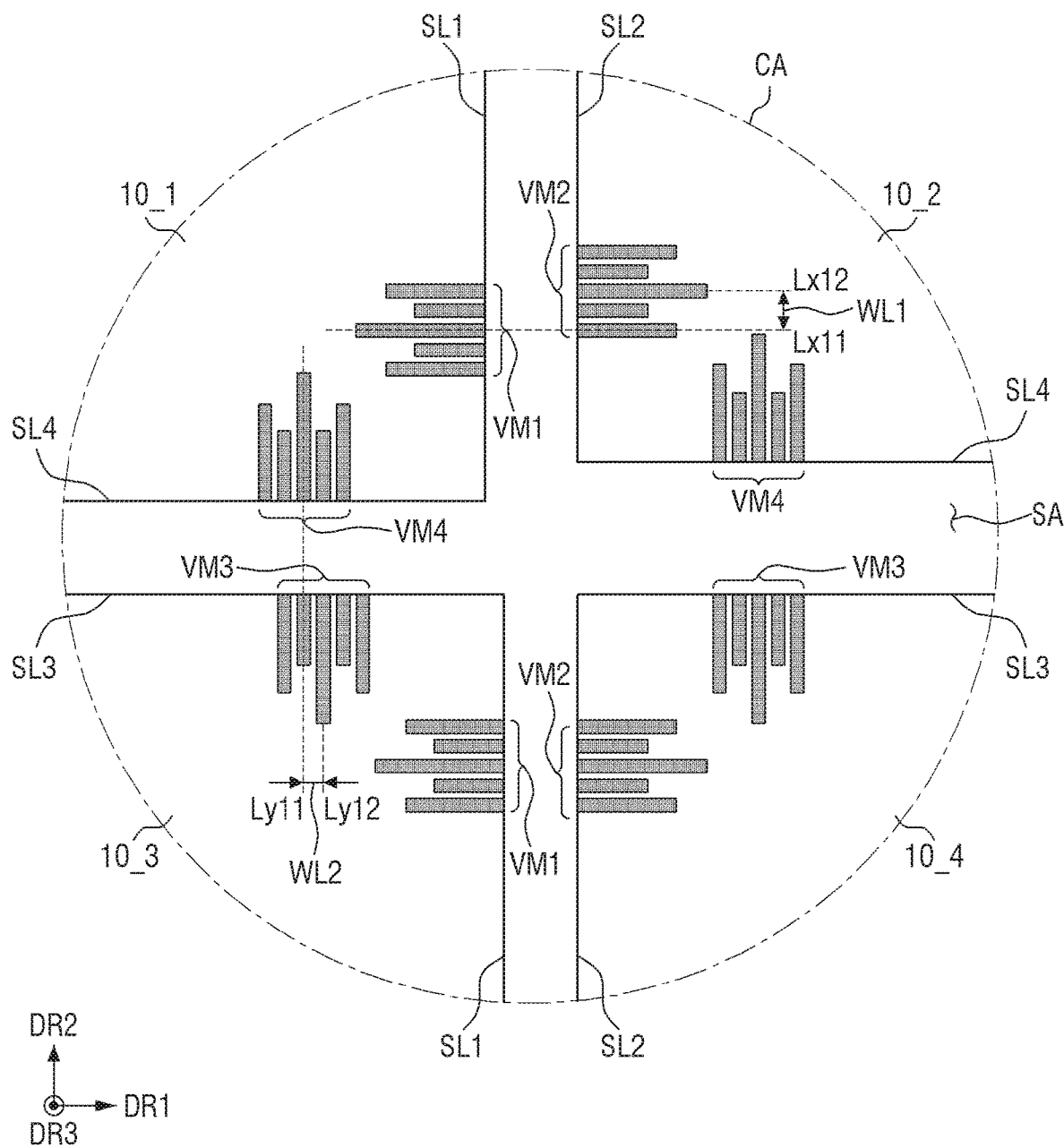
Figure 23:
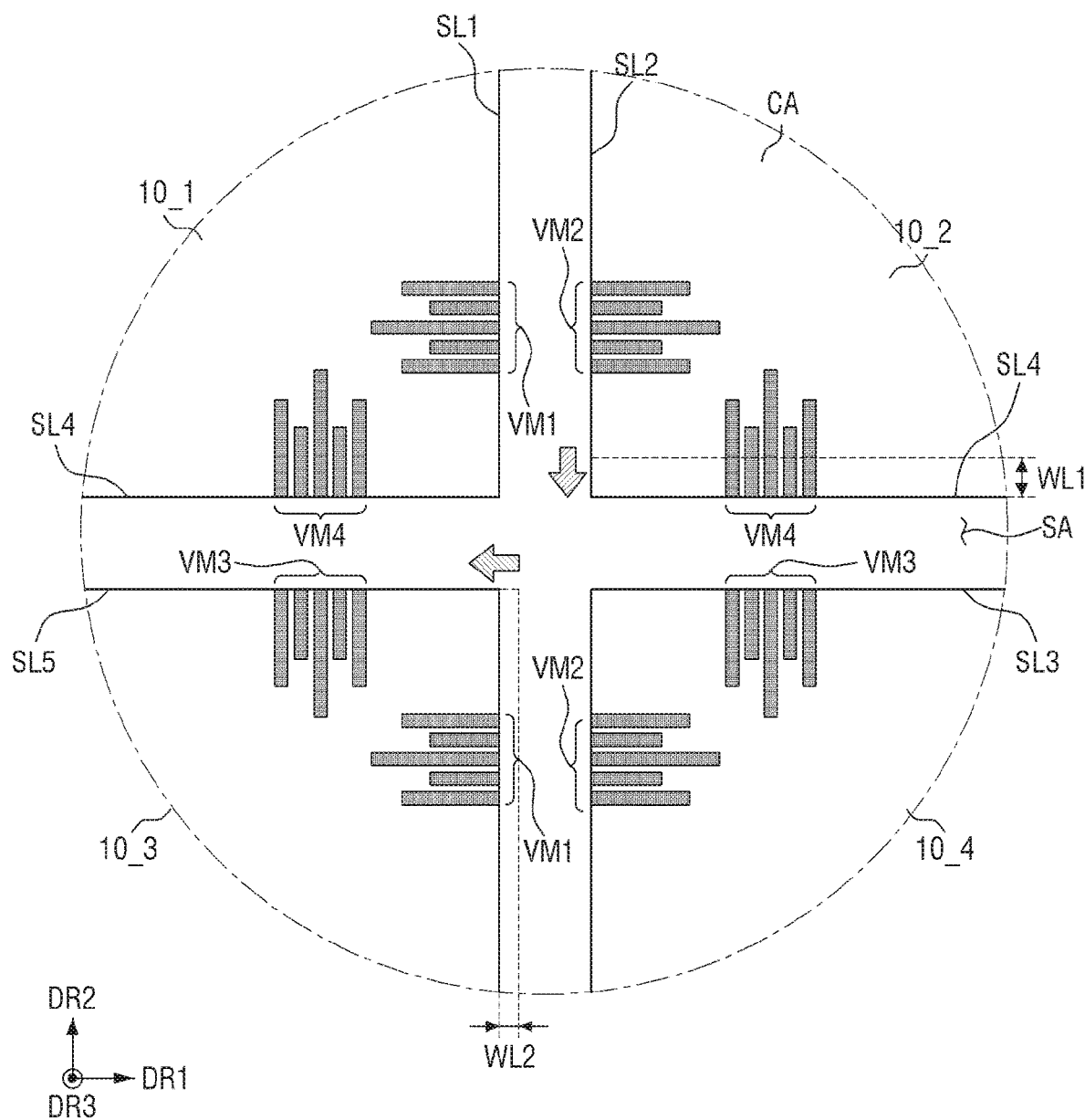

Thereafter, referring to FIG. 22, the degree of alignment of the first, second, third, and fourth display devices 10_1, 10_2, 10_3, and 10_4 may be determined based on image data obtained using the camera CAM. As described above, as a plurality of alignment vernier marks VM are formed of the same material, and in the same layer, as first light blocking members BK1 or second light blocking members BK2, the alignment vernier marks VM may appear as dark patterns in an image captured by the camera CAM. Thus, the degree of alignment of the first, second, third, and fourth display devices 10_1, 10_2, 10_3, and 10_4 may be determined by using the alignment vernier marks VM of each of the first, second, third, and fourth display devices 10_1, 10_2, 10_3, and 10_4. For example, as the first reference line Lx11 of the first alignment vernier mark VM1 of the first display device 10_1 is apart from the second reference line Lx12 of the second alignment vernier mark VM2 of the second display device 10_2 in the second direction DR2 at a first distance greater than a predetermined value, a determination may be made that the first and second display devices 10_1 and 10_2 are misaligned with each other. Also, as the first and second reference lines Lx11 and Lx12 are apart from each other by two gradations, for example, on the first alignment vernier mark VM1 of the first display device 10_1 or on the second alignment vernier marks VM2 of the second display device 10_2, a distance WL1, in the second direction DR2, between the first and second reference lines Lx11 and Lx12 may be identified as being twice the distance between the line patterns LP of the first alignment vernier mark VM1 of the first display device 10_1 or between the line patterns LP of the second alignment vernier marks VM2 of the second display device 10_2. Then, the alignment between the first and second display devices 10_1 and 10_2 may be adjusted by moving the second display device 10_2 in the second direction DR2 by the distance WL1, as illustrated in FIG. 23. For the sake of description, the misalignment of two gradations are shown on FIG. 22. The present invention is not limited thereto. In some embodiment, the distance WL1 may be one gradation or smaller than one gradation, which may be greater than a predetermined distance which is set for the determination of whether the alignment is acceptable.

Similarly, as the third reference line Ly11 of the fourth alignment vernier mark VM4 of the first display device 10_1 is apart from the fourth reference line Ly12 of the third alignment vernier mark VM3 of the third display device 10_3 in the first direction DR1, a determination may be made that the first and third display devices 10_1 and 10_3 are misaligned with each other. As the third and fourth reference lines Ly11 and Ly12 are apart from each other by one gradation on the fourth alignment vernier mark VM4 of the first display device 10_1 or on the third alignment vernier mark VM3 of the third display device 10_3, a distance WL2, in the first direction DR1, between the first and third reference lines Ly11 and Ly12 may be identified as being the same as the distance between the line patterns LP of the fourth alignment vernier mark VM4 of the first display device 10_1 or on the third alignment vernier mark VM3 or between the third alignment vernier mark VM3 of the third display device 10_3. Then, the alignment between the first and second display devices 10_1 and 10_2 may be adjusted by moving the third display device 10_3 in the first direction DR1 by the distance WL2, as illustrated in FIG. 23.

Descriptions of elements or features that have already been described above will be omitted or simplified, and tiled display devices according to some embodiments of the present disclosure will hereinafter be described, focusing mainly on the differences with the tiled display device TD of FIG. 9.

Figure 24:
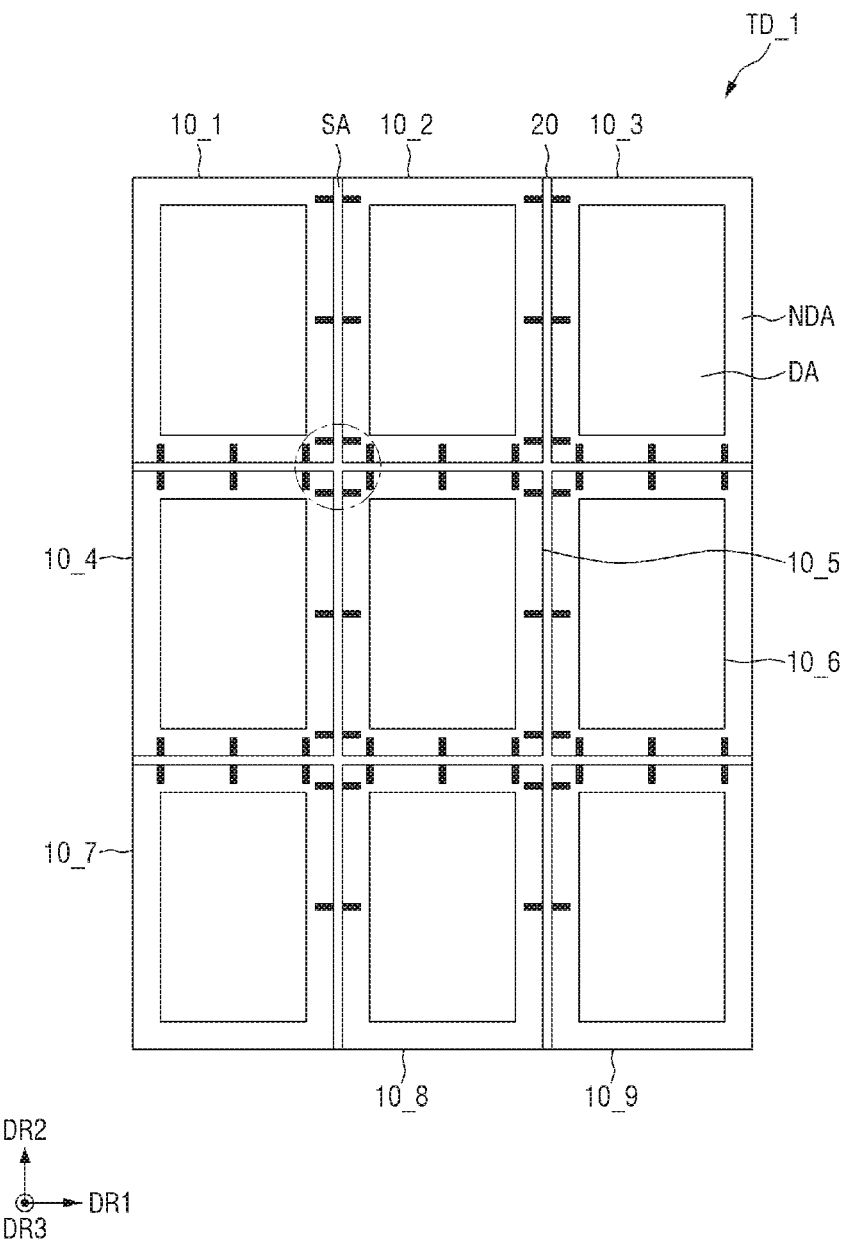
FIG. 24 is a plan view illustrating the layout of a tiled display device according to an embodiment of the present disclosure.
Figure 25:
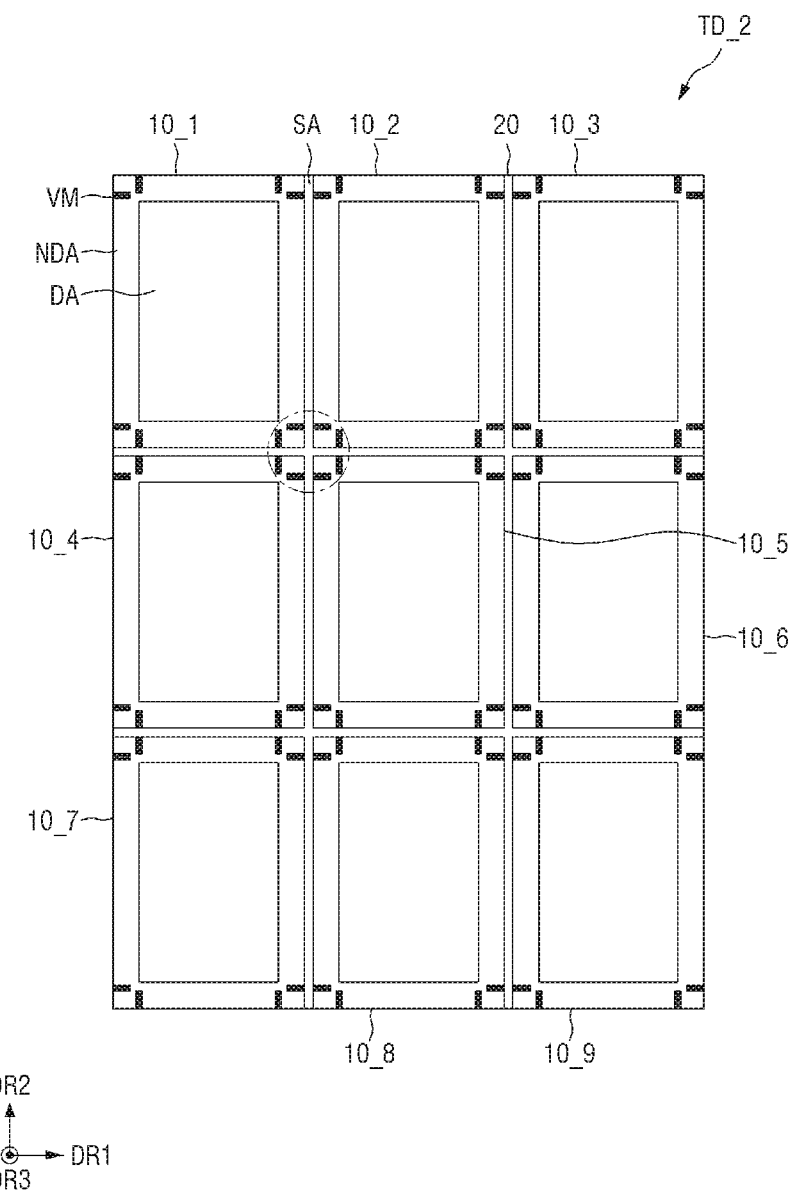
FIG. 25 is a plan view illustrating the layout of a tiled display device according to an embodiment of the present disclosure.

FIG. 24 is a plan view illustrating the layout of a tiled display device according to an embodiment of the present disclosure. FIG. 25 is a plan view illustrating the layout of a tiled display device according to an embodiment of the present disclosure.

FIGS. 24 and 25 illustrate various examples of the planar layout of a plurality of alignment vernier marks VM included in each of a plurality of display devices 10.

The embodiment of FIG. 24 differs from the embodiment of FIG. 9 in that a plurality of alignment vernier marks VM are formed along opposing sides of each pair of adjacent display devices 10 in a first direction DR1 or in a second direction DR2.

Referring to FIG. 24, no alignment vernier marks VM may be disposed on sides of each of a plurality of display devices 10 that form sides (e.g., an outer boundary) of a tiled display device TD_1. For example, alignment vernier marks VM may be disposed only on opposing sides of every two adjacent display devices 10. In one example, alignment vernier marks VM may be disposed on only two inner sides (i.e., one long side and one short side) of each of first, third, seventh, and ninth display devices 10_1, 10_3, 10_7, and 10_9, which are disposed at the corners of the tiled display device TD_1. In one example, alignment vernier marks VM may be disposed on only three inner sides (i.e., one long side and two short sides or two long sides and one short side) of each of second, fourth, sixth, and eighth display devices 10_2, 10_4, 10_6, and 10_8, which are disposed along the edges of the tiled display device TD_1 and form the sides of the tiled display device TD_1. In one example, alignment vernier marks VM may be disposed on all four sides of a fifth display device 10_5, which is disposed on the inside of the tiled display device TD_1.

Even though alignment vernier marks VM are formed only on sides of each of the display devices 10 of the tiled display device TD_1 that need to be aligned with one another, a determination may be made as to whether the display devices 10 are aligned with one another based on the measured degree of alignment of the alignment vernier marks VM that are formed only on sides of each of the display devices 10.

The embodiment of FIG. 25 differs from the embodiment of FIG. 9 in that a plurality of alignment vernier marks VM are formed only at corner parts of each of a plurality of display devices 10 of a tiled display device TD_2.

Referring to FIG. 25, each of the display devices 10 may have first, second, third, and fourth corner parts. Alignment vernier marks VM may be disposed at the first, second, third, and fourth corner parts to adjoin the sides of each of the display devices 10. Even though alignment vernier marks VM are disposed only at the corner parts of each of the display devices 10, a determination may be made as to whether, and the degree to which, the display devices 10 are aligned with one another in a first direction DR1 and/or in a second direction DR2.

Figure 26:
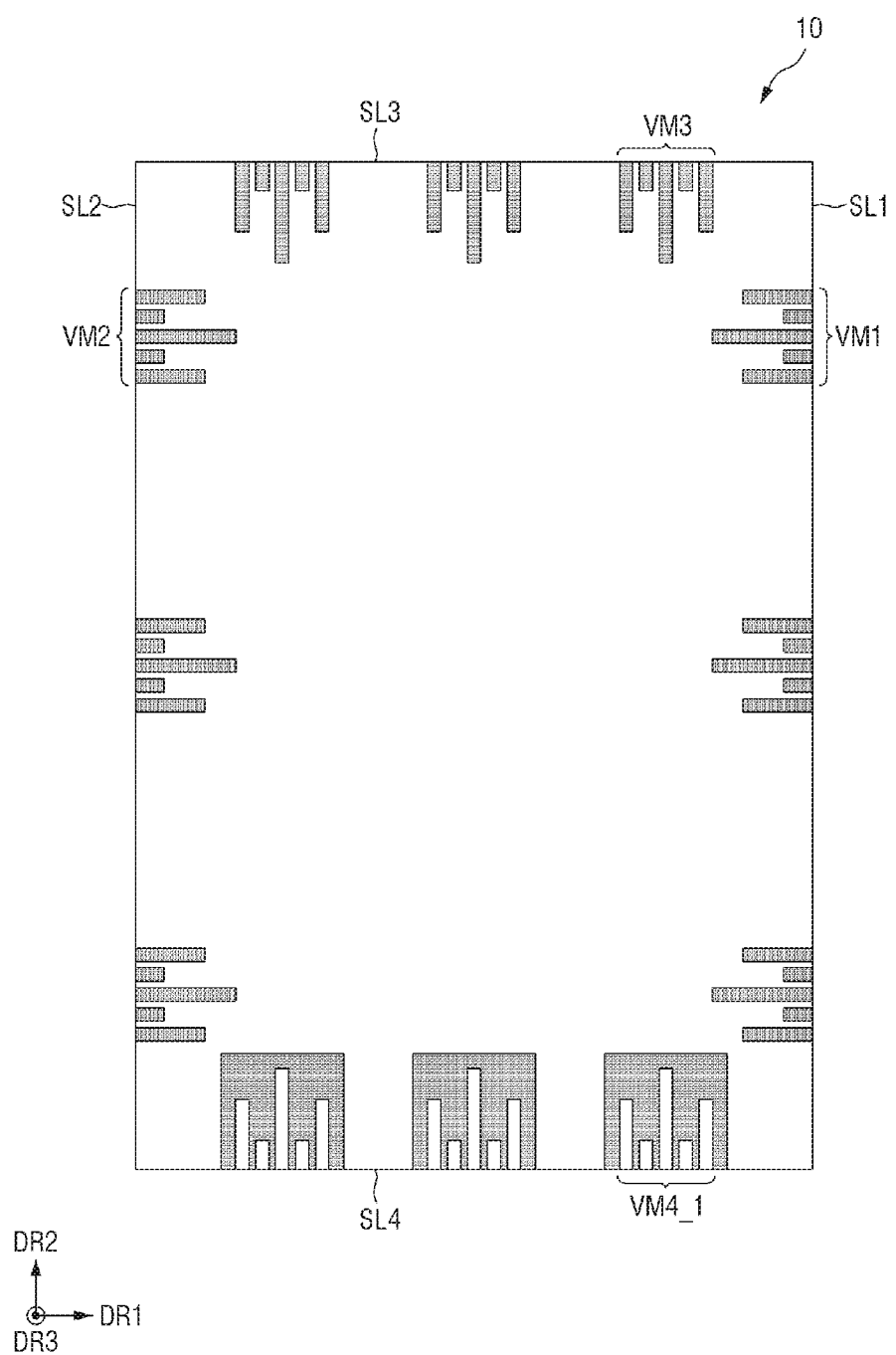
FIG. 26 is a plan view of a display device according to an embodiment of the present disclosure.
Figure 27:
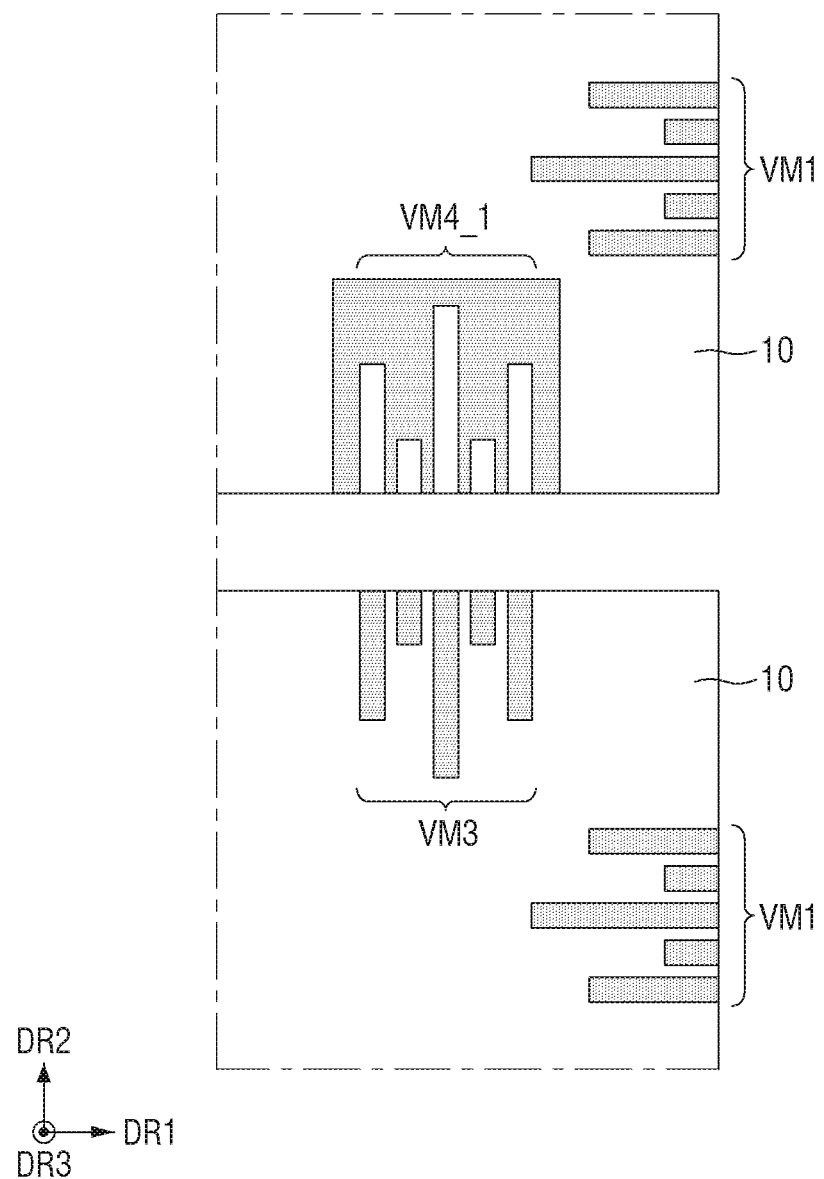
FIG. 27 is a plan view of part of a tiled display device including the display device of FIG. 26.

FIG. 26 is a plan view of a display device according to an embodiment of the present disclosure. FIG. 27 is a plan view of part of a tiled display device including the display device of FIG. 26.

The embodiment of FIGS. 26 and 27 differs from the embodiment of FIG. 10 in that third and fourth alignment vernier marks VM3 and VM4_1, which are formed on third and fourth sides SL3 and SL4 of each display device 10, have different shapes in a plan view.

Referring to FIGS. 26 and 27, third and fourth alignment vernier marks VM3 and VM4_1, which are disposed on the upper and lower sides, respectively, of each display device 10 in a plan view, may have different shapes in a plan view. The fourth alignment vernier mark VM4_1 may have a rectangular shape in a plan view and may consist of a plurality of engraved line patterns. The engraved line patterns may correspond to the third alignment vernier mark VM3. Thus, as illustrated in FIG. 27, two adjacent display devices 10 in a second direction DR2 may be aligned such that the line patterns of a fourth alignment vernier mark VM4_1 of the upper display device 10 may be aligned with the line patterns of a third alignment vernier mark VM3 of the lower display device 10.

In the embodiment of FIGS. 26 and 27, as third and fourth alignment vernier marks VM3 and VM4_1 of each display device 10 are formed to have different shapes in a plan view, display devices 10 may be prevented from being turned upside down during the arrangement and alignment of the display devices 10 on a lower plate 20. For example, such turned upside down may be identified using different shapes of the third and fourth alignment vernier marks VM3 and VM4_1 of each display device 10 in alignment of the display devices 10 on the lower plate 20.

Figure 28:
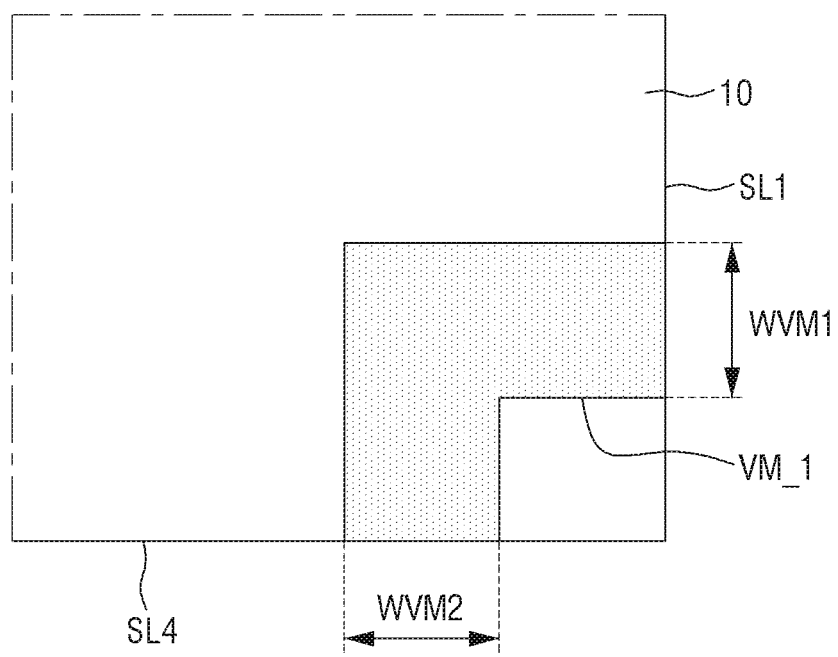
FIG. 28 is a partial plan view illustrating the shape of a vernier mark according to an embodiment of the present disclosure.
Figure 29:
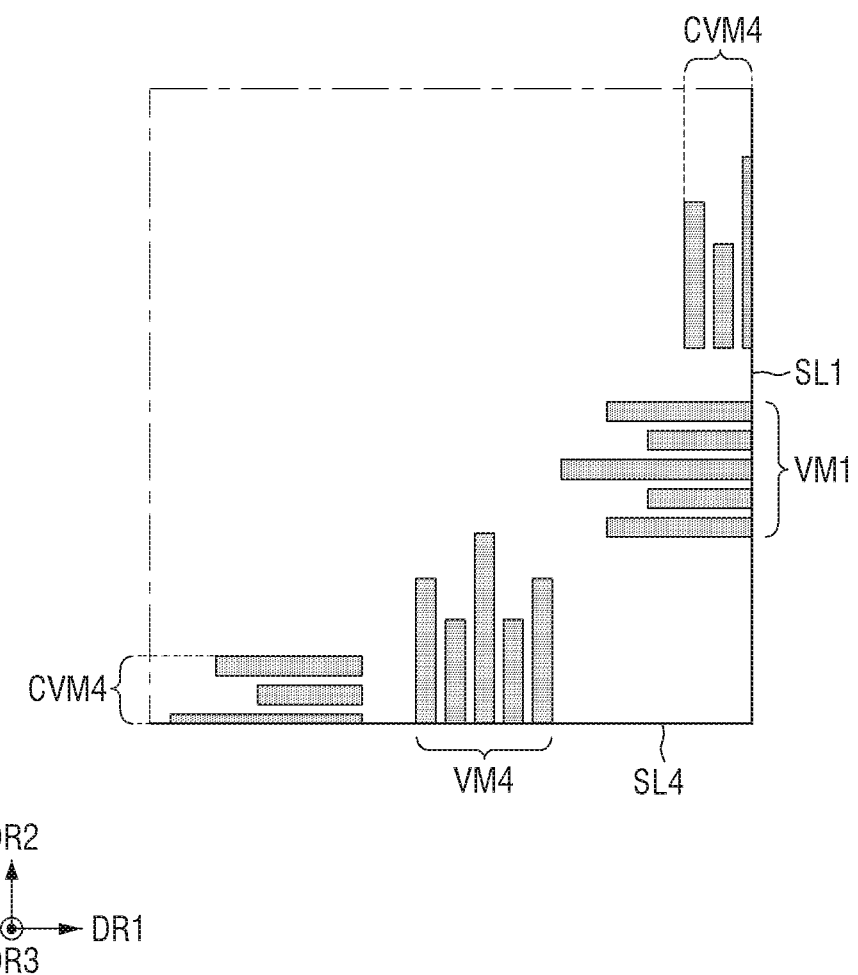
FIG. 29 is a partial plan view illustrating the shape of a vernier mark according to an embodiment of the present disclosure.
Figure 30:
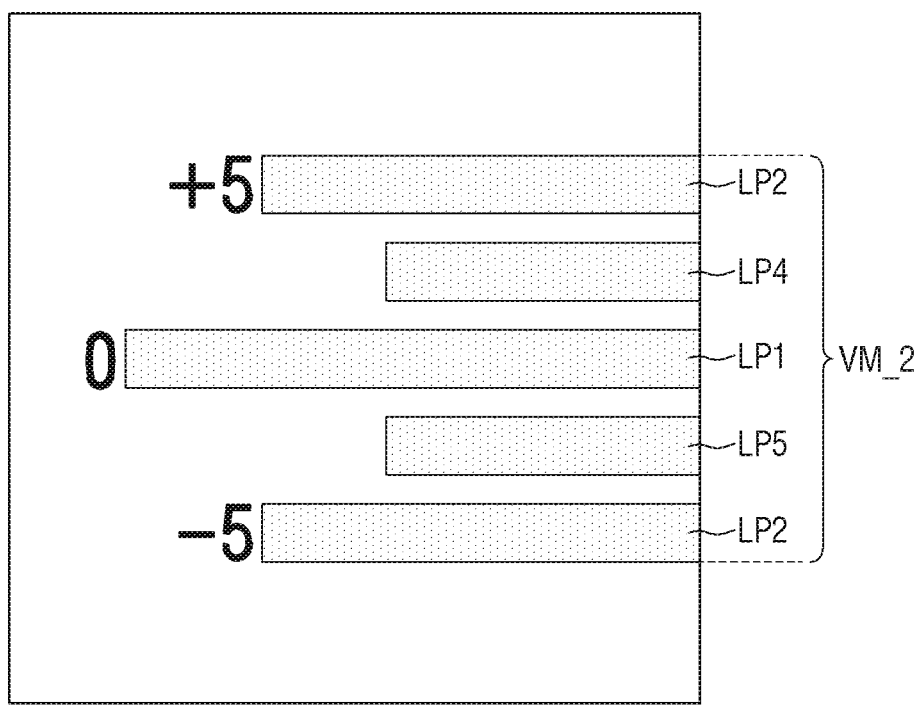
FIG. 30 is a partial plan view illustrating the shape of a vernier mark according to an embodiment of the present disclosure.

FIG. 28 is a partial plan view illustrating the shape of a vernier mark according to an embodiment of the present disclosure. FIG. 29 is a partial plan view illustrating the shape of a vernier mark according to an embodiment of the present disclosure. FIG. 30 is a partial plan view illustrating the shape of a vernier mark according to an embodiment of the present disclosure.

The embodiment of FIG. 28 differs from the previous embodiments in that a vernier mark VM_1 has predetermined widths in first and second directions DR1 and DR2, rather than including a plurality of line patterns. In a case where the tolerance of the distance between two adjacent display devices 10 is 35 µm, a width WVM2, in the first direction DR1, of the vernier mark VM_1 and a width WVM1, in the second direction DR2, of the vernier mark VM_1 may both be 35 µm or less. In one example, the widths WVM1 and WVM2 may both be 5 µm, but the present disclosure is not limited thereto.

The embodiment of FIG. 29 differs from the previous embodiments in that a display device 10 includes alignment vernier marks VM to be aligned with other display devices 10 in first and second directions DR1 and DR2 and further includes cutting vernier marks CVM for cutting.

Referring to FIG. 29, the cutting vernier marks CVM may include first and fourth cutting vernier marks CVM1 and CVM4, which adjoin first and fourth sides SL1 and SL4, respectively, of a display device 10.

The cutting vernier marks CVM may be vernier marks for identifying the cutting lines of the mother substrate 1000 and the amount by which the mother substrate 1000 is polished to be cut into each individual display device 10.

Each of the first and fourth cutting vernier marks CVM1 and CVM4 may include a plurality of line patterns. The line patterns of the first cutting vernier mark CVM1, which adjoins the first side SL1 of the display device 10 that extends in a second direction DR2, may extend in the second direction DR2. The line patterns of the fourth cutting vernier mark CVM4, which adjoin the fourth side SL4 of the display device 10 that extends in a first direction DR1, may extend in the first direction DR1. To obtain each individual display device 10 from the mother substrate 1000, the mother substrate 1000 may be cut up along cutting lines that are parallel to the sides of each individual display device 10. Thus, the cutting vernier marks CVM may be formed to be parallel to sides of each individual display device 10 that they adjoin.

Referring to FIG. 30, a vernier mark VM_2 may further include numbers. For example, numbers of "0", "+5", and "−5" may be written on first sides of first, second, and third line patterns LP1, LP2, and LP3. The first line pattern LP1 may be a reference line pattern for determining the degree of alignment, and the second and third line patterns LP2 and LP3 may be disposed above and below, respectively, the first line pattern LP1. The first sides of the first, second, and third line patterns LP1, LP2, and LP3 may be sides of the first, second, and third line patterns LP1, LP2, and LP3 that face the inside of a display device 10. As the vernier mark VM_2 further includes numbers on one side thereof, the degree of misalignment of the display device 10 may be identified using the numbers. Thus, the alignment of the display device 10 may be simplified, and the manufacturing cost of a tiled display device may be reduced.

Figure 31:
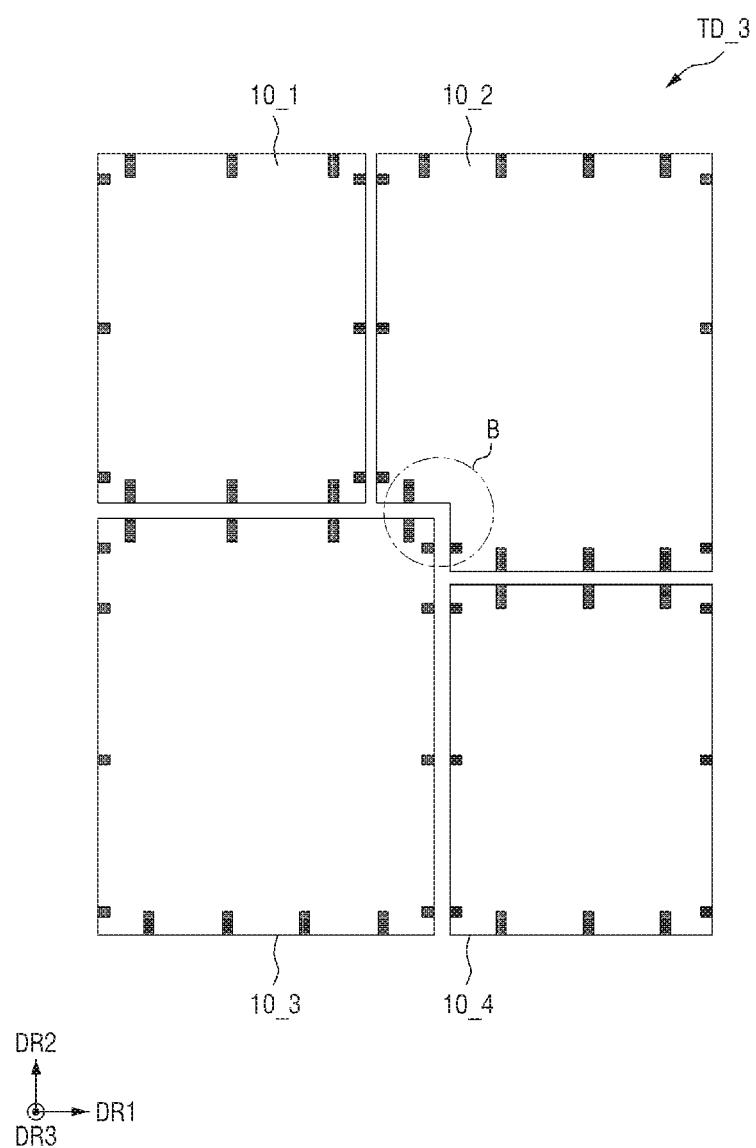
FIG. 31 is a plan view illustrating the layout of a tiled display device according to an embodiment of the present disclosure.
Figure 32:
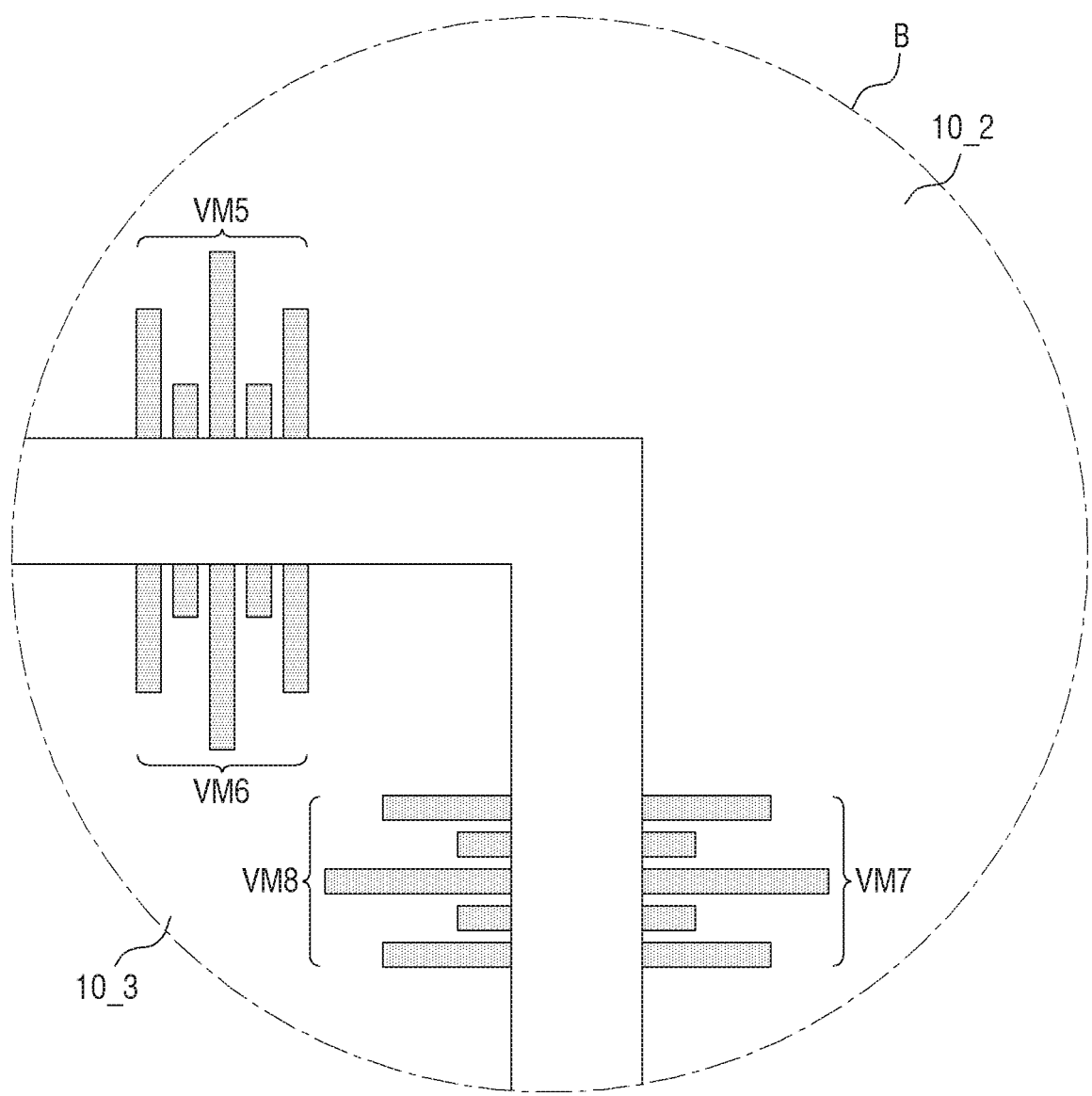
FIG. 32 is an enlarged plan view of an area B of FIG. 31.

FIG. 31 is a plan view illustrating the layout of a tiled display device according to an embodiment of the present disclosure. FIG. 32 is an enlarged plan view of an area B of FIG. 31.

The embodiment of FIGS. 31 and 32 differs from the previous embodiments in that a plurality of first, second, third, and fourth display devices 10_1, 10_2, 10_3, and 10_4 of a tiled display device TD_3 have different shapes and sizes.

Referring to FIG. 31, the first, second, third, and fourth display devices 10_1, 10_2, 10_3, and 10_4 may have different shapes and sizes. Some of the first, second, third, and fourth display devices 10_1, 10_2, 10_3, and 10_4 may have a hexagonal shape in a plan view. Particularly, the second display device 10_2 may have a hexagonal shape in a plan view, and alignment vernier marks VM may be formed at opposing corners of the second and third display devices 10_2 and 10_3 so that the degree of misalignment between the second and third display devices 10_2 and 10_3 may be determined.

In one example, as illustrated in FIG. 32, fifth through eighth alignment vernier marks VM5, VM6, VM7, and VM8 may be formed along two pairs of opposing sides of the second and third display devices 10_2 and 10_3 so that the second and third display devices 10_2 and 10_3 may be aligned. For example, the fifth and seventh alignment vernier marks VM5 and VM7, which are formed on sides of the second display device 10_2 that face the third display device 10_3, and the sixth and eighth alignment vernier marks VM6 and VM8, which are formed on sides of the third display device 10_3 that face the second display device 10_2, may be aligned in parallel. In this manner, display devices 10 of various shapes may be aligned.

Figure 33:
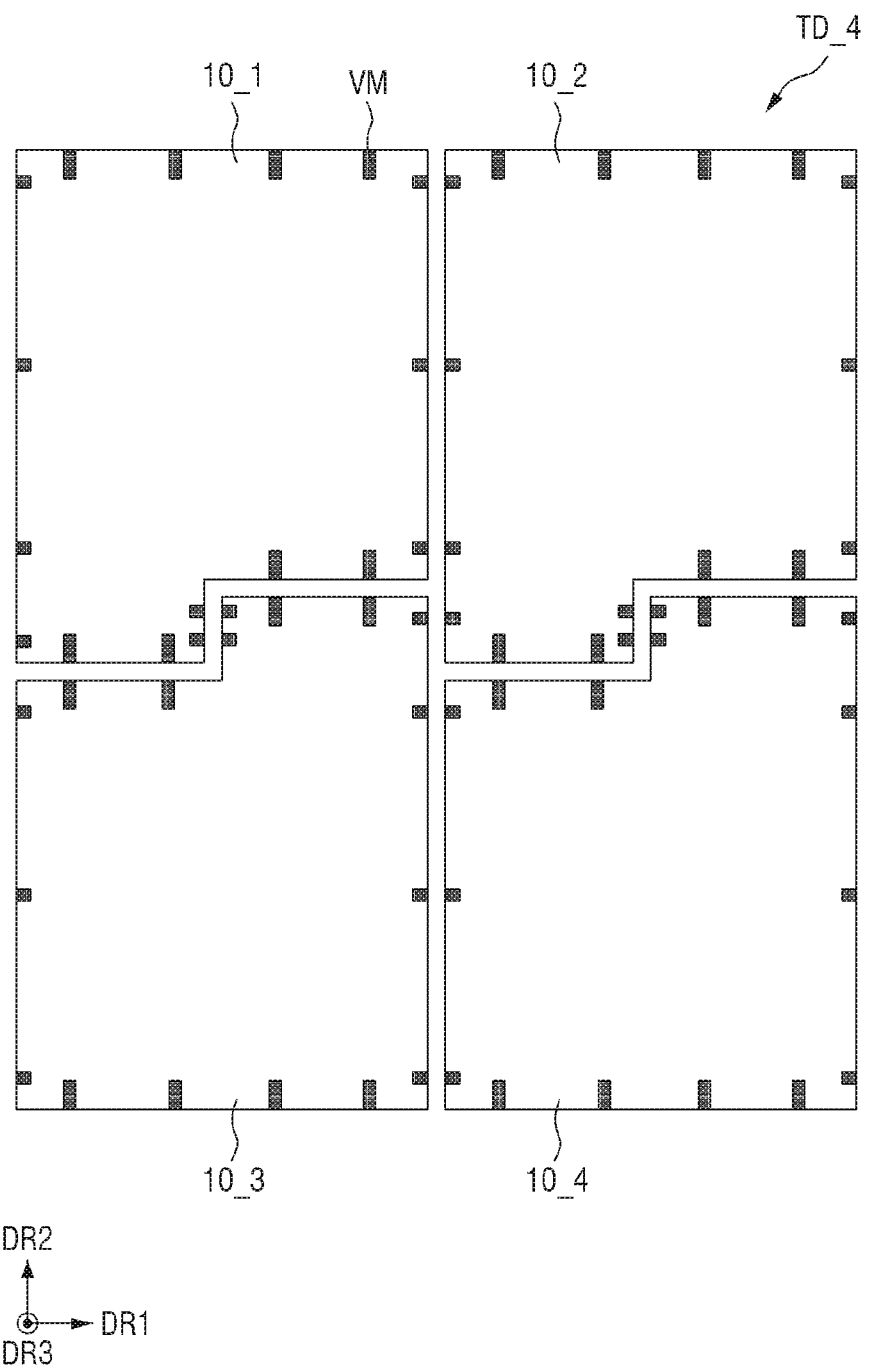
FIG. 33 is a plan view illustrating the layout of a tiled display device according to an embodiment of the present disclosure.
Figure 34:
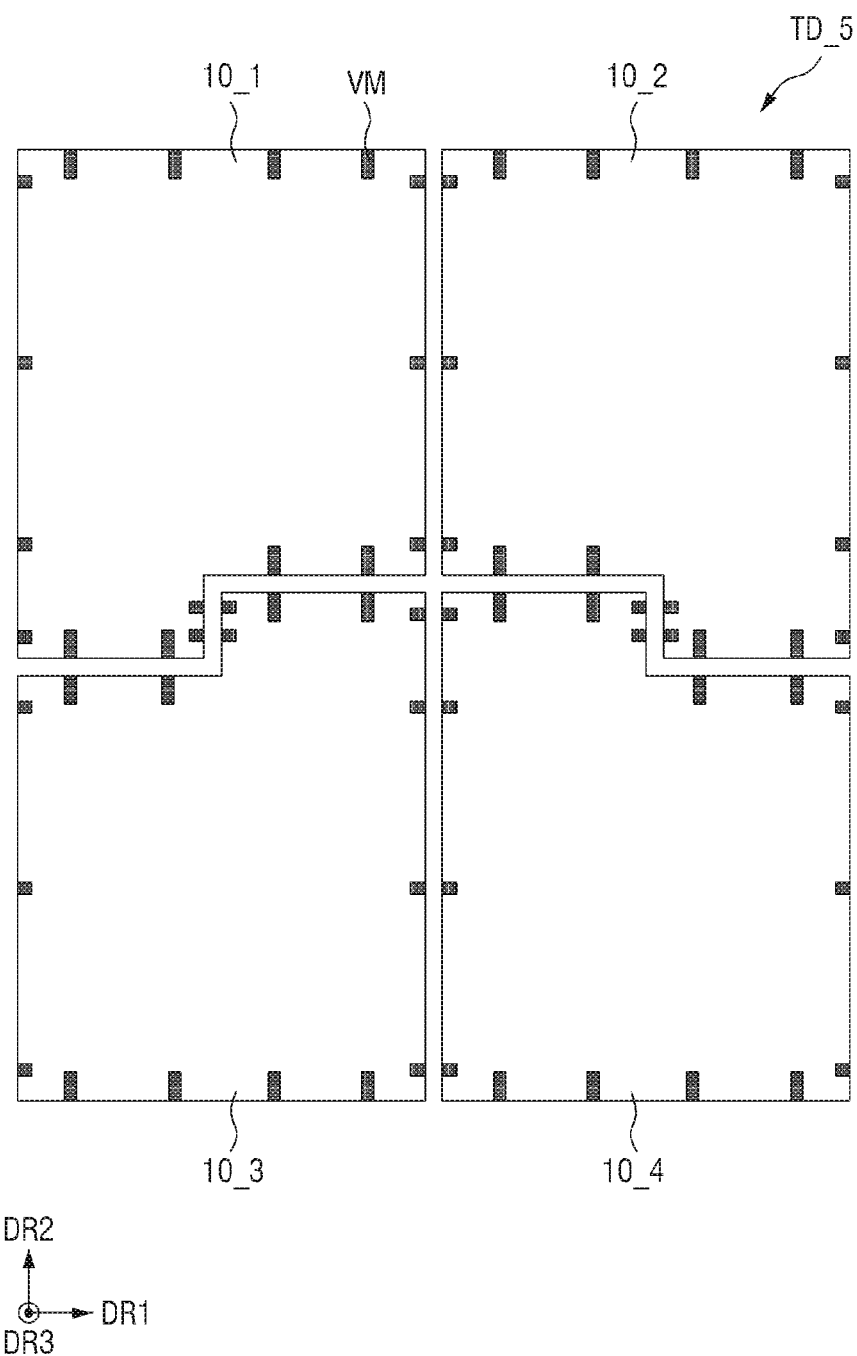
FIG. 34 is a plan view illustrating the layout of a tiled display device according to an embodiment of the present disclosure.

FIG. 33 is a plan view illustrating the layout of a tiled display device according to an embodiment of the present disclosure. FIG. 34 is a plan view illustrating the layout of a tiled display device according to an embodiment of the present disclosure.

Referring to FIGS. 33 and 34, even when a plurality of first, second, third, and fourth display devices 10_1, 10_2, 10_3, and 10_4 included in a tiled display device TD_4 or TD_5 have a polygonal shape such as a hexagonal shape in a plan view, alignment vernier marks VM that extend perpendicularly to the directions in which the sides of each of the first, second, third, and fourth display devices 10_1, 10_2, 10_3, and 10_4 extend may be formed along the sides of each of the first, second, third, and fourth display devices 10_1, 10_2, 10_3, and 10_4 so that a determination may be made as to whether, and the degree to which, the first, second, third, and fourth display devices 10_1, 10_2, 10_3, and 10_4 are aligned not only in vertical and horizontal directions, but also in diagonal directions, in a plan view.

Figure 35:
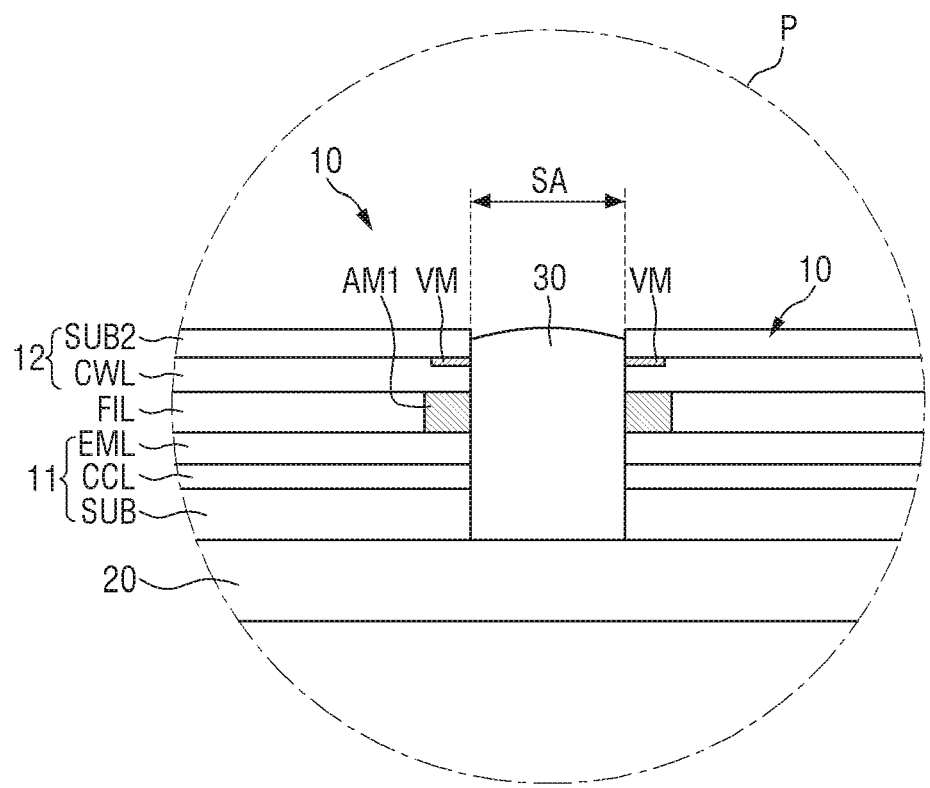
FIG. 35 is a cross-sectional view of the area P of FIG. 3.

FIG. 35 is a cross-sectional view of the area P of FIG. 3.

The embodiment of FIG. 35 differs from the embodiment of FIG. 5A in that a display device 10 includes a first display substrate 11, a second display substrate 12, a sealing member AM1, and a filler layer FIL.

Referring to FIG. 35, the first display substrate 11 may include a substrate SUB, a circuit layer CCL, and a light-emitting element layer EML.

The second display substrate 12 may face the first display substrate 11. The second display substrate 12 may include a base substrate SUB2 and a color control layer CWL.

The base substrate SUB2 may face a substrate SUB of the first display substrate 11. The base substrate SUB2 may include or may be formed of a transparent insulating material such as glass or quartz. The base substrate SUB2 may be a rigid substrate or a flexible substrate that is bendable, foldable, or rollable.

The base substrate SUB2 may be the same as the substrate SUB or may have a different material, thickness, and/or transmittance from the substrate SUB. In one example, the base substrate SUB2 may have a higher transmittance than the substrate SUB. The base substrate SUB2 may be thicker or thinner than the substrate SUB.

The color control layer CWL may be disposed on a surface of the base substrate SUB2 that faces the substrate SUB of the first display substrate 11. As described above, the color control layer CWL may include alignment vernier marks VM, which are formed in the same layer as light blocking members that define light output areas LA and light blocking areas BA. The alignment vernier marks VM may be disposed on a surface of the base substrate SUB2.

The sealing member AM1 may be disposed along the edges of each of the first and second display substrates 11 and 12 and may be interposed between the first and second display substrates 11 and 12. Although not specifically illustrated, the sealing member AM1 may be disposed in a non-display area NDA. The sealing member AM1 may overlap the alignment vernier marks VM, in the non-display area NDA. The first and second display substrates 11 and 12 may be coupled to each other via the sealing member AM1. In one example, the sealing member AM1 may include or may be formed of an organic material. The sealing member AM1 may be formed of an epoxy resin, but the present disclosure is not limited thereto.

The filler layer FIL may be disposed in the space between the first and second display substrates 11 and 12, surrounded by the sealing member AM1. The filler layer FIL may fill the gap between the first and second display substrates 11 and 12. The filler layer FIL may be formed of a material capable of transmitting light therethrough. The filler layer FIL may include or may be formed of an organic material. In one example, the filler layer FIL may be formed of a silicon (Si)-based organic material or an epoxy-based organic material, but the present disclosure is not limited thereto.

Figure 36:
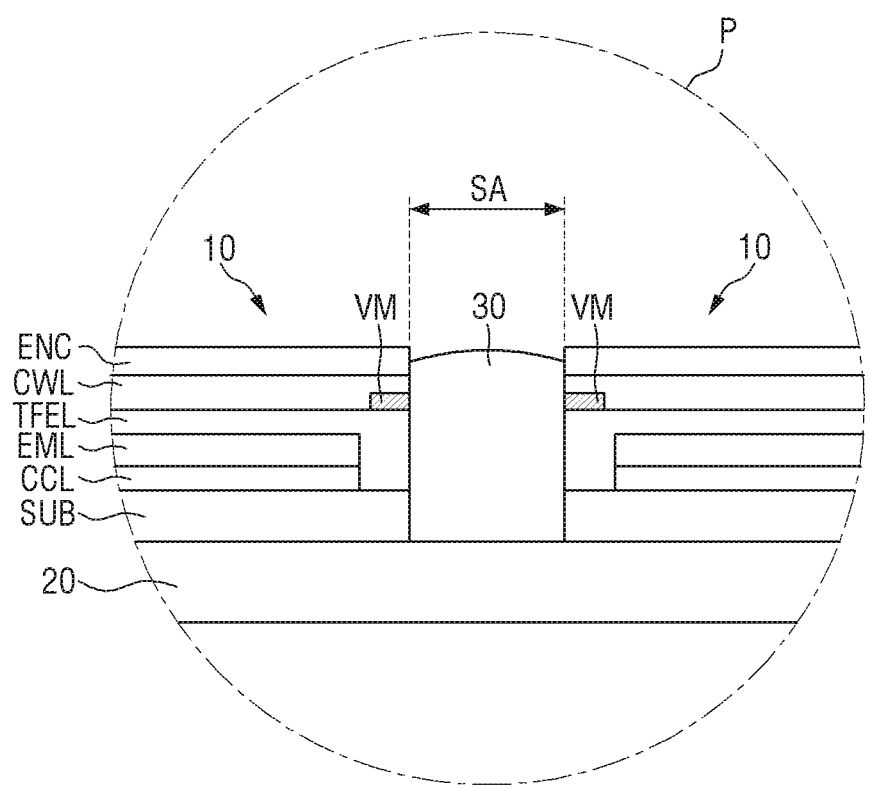
FIG. 36 is a cross-sectional view of the area P of FIG. 3.
Figure 37:
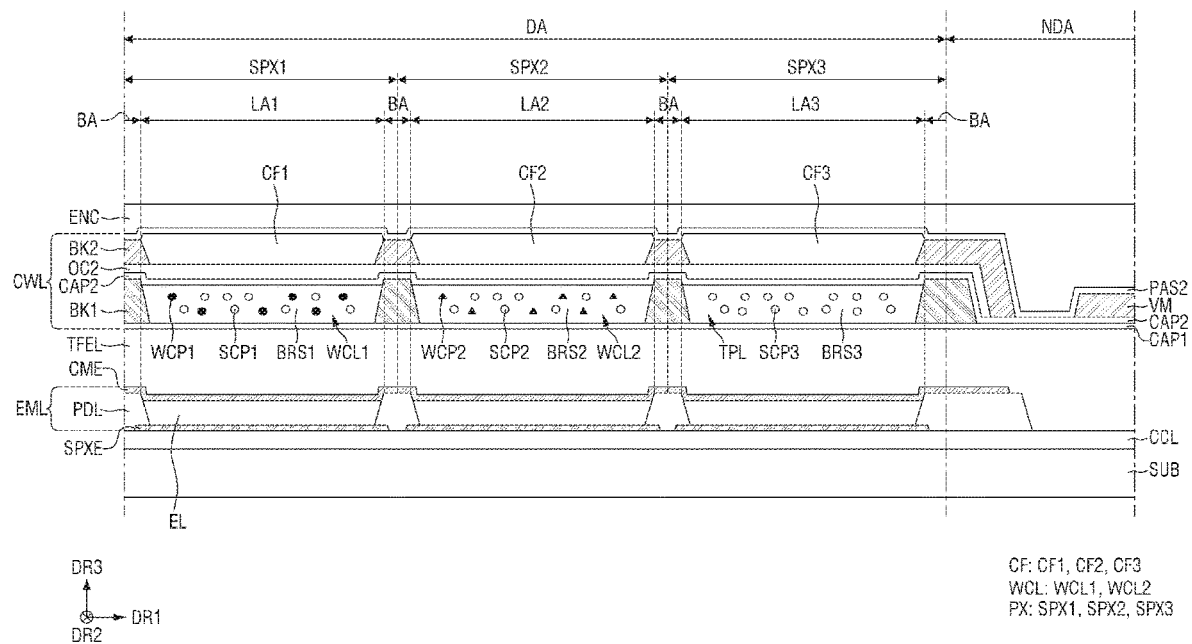
FIG. 37 is a cross-sectional view of a display device of FIG. 36.

FIG. 36 is a cross-sectional view of the area P of FIG. 3. FIG. 37 is a cross-sectional view of a display device of FIG. 36.

The embodiment of FIGS. 36 and 37 differs from the embodiment of FIGS. 5A and 5B in that a light-emitting element layer EML of a display device 10 includes organic light-emitting elements, and that the display device 10 further includes a second encapsulation layer TFEL, which is disposed on the light-emitting element layer EML.

Referring to FIGS. 36 and 37, a display device 10 may include a substrate SUB, a circuit layer CCL, a light-emitting element layer EML, a second encapsulation layer TFEL, a color control layer CWL, and a first encapsulation layer ENC.

The light-emitting element layer EML may be disposed on the circuit layer CCL. The light-emitting element layer EML may include subpixel electrodes SPXE, emission layers EL, a common electrode CME, and a pixel-defining film PDL.

The subpixel electrodes SPXE may be disposed on the circuit layer CCL. The subpixel electrodes SPXE may be disposed in first, second, and third light output areas LA1, LA2, and LA3, which are defined by the pixel-defining film PDL. The subpixel electrodes SPXE may be the first electrodes (e.g., anodes) of light-emitting elements.

The pixel-defining film PDL may be disposed on the circuit layer CCL, along the boundaries of each of first, second, and third subpixels SPX1, SPX2, and SPX3. The pixel-defining film PDL may be disposed in light blocking areas BA. The pixel-defining film PDL may be disposed on the subpixel electrodes SPXE and may include openings that expose parts of the subpixel electrodes SPXE. The pixel-defining film PDL may isolate and insulate the subpixel electrodes SPXE of the first, second, and third subpixels SPX1, SPX2, and SPX3 from one another.

The emission layer EML may be disposed on the parts of the subpixel electrodes SPXE exposed by the pixel-defining film PDL. In one example, the emission layer EML may include organic layers that include or are formed of an organic material. The organic layers may include organic light-emitting layers and may further include hole injection/transport layers and/or electron injection/transport layers as auxiliary layers for assisting the organic light-emitting layers with the emission of light.

The common electrode CME may be disposed on the emission layer EML. The common electrode CME may be in contact not only with the emission layer EML, but also with the top surface of the pixel-defining film PDL, in the light blocking areas BA. The common electrode CME may be connected throughout the first, second, and third subpixels SPX1, SPX2, and SPX3. The common electrode CME may be an electrode disposed on the entire surface of the substrate SUB throughout the first, second, and third subpixels SPX1, SPX2, and SPX3. The common electrode CME may be the second electrodes (e.g., cathodes) of light-emitting elements.

The second encapsulation layer TFEL may be disposed on the light-emitting element layer EML. For example, the second encapsulation layer TFEL may be disposed on the common electrode CME to cover the light-emitting element layer EML. Although not specifically illustrated, the second encapsulation layer TFEL may include at least one thin-film encapsulation layer. In one example, the thin-film encapsulation layer may include a first organic film, an organic film, and a second inorganic film. The first and second inorganic films may include or may be formed of an organic insulating material such as silicon nitride, silicon oxide, or silicon oxynitride, and the organic film may include or may be formed of an acrylic resin, an epoxy resin, a phenolic resin, a polyamide resin, a polyimide resin, an unsaturated polyester resin, a polyphenylene resin, a polyphenylene sulfide resin, or benzocyclobutene (BCB).

The color control layer CWL may be disposed on the second encapsulation layer TFEL. The alignment vernier marks VM included in the color control layer CWL may be disposed on the second encapsulation layer TFEL, in a non-display area NDA.

Figure 38:
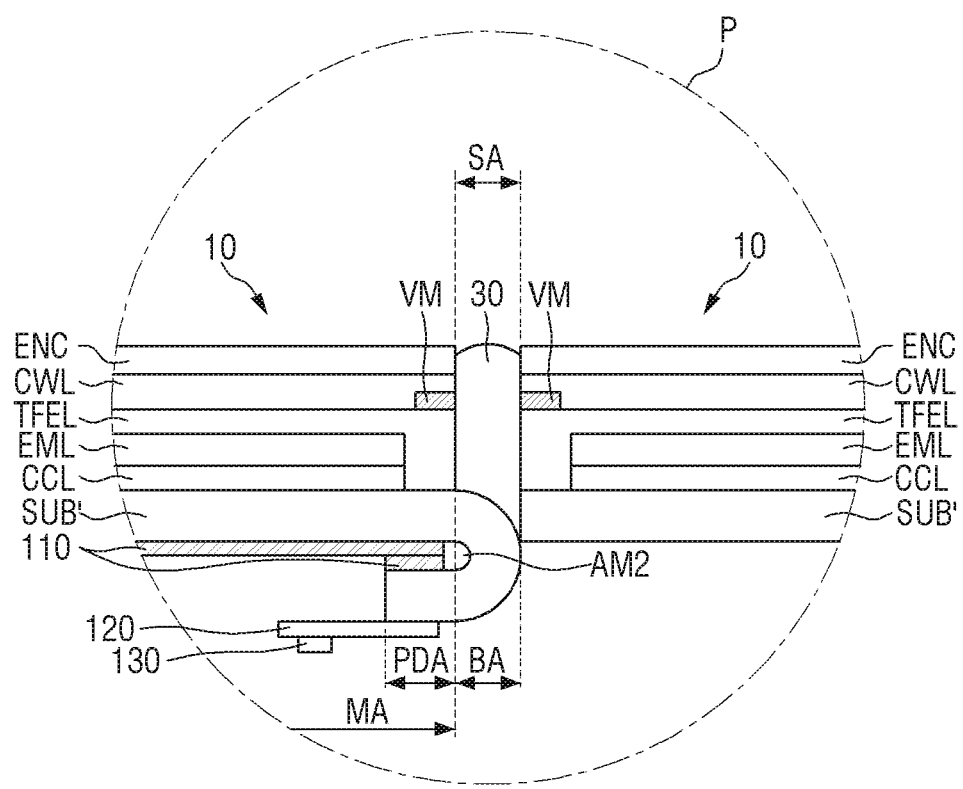
FIG. 38 is a cross-sectional view of the area P of FIG. 3.

FIG. 38 is a cross-sectional view of the area P of FIG. 3.

The embodiment of FIG. 38 differs from the embodiment of FIG. 36 in that a substrate SUB' of a display device 10 is a bendable substrate.

Referring to FIG. 38, the substrate SUB' may be a base substrate or a base member and may be formed of an insulating material such as a polymer resin. In one example, the substrate SUB' may be a flexible substrate that is bendable, foldable, or rollable. The substrate SUB' may include or may be formed of PI, but the present disclosure is not limited thereto. Although not specifically illustrated, a barrier layer may be further disposed between the substrate SUB' and a circuit layer CCL.

The substrate SUB' may include a main area MA and a protruding area that protrudes from a side of the main area MA. The main area MA may include a display area DA, in which pixels are formed to display an image, and a non-display area NDA, which is a peripheral area around the display area DA.

The protruding area may include a bending area BA and a pad area PDA. The bending area BA may be disposed, and bendable, between the main area MA and the pad area PDA. Before the substrate SUB' is bent (i.e., the substrate SUB' is flat), a surface of the pad area PDA of the substrate SUB' may face upward. When the substrate SUB' is bent, the surface of the pad area PDA of the substrate SUB' may face downward. Accordingly, as the pad area PDA is disposed below the main area MA, the pad area PDA may overlap the main area MA.

A panel lower cover 110 may be disposed below the substrate SUB'. The panel lower cover 110 may be attached to the bottom surface of the substrate SUB' via an adhesive member. The adhesive member may be a pressure sensitive adhesive (PSA). The panel lower cover 110 may not be disposed in the bending area BA of the substrate SUB', as illustrated in FIG. 38, so that the substrate SUB' may be bendable. Part of the panel lower cover 110 disposed in the main area MA of the substrate SUB' and part of the panel lower cover 110 disposed in the pad area PDA of the substrate SUB' may be attached together via an adhesive member AM2. The adhesive member AM2 may be a PSA.

A flexible film 120 may be disposed in the pad area PDA. One side of the flexible film 120 may be connected to pad electrodes formed in the pad area PDA of the substrate SUB', and the other side of the flexible film 120 may be connected to a source circuit board (not illustrated). The flexible film 120 may transmit signals from a source driver 130 to the display device 10. In one example, the source driver 130 may be an integrated circuit (IC).

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
a substrate having a first side, which extends in a first direction, and a second side, which extends in a second direction that intersects the first direction;
a first alignment vernier mark disposed on an upper surface of the substrate, the first alignment vernier mark adjoining the first side and extending in the second direction;
a second alignment vernier mark disposed on the substrate, the second alignment vernier mark adjoining the second side and extending in the first direction, wherein the first alignment vernier mark includes a plurality of line patterns, wherein the plurality of line patterns are disconnected from each other, and wherein each of the plurality of line patterns extends lengthwise from the first side in the second direction;
a circuit layer disposed on the substrate;
a light-emitting element layer disposed on the circuit layer, the light-emitting element layer including a plurality of pixels; and
a light blocking member disposed along boundaries of each of the plurality of pixels,
wherein the first alignment vernier mark partially overlaps the light blocking member in a vertical direction perpendicular to the upper surface of the substrate.

2. The display device of claim 1,
wherein the first alignment vernier mark includes a first sub-vernier mark, which is disposed adjacent to a first corner where the first and second sides meet each other.

3. The display device of claim 2,
wherein the substrate further has a third side, which extends in the second direction and is opposite to the second side,
the display device further comprises a third alignment vernier mark disposed on the substrate, and
the third alignment vernier mark adjoins the third side and extends in the first direction.

4. The display device of claim 3,
wherein the first alignment vernier mark further includes a second sub-vernier mark, which is disposed adjacent to a second corner where the first and third sides meet each other.

5. The display device of claim 4,
wherein the first alignment vernier mark further includes a third sub-vernier mark, which is disposed between the first and second sub-vernier marks.

6. The display device of claim 3,
wherein the second and third alignment vernier marks are arranged along a line extending in the first direction.

7. The display device of claim 1,
wherein the plurality of line patterns are spaced apart from one another at a uniform distance.

8. The display device of claim 1,
wherein the substrate includes a display area, which includes the plurality of pixels, and a non-display area, which surrounds the display area, each of the plurality of pixels includes a light output area and a light blocking area, which surrounds the light output area, the non-display area includes a first non-display area and a second non-display area,
wherein the first non-display area is disposed adjacent to the first side, and the second non-display area is disposed adjacent to the second side, and
wherein the first alignment vernier mark is disposed in the first non-display area, and the second alignment vernier mark is disposed in the second non-display area.

9. The display device of claim 1,
wherein the first alignment vernier mark and the light blocking member are formed of a same material.

10. A tiled display device comprising:
a first display device including a first substrate, which has a first side extending in a first direction and a second side extending in a second direction that intersects the first direction, a first alignment vernier mark, which is disposed on the first substrate, adjoins the first side, and extends in the second direction, and a second alignment vernier mark, which is disposed on the first substrate, adjoins the second side, and extends in the first direction;

a second display device spaced apart from the first display device in the second direction, the second display device including a second substrate, which has a third side facing the first side of the first display device and extending in the first direction, and a third alignment vernier mark, which is disposed on the second substrate, adjoins the third side, and extends in the second direction; and a third display device spaced apart from the first display device in the first direction, the third display device including a third substrate, which has a fourth side facing the second side of the first display device and extending in the second direction, and a fourth alignment vernier mark, which is disposed on the third substrate, adjoins the fourth side, and extends in the first direction, wherein the first alignment vernier mark includes a plurality of line patterns, wherein the plurality of line patterns are disconnected from each other, wherein each of the plurality of line patterns extends lengthwise from the first side in the second direction, wherein the first display device further includes:

a circuit layer disposed on an upper surface of the first substrate;

a light-emitting element layer disposed on the circuit layer, the light-emitting element layer including a plurality of pixels; and a light blocking member disposed along boundaries of each of the plurality of pixels, and wherein the first alignment vernier mark partially overlaps the light blocking member in a vertical direction perpendicular to the upper surface of the first substrate.

11. The tiled display device of claim 10,
wherein the first and third alignment vernier marks are aligned with each other in parallel in the second direction.

12. The tiled display device of claim 10,
wherein the second and fourth alignment vernier marks are aligned with each other in parallel in the first direction.

13. The tiled display device of claim 10,
wherein the plurality of line patterns of each of the first and third alignment vernier marks are spaced apart from one another at a uniform, first distance.

14. The tiled display device of claim 13,
wherein the first distance between the plurality of line patterns of each of the first and third alignment vernier marks is smaller than a distance, in the second direction, between the first and second display devices.

15. The tiled display device of claim 10,
wherein the first substrate includes a display area, which includes the plurality of pixels, and a non-display area, which surrounds the display area, wherein each of the second and third substrates includes a display area, which includes a plurality of pixels, and a non-display area, which surrounds the display area, and the first, second, third, and fourth alignment vernier marks are disposed in the non-display area.

16. The tiled display device of claim 15,
wherein the display area includes a plurality of light output areas and a light blocking area, and wherein the light blocking member defines the plurality of light output areas and the light blocking area.

17. The tiled display device of claim 16,
wherein the light blocking member, and the first, second, third, and fourth alignment vernier marks are formed of a same material.

* * * * *